(12) United States Patent
Patton

(10) Patent No.: US 10,063,183 B2
(45) Date of Patent: Aug. 28, 2018

(54) SOLAR PANEL WITH PIVOTING SIDE SUPPORTS

(71) Applicant: Patton Engineering, Inc., Roseville, CA (US)

(72) Inventor: John C. Patton, Roseville, CA (US)

(73) Assignee: Patton Engineering, Inc., Roseville, CA (US)

( * ) Notice: Subject to any disclaimer, the term of this patent is extended or adjusted under 35 U.S.C. 154(b) by 70 days.

(21) Appl. No.: 15/038,409

(22) PCT Filed: Nov. 21, 2014

(86) PCT No.: PCT/US2014/066751
§ 371 (c)(1),
(2) Date: May 20, 2016

(87) PCT Pub. No.: WO2015/077526
PCT Pub. Date: May 28, 2015

(65) Prior Publication Data
US 2016/0315580 A1    Oct. 27, 2016

Related U.S. Application Data

(60) Provisional application No. 61/963,038, filed on Nov. 21, 2013.

(51) Int. Cl.
*H02S 30/10* (2014.01)
*H01L 31/02* (2006.01)
(Continued)

(52) U.S. Cl.
CPC .............. *H02S 30/10* (2014.12); *F24J 2/526* (2013.01); *F24J 2/5245* (2013.01); *H01L 31/02* (2013.01);
(Continued)

(58) Field of Classification Search
CPC .......... H02S 30/10; H02S 20/10; H02S 20/20; H02S 20/23; H02S 20/24; H02S 20/30;
(Continued)

(56) References Cited

U.S. PATENT DOCUMENTS

| 4,371,139 A | 2/1983 | Clark |
| 5,067,605 A | 11/1991 | Gordon |

(Continued)

FOREIGN PATENT DOCUMENTS

| CA | 2820935 A1 | 6/2012 |
| CA | 2817611 A1 | 12/2013 |

(Continued)

OTHER PUBLICATIONS

International Application No. PCT/US14/66751, filed Nov. 21, 2014. First Named Inventor: John C. Patton. International Search Report dated Feb. 23, 2015. 4 pages.

(Continued)

*Primary Examiner* — Susan D Leong
(74) *Attorney, Agent, or Firm* — Santangelo Law Offices, PC

(57) ABSTRACT

A folded down support (12) allows for stronger solar panels (10) and the support replaces most of the solar racking required for solar installation which further reduces the cost of the photovoltaic solar system. The solar panels (10) can be arranged so that solar panels form a solar collector solar panel array. The solar panel (10) can be set on a surface by itself or with ballast (43). It can also be attached to the surface by fastening the solar panel to the side supports. If the solar panel frame and supports are electrically conductive, the design allows for self electrical grounding between these conductive parts when the side supports are pivoted to the down position. The folded up support allows for high density storage and shipping.

22 Claims, 59 Drawing Sheets

(51) Int. Cl.
*H01L 31/042* (2014.01)
*H02S 20/23* (2014.01)
*H02S 20/24* (2014.01)
*F24J 2/52* (2006.01)
*F24J 2/46* (2006.01)

(52) U.S. Cl.
CPC ............ *H01L 31/042* (2013.01); *H02S 20/23* (2014.12); *H02S 20/24* (2014.12); *F24J 2/4638* (2013.01); *F24J 2/5211* (2013.01); *F24J 2002/5277* (2013.01); *F24J 2002/5292* (2013.01); *Y02B 10/12* (2013.01); *Y02E 10/47* (2013.01); *Y02E 10/50* (2013.01)

(58) Field of Classification Search
CPC ........ F24J 2/5245; F24J 2/4658; F24J 2/4659; F24J 2/4661; F24J 2/4663; F24J 2/4665; F24J 2/4669; F24J 2/467; F24J 2/4672; F24J 2/4674; F24J 2/52; F24J 2/5201; F24J 2/5203; F24J 2/5243; F24J 2/5252; F24J 2/5254; F24J 2/5256; F24J 2/526; F24J 2/5262; F24J 2002/5273; F24J 2002/5277
See application file for complete search history.

(56) References Cited

U.S. PATENT DOCUMENTS

| | | |
|---|---|---|
| 5,164,020 A | 11/1992 | Grushkowitz |
| 5,197,589 A | 3/1993 | Gordon |
| 5,232,518 A | 8/1993 | Nath et al. |
| 5,338,369 A | 8/1994 | Rawlings |
| 5,460,660 A | 10/1995 | Albright et al. |
| 5,505,788 A | 4/1996 | Dinwoodie |
| 5,571,338 A | 11/1996 | Kadomome et al. |
| 5,596,981 A | 1/1997 | Soucey |
| 6,105,317 A | 8/2000 | Tomiuchi et al. |
| 6,269,596 B1 | 8/2001 | Ohtsuka et al. |
| 6,370,828 B1 | 4/2002 | Genschorek |
| 6,465,724 B1 | 10/2002 | Garvison et al. |
| D496,248 S | 9/2004 | Liebendorfer |
| D496,249 S | 9/2004 | Liebendorfer |
| 6,959,517 B2 | 11/2005 | Poddany et al. |
| 7,260,918 B2 | 8/2007 | Liebendorfer |
| 7,406,800 B2 | 8/2008 | Cinnamon et al. |
| 7,434,362 B2 | 10/2008 | Liebendorfer |
| 7,592,537 B1 | 9/2009 | West |
| 7,600,349 B2 | 10/2009 | Liebendorfer |
| 7,748,175 B2 | 7/2010 | Liebendorfer |
| 7,762,027 B1 | 7/2010 | Wentworth et al. |
| 7,766,292 B2 | 8/2010 | Liebendorfer |
| 7,895,808 B1 | 3/2011 | Wentworth et al. |
| 8,109,048 B2 | 2/2012 | West |
| 8,128,044 B2 | 3/2012 | Liebendorfer |
| 8,164,020 B2 | 4/2012 | Cammann |
| 8,291,653 B2 | 10/2012 | Suarez |
| 8,375,654 B1 | 2/2013 | West et al. |
| 8,376,298 B2 | 2/2013 | McPheeters |
| 8,567,134 B1 | 10/2013 | Grushkowitz et al. |
| 8,585,000 B2 | 11/2013 | McPheeters |
| 8,640,400 B2 | 2/2014 | Liebendorfer |
| 2003/0015636 A1 | 1/2003 | Liebendorfer |
| 2004/0163338 A1 | 8/2004 | Liebendorfer |
| 2009/0019796 A1 | 1/2009 | Liebendorfer |
| 2009/0232616 A1 | 9/2009 | Sekreta |
| 2009/0320906 A1 | 12/2009 | Botkin et al. |
| 2010/0065108 A1 | 3/2010 | West et al. |
| 2010/0243023 A1 | 9/2010 | Patton et al. |
| 2010/0263297 A1 | 10/2010 | Liebendorfer |
| 2010/0293874 A1 | 11/2010 | Liebendorfer |
| 2010/0319277 A1 | 12/2010 | Suarez et al. |
| 2011/0000519 A1 | 1/2011 | West |
| 2011/0000520 A1 | 1/2011 | West |
| 2011/0000526 A1 | 1/2011 | West |
| 2011/0000544 A1 | 1/2011 | West |
| 2011/0203637 A1 | 8/2011 | Patton et al. |
| 2012/0125410 A1 | 5/2012 | West et al. |
| 2012/0152326 A1 | 6/2012 | West et al. |
| 2012/0234378 A1 | 9/2012 | West et al. |
| 2012/0255598 A1 | 10/2012 | West |
| 2012/0260972 A1 | 10/2012 | West et al. |
| 2012/0266946 A1 | 10/2012 | West et al. |
| 2012/0279558 A1 | 11/2012 | West et al. |
| 2012/0298186 A1 | 11/2012 | West |
| 2012/0298188 A1 | 11/2012 | West et al. |
| 2012/0298201 A1* | 11/2012 | Stephan .................. H01L 31/02 136/259 |
| 2012/0298817 A1 | 11/2012 | West et al. |
| 2012/0301661 A1 | 11/2012 | West et al. |
| 2012/0318757 A1 | 12/2012 | Libendorfer |
| 2013/0036685 A1 | 2/2013 | Suarez et al. |
| 2013/0133270 A1 | 5/2013 | West |
| 2013/0140416 A1 | 6/2013 | West et al. |
| 2013/0180572 A1 | 7/2013 | West |
| 2013/0180573 A1 | 7/2013 | West |
| 2013/0180574 A1 | 7/2013 | West et al. |
| 2013/0183084 A1 | 7/2013 | West et al. |
| 2013/0192150 A1 | 8/2013 | Dupont |
| 2013/0220403 A1 | 8/2013 | Rizzo |
| 2014/0026946 A1 | 1/2014 | West et al. |
| 2014/0053891 A1 | 2/2014 | West et al. |

FOREIGN PATENT DOCUMENTS

| | | |
|---|---|---|
| EP | 2360740 A1 | 8/2011 |
| EP | 2260211 B1 | 12/2012 |
| WO | 2003007688 A2 | 1/2003 |
| WO | 2004077517 A2 | 9/2004 |
| WO | 2008124158 A1 | 10/2008 |
| WO | 2009086150 A1 | 7/2009 |
| WO | 2009111796 A1 | 9/2009 |
| WO | 2009137809 A1 | 11/2009 |
| WO | 2010126770 A1 | 11/2010 |
| WO | 2010148387 A1 | 12/2010 |
| WO | 2011/022125 A2 | 2/2011 |
| WO | 2011019460 A2 | 2/2011 |
| WO | 2011019460 A3 | 2/2011 |
| WO | 2011022125 A3 | 2/2011 |
| WO | 2011025585 A2 | 3/2011 |
| WO | 2011025585 A3 | 3/2011 |
| WO | 2012/082806 A2 | 6/2012 |
| WO | 2012079060 A2 | 6/2012 |
| WO | 2012079060 A3 | 6/2012 |
| WO | 2012079061 A1 | 6/2012 |
| WO | 2012/116121 A1 | 8/2012 |
| WO | 2012116121 A1 | 8/2012 |
| WO | 2013009523 A1 | 1/2013 |
| WO | 2015077526 A1 | 5/2015 |

OTHER PUBLICATIONS

International Application No. PCT/US14/66751, filed Nov. 21, 2014. First Named Inventor: John C. Patton. Written Opinion of the International Searching Authority dated Feb. 23, 2015. 4 pages.
Zep Solar, ZS Comp for composition single roofs. Copyright 2010-2013. 2 pages.
OMG Roofing Products. Roof Report. OMG's PowerGrip Provides a Secure Connection for Solar Racks. Copyright 2013. 2 pages.
Sunpower, T5 Solar Roof Tile. Simple Installation and Greatest Energy Output. Copyright Mar. 2011. 2 pages.
OMG Power Grip Roof Mount System. Copyright 2013. 2 pages.

* cited by examiner

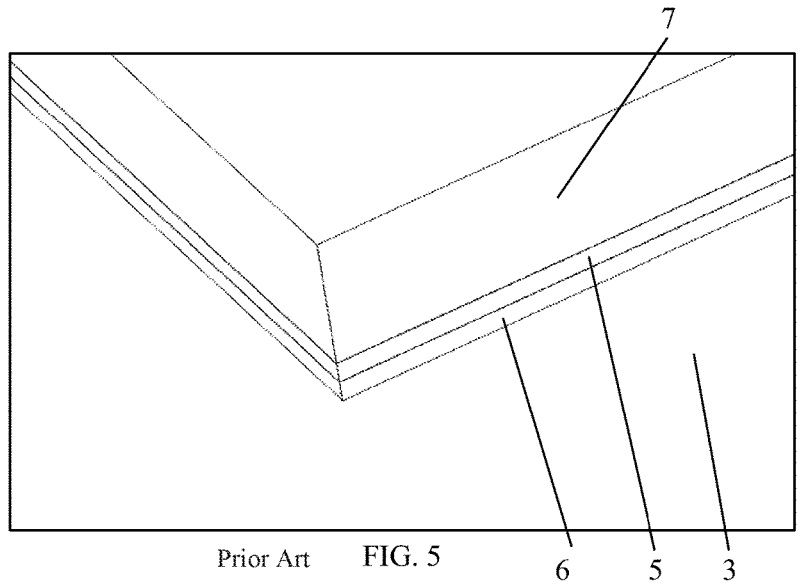
Prior Art  FIG. 5
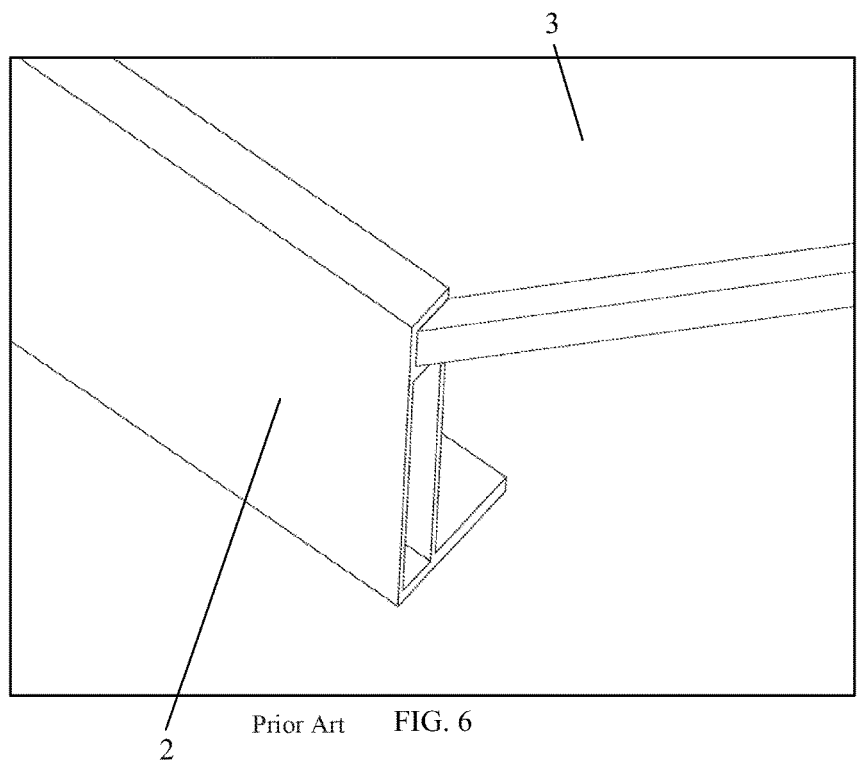
Prior Art  FIG. 6

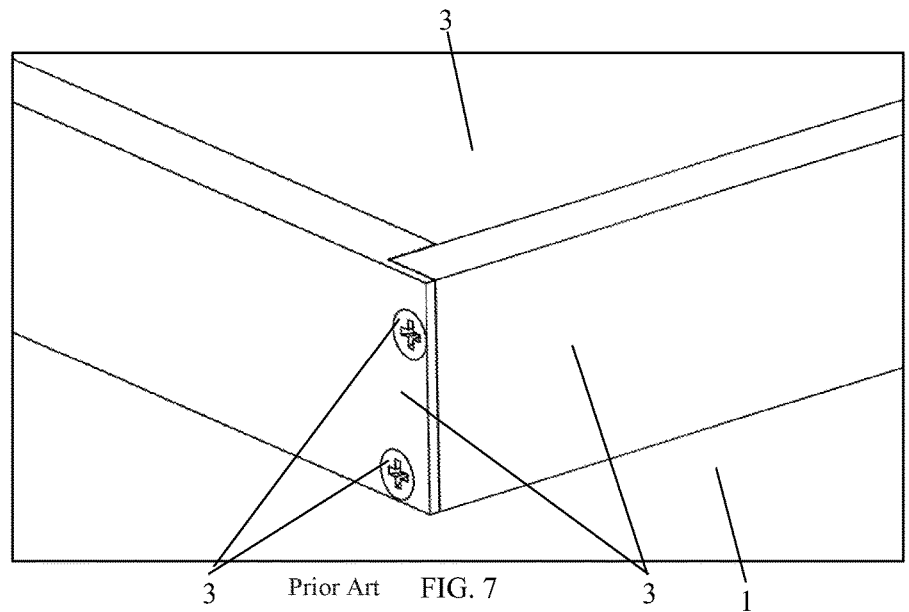
Prior Art    FIG. 7
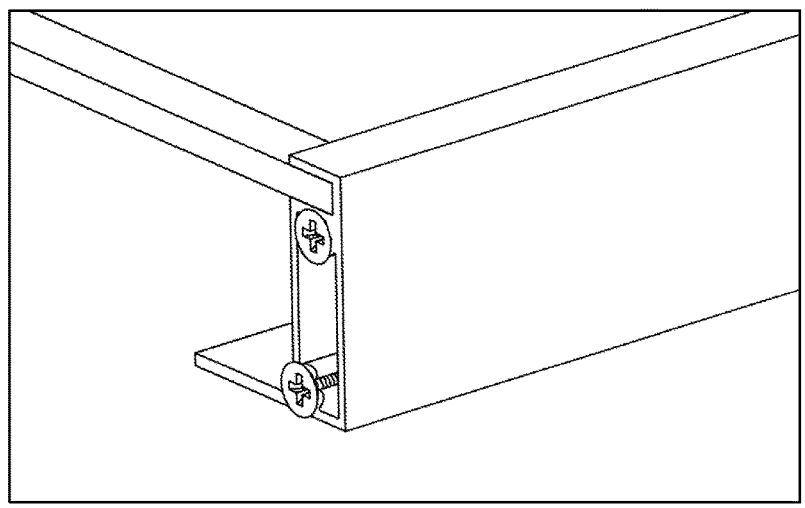
Prior Art    FIG. 8

52  12  49

SOLAR PANEL WITH PIVOTING SIDE SUPPORTS

This is the United States National Phase of International Patent Application Number PCT/US14/66751, filed 21 Nov. 2014 (published as Publication No. WO 2015/077526), which claims priority to and the benefit of U.S. Provisional Application No. 61/963,038, filed Nov. 21, 2013, each said application hereby incorporated herein by reference in its entirety.

TECHNICAL FIELD

The inventive technology disclosed herein has application in the field of packaging, shipping, and mounting solar panels.

BACKGROUND

The field of solar power has become very important. Solar power systems can be installed in huge seas as well as for individual residential and commercial usage. These individual systems can supply power to an underlying structure, and can also supply excess power into the grid or the like. For individual systems, it is not uncommon to locate these systems on the roofs of buildings. These roofs can be angled roofs or flat roofs. In many commercial applications a flat roof is frequently encountered and the solar panel system is placed on the roof itself. In order to remain economic, it is not only important that individual solar panels or the like produce a significant amount of power, but it can also be important that both the materials and structures be reasonably priced, and that the actual installation be achieved without too much difficulty.

The perspective of initial installation of the solar power system is also important in the overall economics of this field. For instance, while solar power systems are bought from manufacturers who frequently make individual complements, a separate installer is frequently employed to actually site, locate, and connect collective of power componentry that makes a roof mount or other solar power system. Installers, of course, have differing degrees of capabilities. In addition, the initial cost of the system should not be increased significantly for simply the action of installing it on a pre-existing roof or other surface. Furthermore, the cost of the solar panels and other such componentry itself is significant enough that the cost of an underlying structure, should not be so large as to greatly increase the cost of the overall system. As may be imagined, there is constant pressure to make underlying structures and indeed the entire solar power system, less expensive. Thus, small amounts of savings can add up and are desired. Beyond the cost of the system, the actual labor of installation is also in focus. The more time an installer needs to spend on a roof or other area installing individual componentry, the more expensive the overall system is to a user. Thus, it is desirable to reduce the cost of not only the componentry involved, but also to reduce the cost of the installation labor. This can occur, most significantly, by reducing the amount of the labor needed to achieve the installation. Thus, it is desirable to present solar power systems that take less time to install and that cost less to purchase.

FIGS. 1-10 show the typical framed solar panel used in the solar industry. As can be seen in FIGS. 1 and 2, the Typical Frame, 2, on the Typical Solar Panel, 1, is thick (top to bottom). This is required to strengthen the Typical Solar Panel, 1, and to keep the Laminate, 3, from over bending. There are also maximum frame bending requirements under loads required by code and standards that need to be met.

FIGS. 3 and 4 show a Typical Solar Panel. 1, with Typical Frames, 2, joined together by a Typical Corner Swage, 4. The Typical Frame, 2, can also be fastened together by Screws, 8, as shown in FIGS. 7 and 8.

FIGS. 5 and 6 shows one type of Laminate, 3, which consists of Top Glass, 7, the Solar Cell Area, 5, and the Backsheet, 6. This Laminate, 3, is not strong and needs the thick Typical Frame, 2, as shown in FIG. 6.

FIGS. 9 and 10 shows a different type of Laminate, 3. This Laminate, 3, has a Top Glass, 7, a Solar Cell Area, 5, and a Bottom Glass, 9. The Laminate, 3, is stronger since it is thicker, but may also require a Typical Frame, 2, for support. This Laminate, 3, is also, more expensive and the Cell Area, 5, temperature is hotter due to less head dissipation which reduces the output power efficiency of the Solar Panel, 10.

DISCLOSURE OF INVENTION

As mentioned earlier, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

The photovoltaic module may be formed by framing at least one laminate in a frame connectable to at least one repositionable support. The support(s) can be folded up for packaging and shipping, or down in varying degrees for mounting on a surface.

Panel supports can attach to the edge of the panels and also attach to surface mounts. The surface mount attachment to the panel supports can be adjusted in height to allow for uneven surfaces. The supports can be folded in varying degrees. The supports can also be used as wind deflectors. The supports, when folded up, stack in a compact fashion to greatly reduce the expense and labor of both packaging and shipping the modules.

All metal parts may be electrically grounded together including the solar panel frames. This means that the earth ground can be attached anywhere and all of the metal parts will be electrically grounded together.

Photovoltaic laminates may be used in the photovoltaic modules.

Naturally these and other aspects and goals are discussed in the following specification and claims.

BRIEF DESCRIPTION OF DRAWINGS

FIG. 5 is a perspective view of a component of a known solar panel.

FIG. 6 is a perspective view of a component of a known solar panel.

FIG. 7 is a perspective view of a component of a known solar panel.

FIG. 8 is a perspective view of a component of a known solar panel.

MODE(S) FOR CARRYING OUT THE INVENTION

As mentioned earlier, the present invention includes a variety of aspects, which may be combined in different ways. The following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

Figure 10:
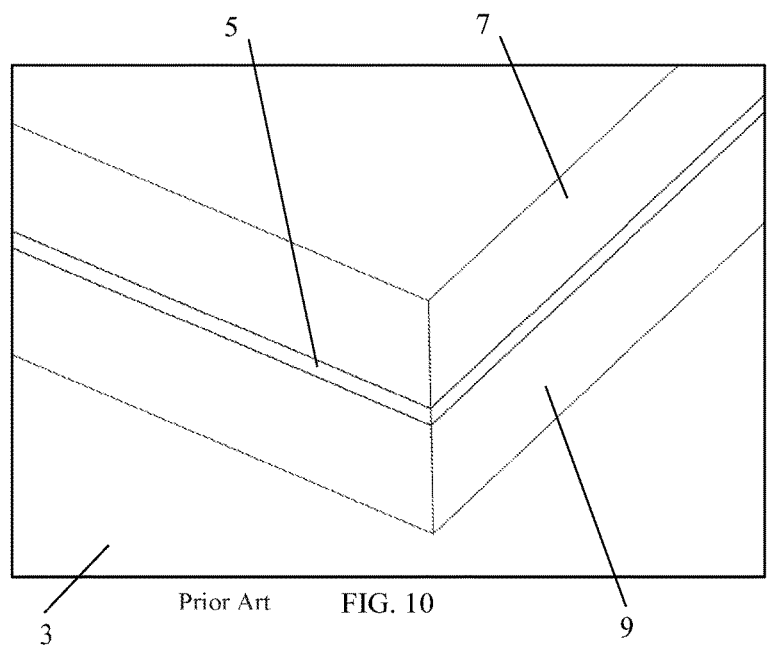
FIG. 10 is a perspective view of a component of a known solar panel.
Figure 11:
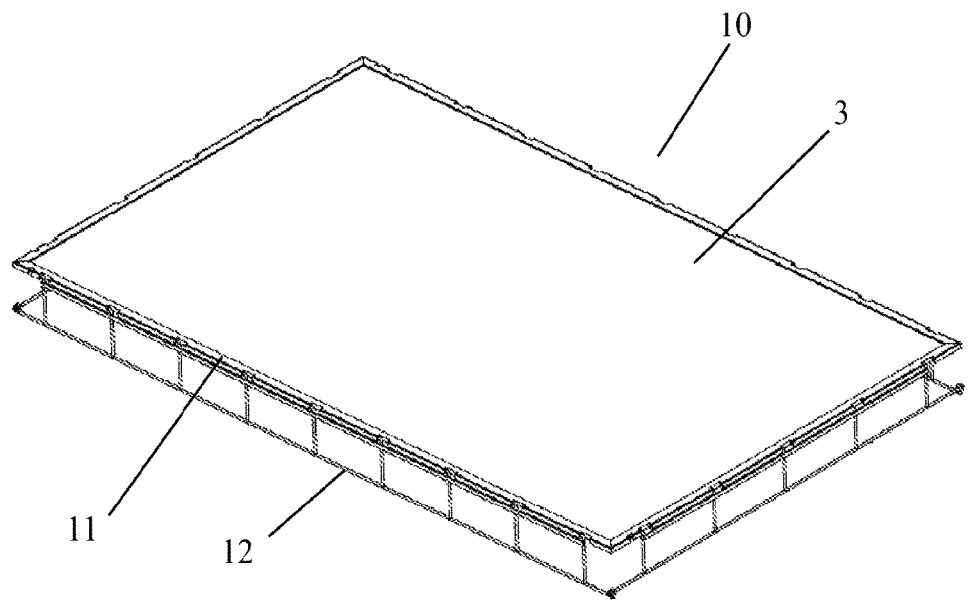
FIG. 11 is a perspective view of an embodiment of the invention.
Figure 117:
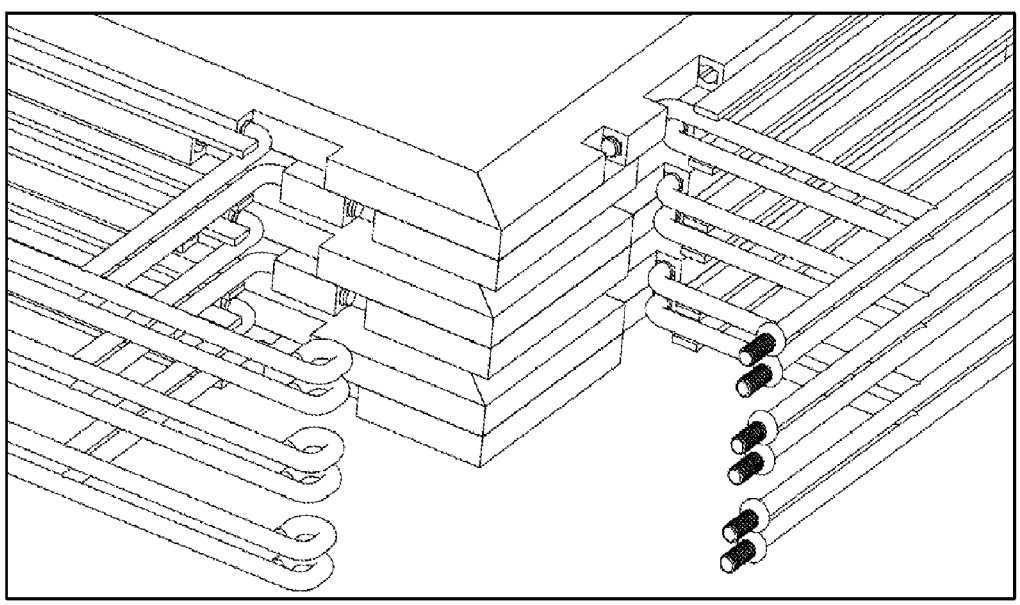
FIG. 117 is a perspective view of a component of an embodiment of the invention.

FIGS. 11 to 117 show the various types of Solar Panel, 10, with pivoting side supports. The Laminate, 3, can be like the ones shown in FIGS. 5 to 10, or any other type of solar laminate. The pivoting side supports are repositional side supports, meaning they can be easily repositioned with a minimal installation effort. They are also stackable side supports, specifically nestably stackable side supports, which will be discussed in more detail below. This achieves the goal of an installation labor cost savings.

FIGS. 11-14 shows the Solar Panel, 10, with Pivoting Supports, 12, on all 4 sides of the Solar Panel, 10. The Pivot Rods, 17, and Biting Pivot Rods, 16, in the Pivot Support, 12, rotate within the Frame, 11, as shown in FIGS. 11-17. FIGS. 11 to 69, and FIGS. 98-117 also use the Pivot Rods, 17, and Biting Pivot Rods, 16, in the Pivot Support, 12, which rotates in the Frame, 11.

Figure 17:
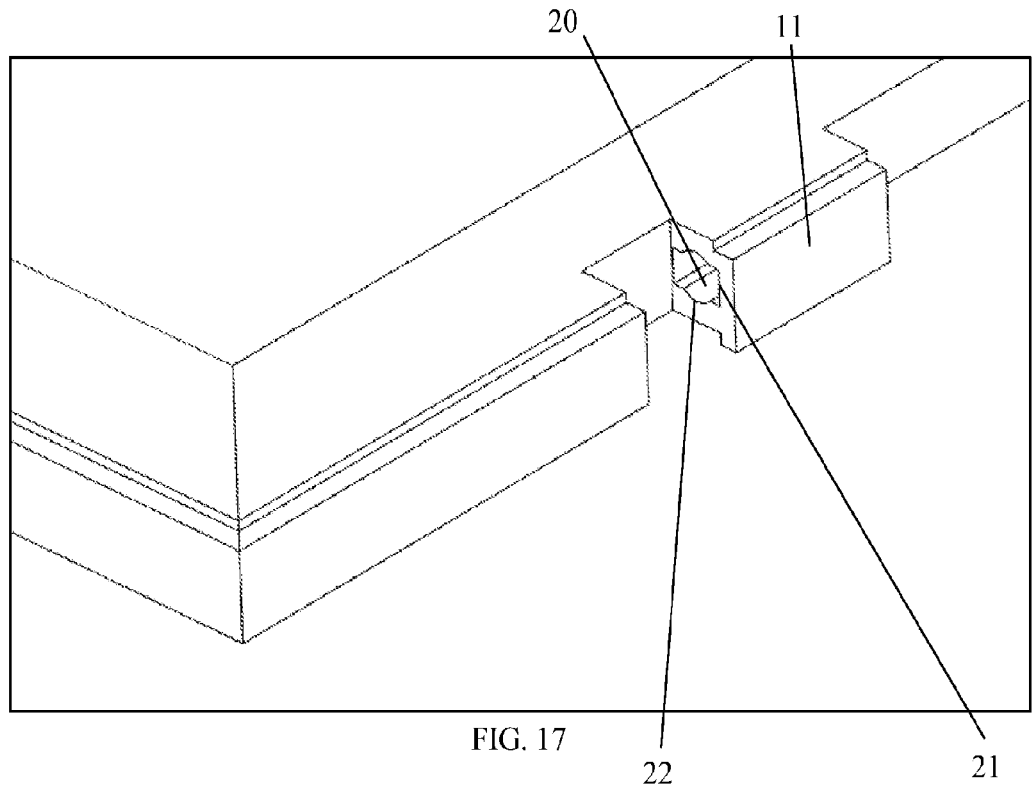
FIG. 17 is a perspective view of a component of an embodiment of the invention.
Figure 18:
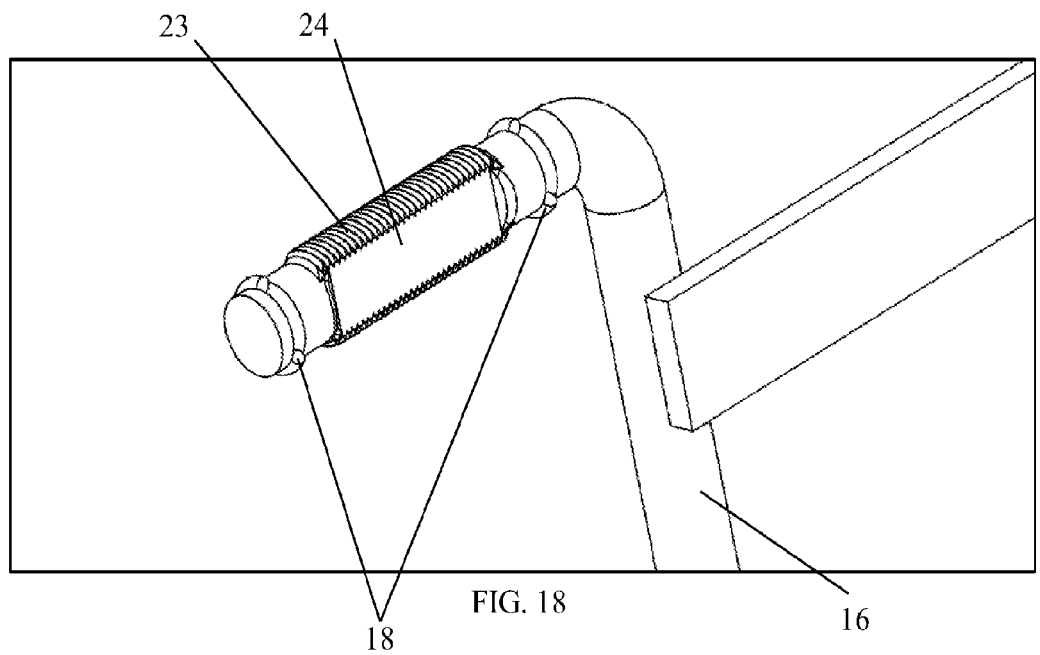
FIG. 18 is a perspective view of a component of an embodiment of the invention.
Figure 19:
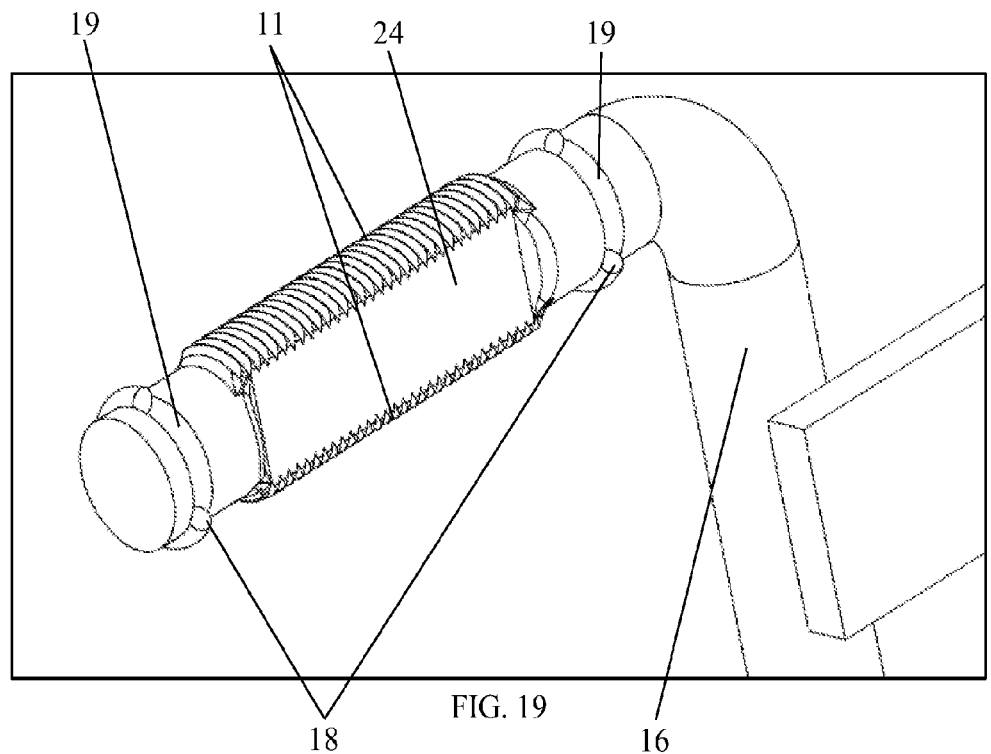
FIG. 19 is a perspective view of a component of an embodiment of the invention.

The Biting Pivot Rod, 16, and the Pivot Rod, 17, can rotate in the Frame Hole, 20, as shown in FIGS. 13 and 14, and FIGS. 17 to 20. Initially the Solar Panel, 10, is shipped as shown in FIG. 21, with the Pivot Supports, 12, in the up position. In this position, the Biting Pivot Rod Flats, 24, are orientated so that the Biting Pivot Rod Flats, 24, as shown in FIGS. 18 and 19, are in the Hole Rectangular Area, 21, as shown in FIG. 17. In this position, the Biting Pivot Rod Teeth, 23, are not cutting into the Frame, 11. As the Pivot Support, 12, as shown in FIG. 21, are rotated downward towards the position shown in FIG. 11-13, the Biting Pivot Rod Teeth, 23, penetrate into the Hole Round Area, 22. This creates an electrical bond between the Frame, 11, and the Pivot Supports, 12. With multiple Biting Pivot Rods, 16, the Frames, 11, are more rigidly tied to the Pivot Supports, 12, which will increase the strength of the Solar Panel. 10. Maximum strength is achieved with all Biting Pivot Rods, 16, but significant strength can be achieved with one at each end and in the middle of each Pivot Support, 12. Pivot Rods, 17, would be in the other areas of the Pivot Support, 12. You could also have all Pivot Rods, 17, but this would lower the strength of the Solar Panel, 10.

Figure 14:
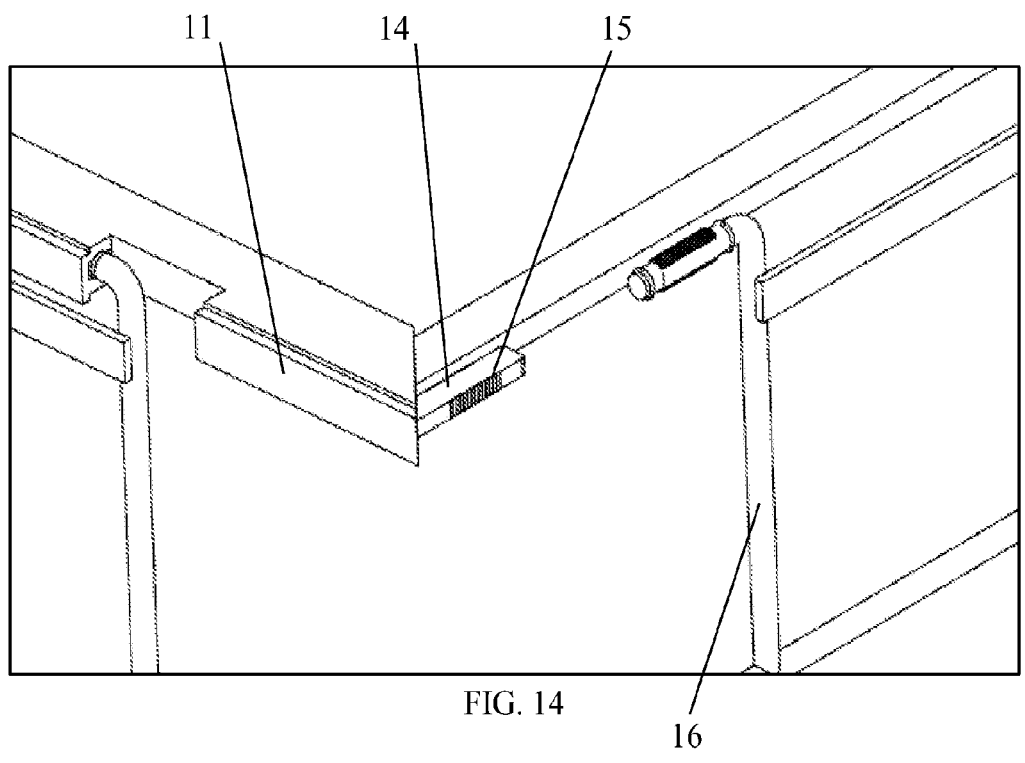
FIG. 14 is a perspective view of a component of an embodiment of the invention.
Figure 15:
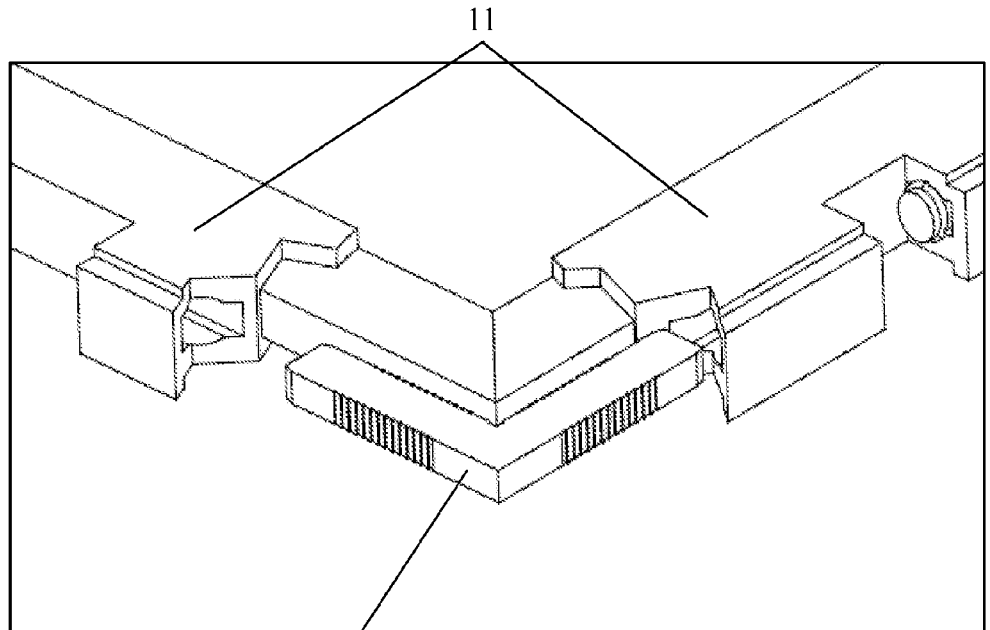
FIG. 15 is a perspective cut-away view of a component of an embodiment of the invention.
Figure 16:
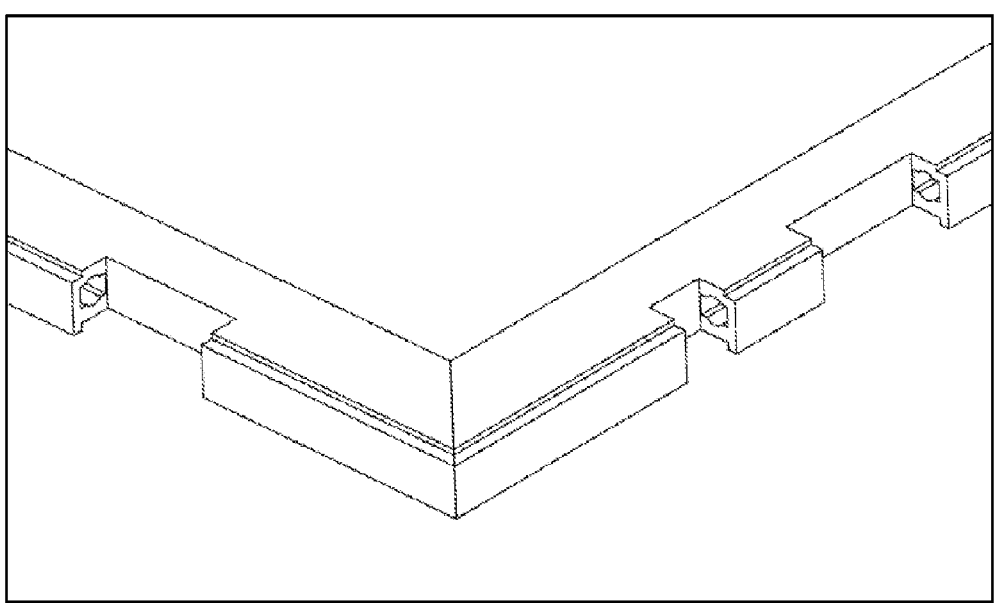
FIG. 16 is a perspective view of a component of an embodiment of the invention.

FIGS. 14 and 15 show the Corner Swage, 14. The Corner Swage, 14, fastens the Frames, 11, securely together. The Corner Swage Teeth, 15, cut into the Hole Rectangular Area, 21, shown in FIG. 17. This assures electrical grounding continuity between the Frames, 11.

To help maintain the proper location of the Pivot Support, 12, in the Frame, 11, prior to rotating down the Pivot Support, 12, Retaining Rings, 18, are placed on at least one Pivot Rod, 17, or Biting Pivot Rod, 16, in the Retaining Ring Groove, 19, for each of the Pivot Supports, 12. See FIGS. 13 and 14 and FIGS. 18-20.

Figure 25:
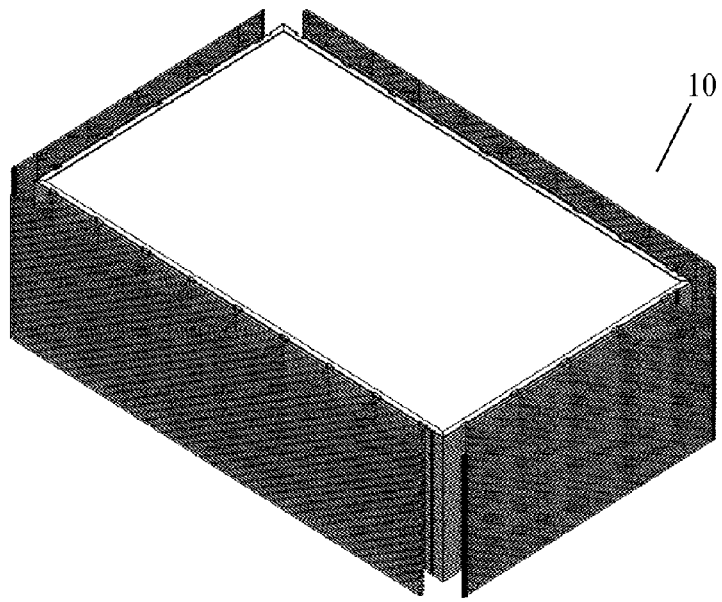
FIG. 25 is a perspective view of an embodiment of the invention.
Figure 26:
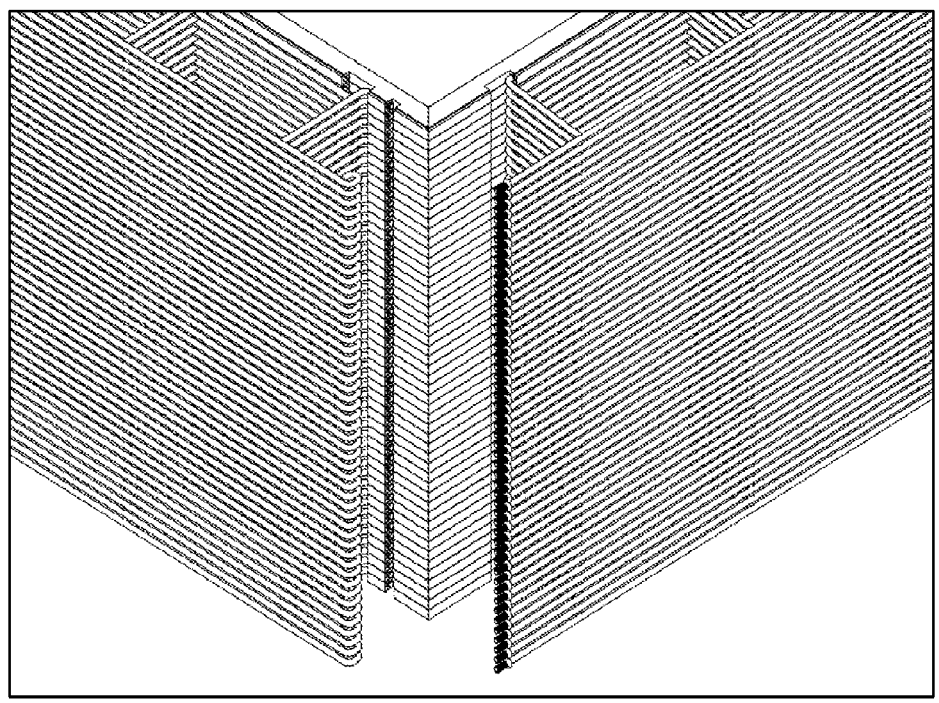
FIG. 26 is a perspective view of a component of an embodiment of the invention.

The Solar Panel, 10, is in the flat position for shipping as shown in FIG. 21. This position allows the Solar Panels, 10, to be nestably stacked on top of each other as shown in FIGS. 25 and 26. Since the Frame, 11, is thin, many more Solar Panels, 10, can be shipped as compared to the Typical Solar Panel, 1, in the same shipping volume. This is a substantial savings in shipping costs.

Figure 22:
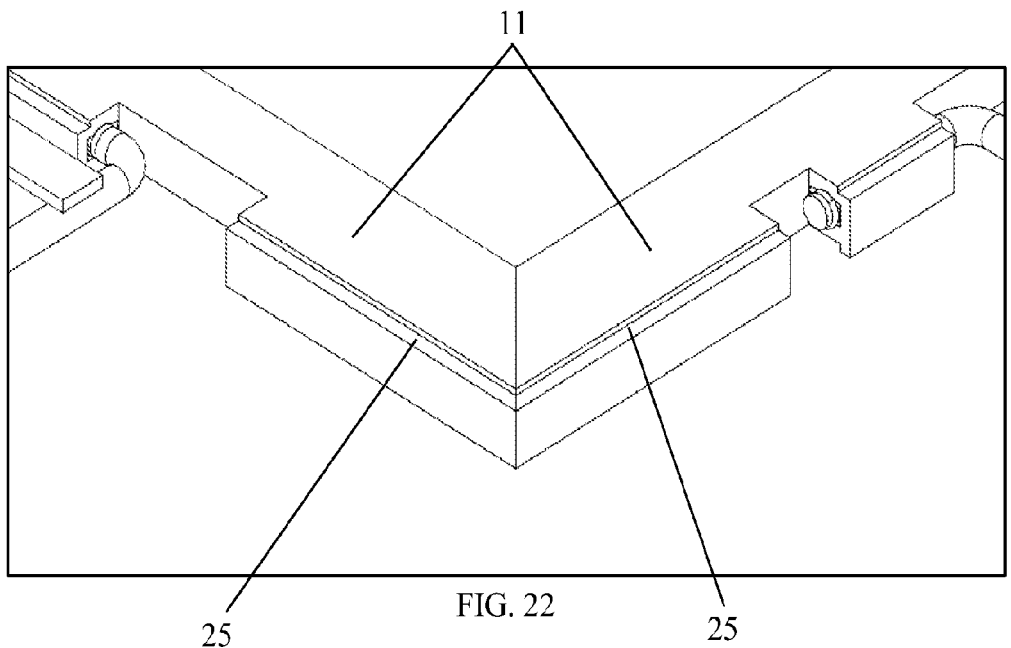
FIG. 22 is a perspective view of a component of an embodiment of the invention.
Figure 23:
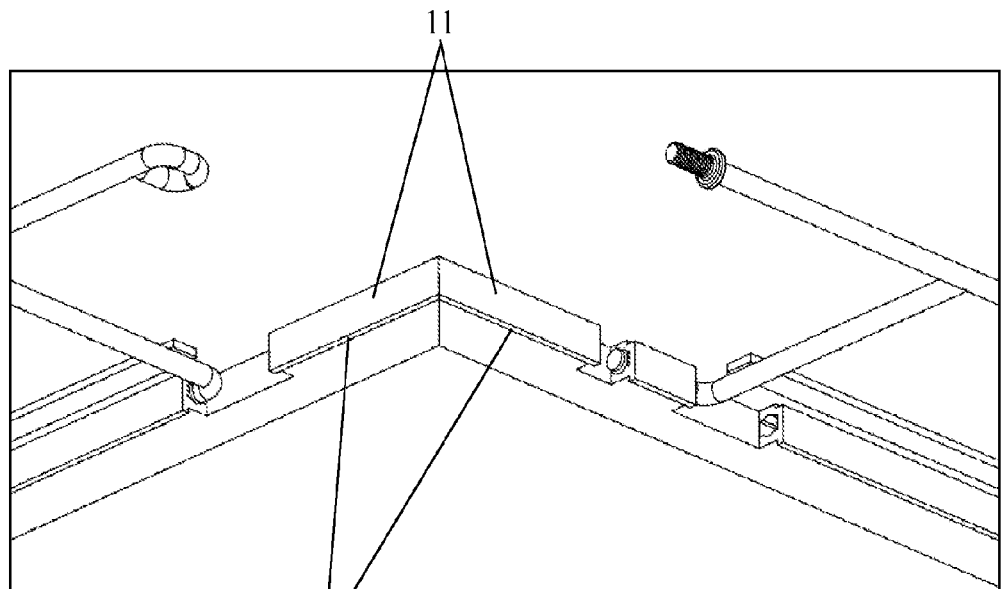
FIG. 23 is a perspective view of a component of an embodiment of the invention.
Figure 24:
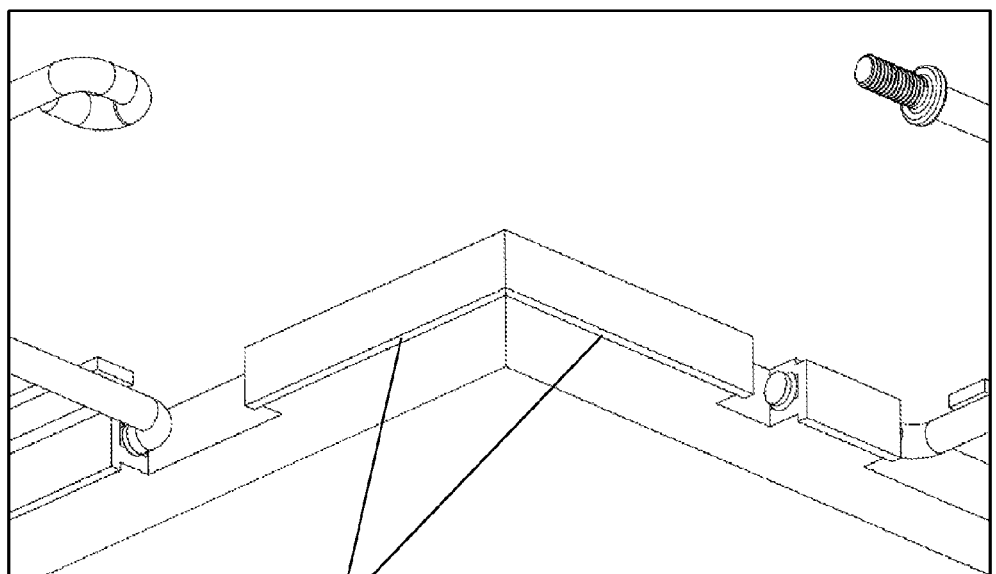
FIG. 24 is a perspective view of a component of an embodiment of the invention.

Stacking locations between Solar Panels, 10, is achieved using the Stack Location Groove, 25, and the Stack Location Lip, 26, on the Frame, 11, as shown in FIGS. 22 to 24. The Stack Location Lip, 26, in the Frame, 11 in an upper Solar Panel, 10, rests in the Stack Location Groove, 25, in the Frame, 11, of a lower Solar Panel, 10.

Figure 12:
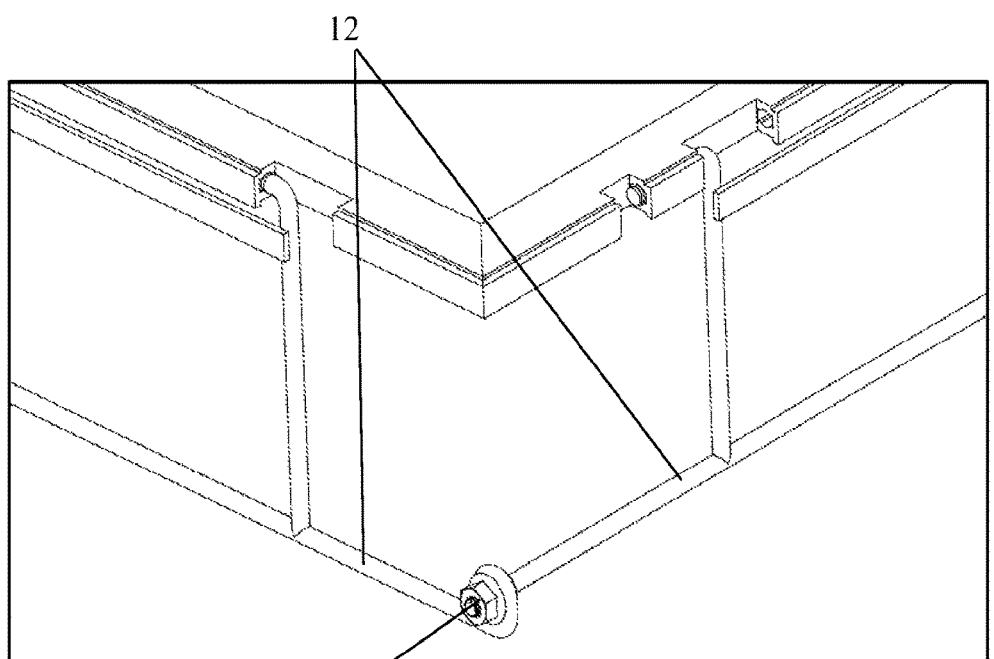
FIG. 12 is a perspective view of a component of an embodiment of the invention.
Figure 13:
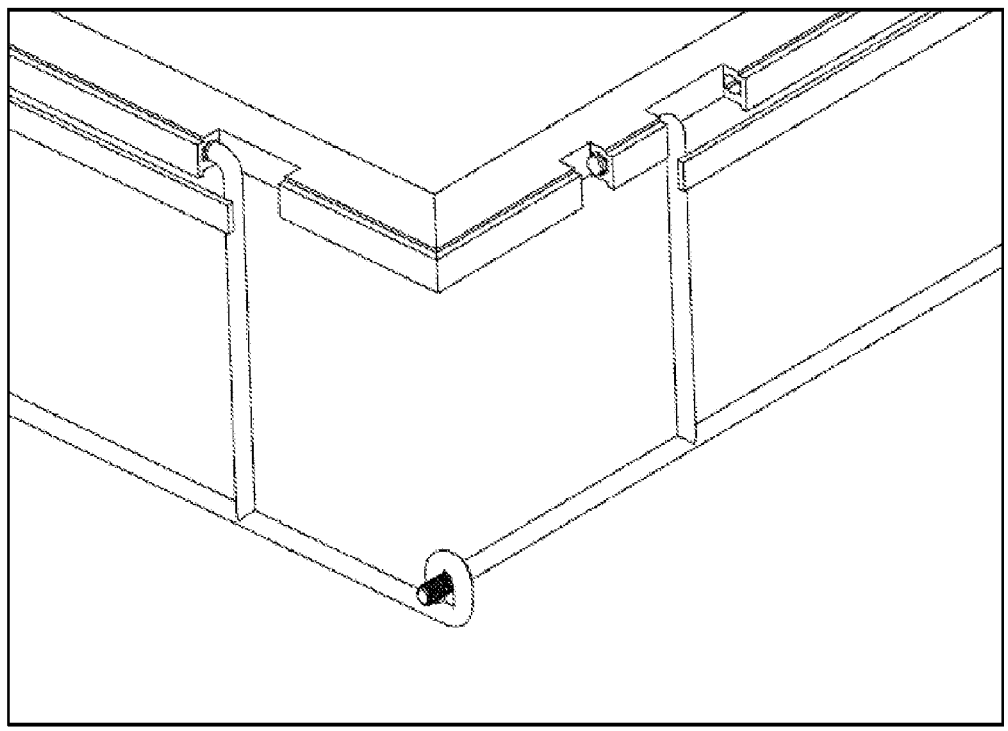
FIG. 13 is a perspective view of a component of an embodiment of the invention.

The Support Nut, 13, is used to properly locate and secure the bottom corners of the Pivot Supports, 12, as shown in FIGS. 12 and 13.

Figure 29:
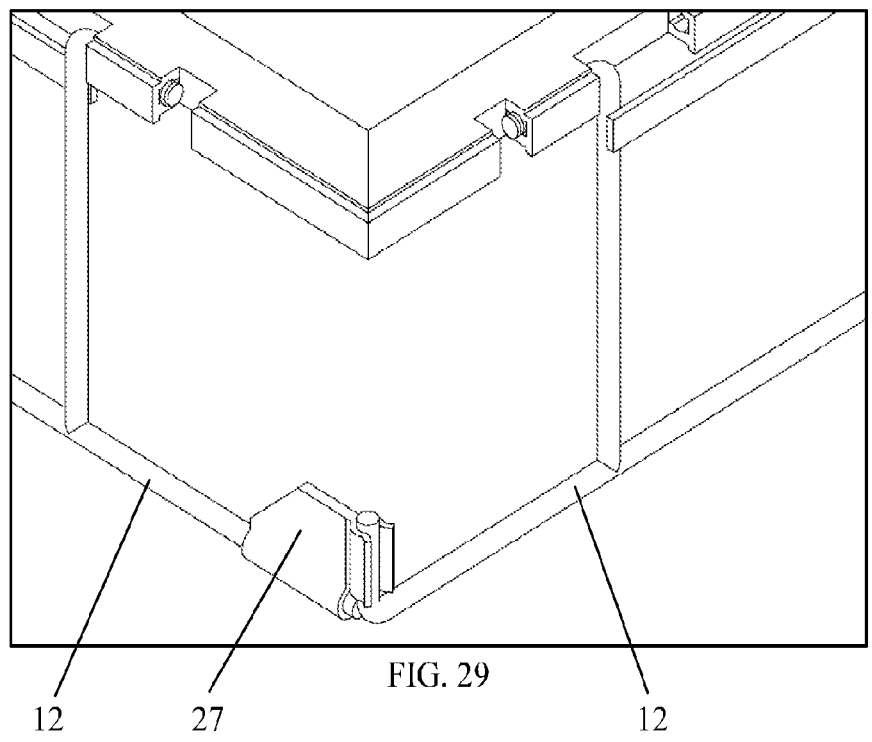
FIG. 29 is a perspective view of a component of an embodiment of the invention.

FIGS. 29 to 33 show other methods of fastening adjacent Pivot Supports, 12, at the bottom corner. A Vertical Snap Connector, 27, is shown in FIG. 29. The Pivot Support, 12, with the Vertical Snap Connector, 27, is pivoted down first. Then the adjacent Pivot Support, 12, is pivoted down and snapped into the Vertical Snap Connector, 27 which fastens the two Pivot Supports, 12, together.

Figure 30:
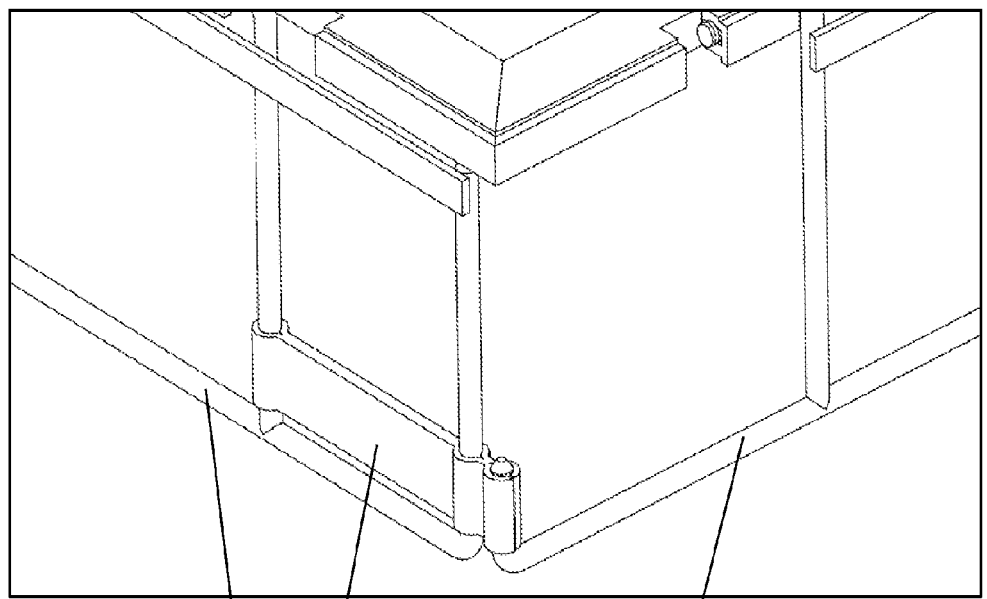
FIG. 30 is a perspective view of a component of an embodiment of the invention.

A Slide Connector, 28, is shown FIG. 30. The Slide Connector, 28, is positioned towards the Frame, 11. The two adjacent Pivot Supports, 12, are pivoted to the down position. The Slide Connector, 28, is then pushed down the Pivot Support, 12, which holds the Slide Connector, 28, until the Slide Connector, 28, grips the adjacent Pivot Support, 12. This secures the two adjacent Pivot Supports, 12.

Figure 31:
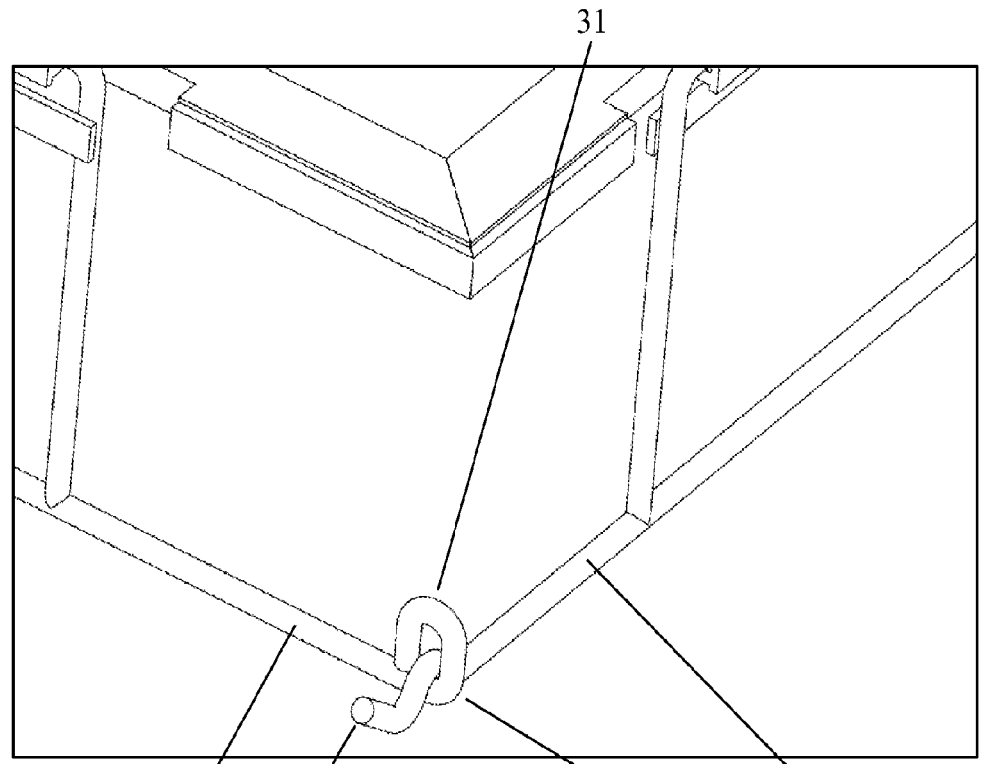
FIG. 31 is a perspective view of a component of an embodiment of the invention.

The Snap Shape Connection, 29, is shown in FIG. 31. This connection is achieved by the special end shapes of the adjacent Pivot Supports, 12. The Pivot Support 12, with the S End Shape, 30, is pivoted down first. The Pivot Support, 12, with the Eye Loop End Shape, 31, is then pivoted down causing the Eye Loop End Shape, 31, to snap onto the S End Shape, 30, which secures the two adjacent Pivot Supports, 12, together.

Figure 32:
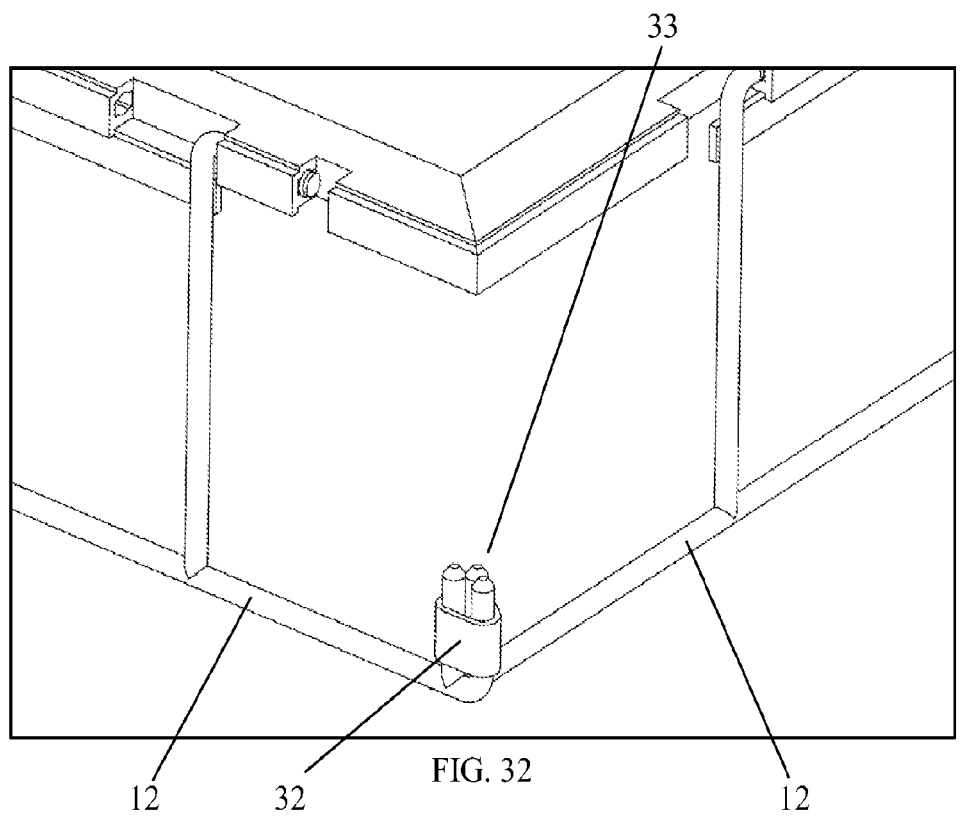
FIG. 32 is a perspective view of a component of an embodiment of the invention.
Figure 33:
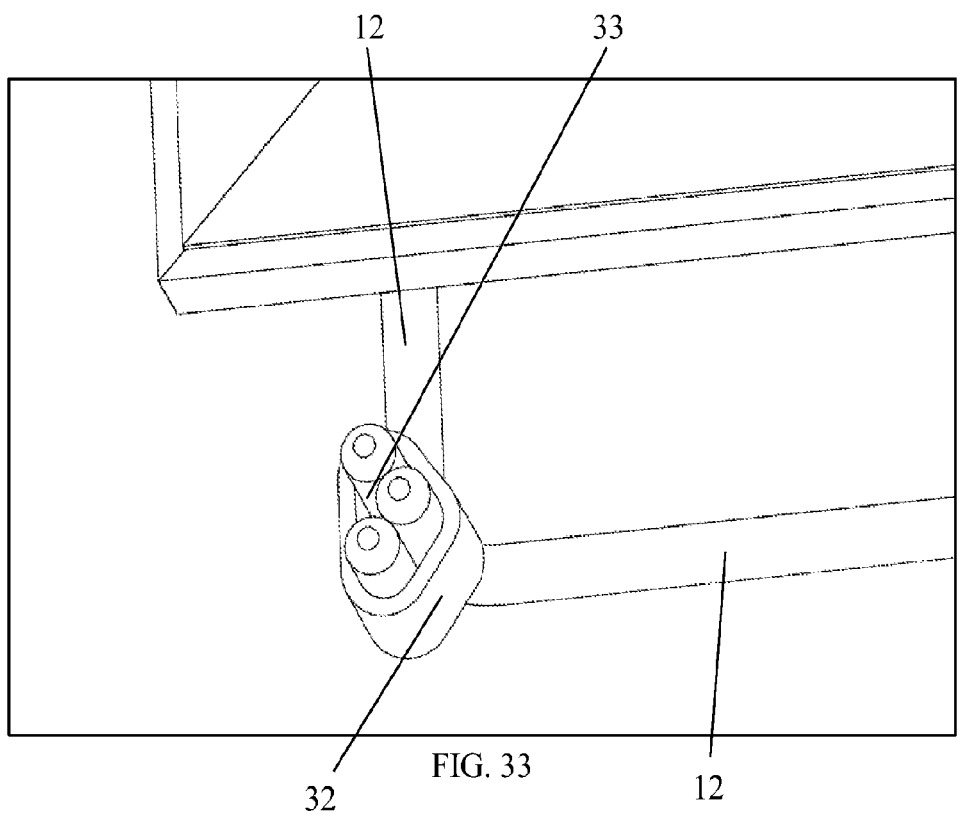
FIG. 33 is a perspective view of a component of an embodiment of the invention.

FIGS. 32 and 33 show the fastening the two adjacent Pivot Supports, 12, together using a Slip Ring Connector, 32. The two adjacent Pivot Supports, 12 are pivoted down as shown. The Slip Ring Connector, 32, is then force over the three Vertical Rods, 33, which then locks the Pivot Supports, 12, together. The Slip Ring Connector, 32, may be crimped in place.

Figure 1:
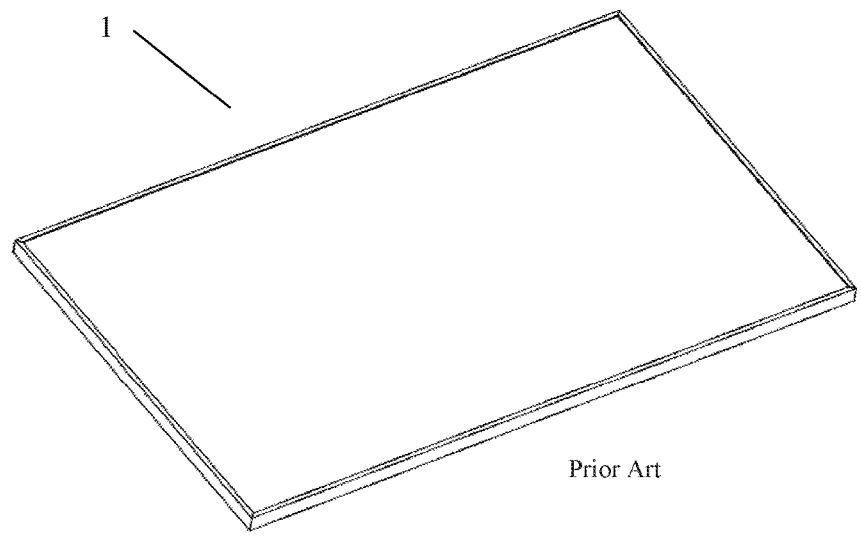
FIG. 1 is a perspective view of a known solar panel.
Figure 2:
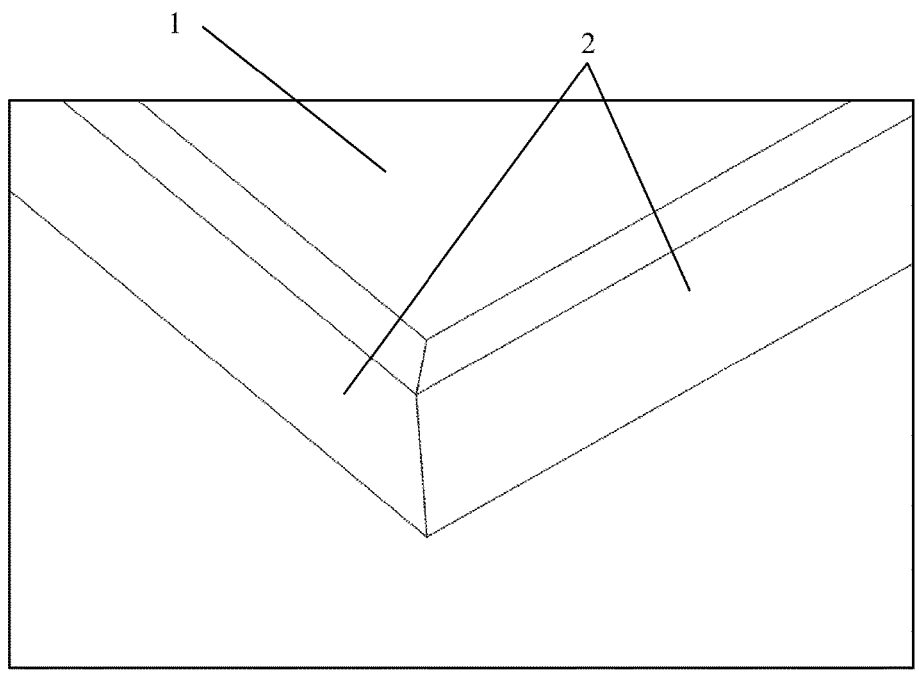
FIG. 2 is a perspective view of a component of a known solar panel.
Figure 3:
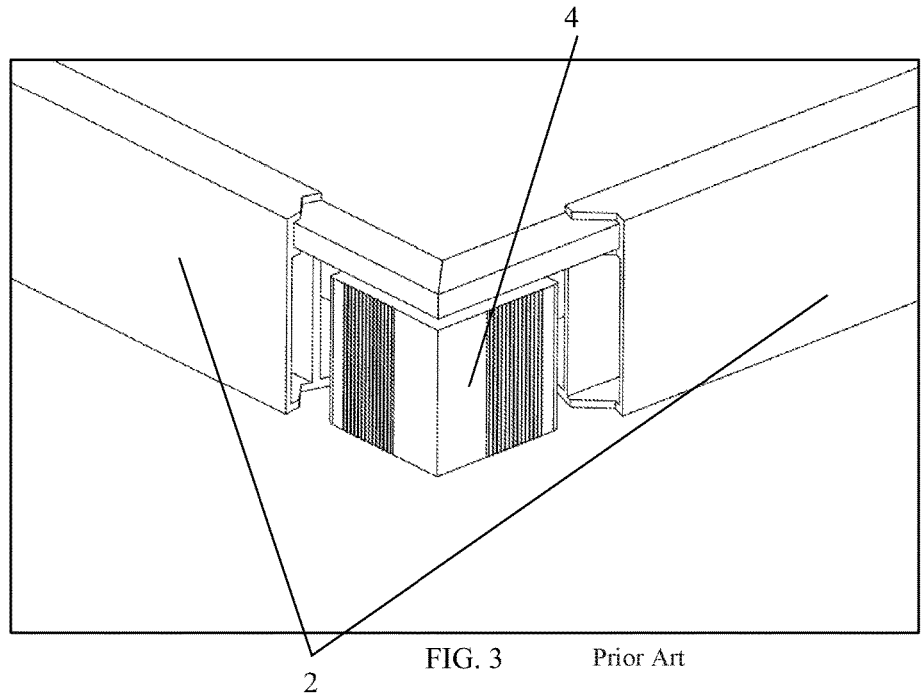
FIG. 3 is a perspective view of a component of a known solar panel.
Figure 4:
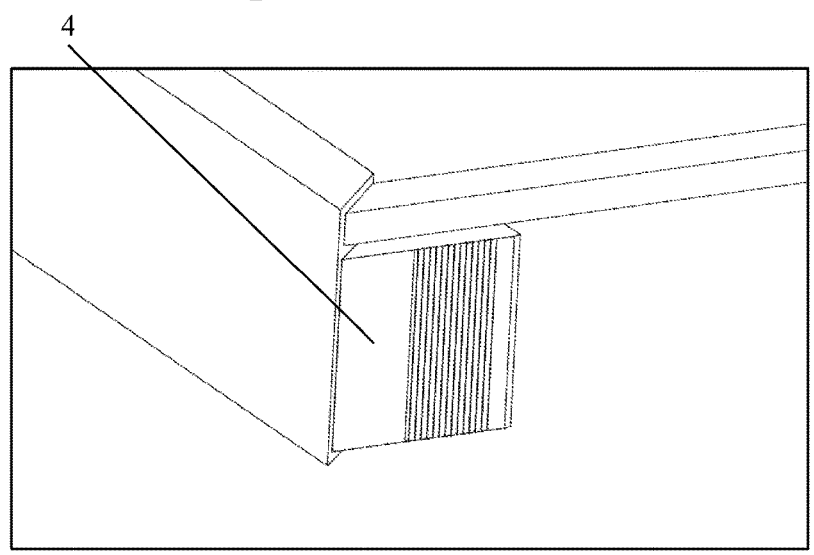
FIG. 4 is a perspective view of a component of a known solar panel.
Figure 9:
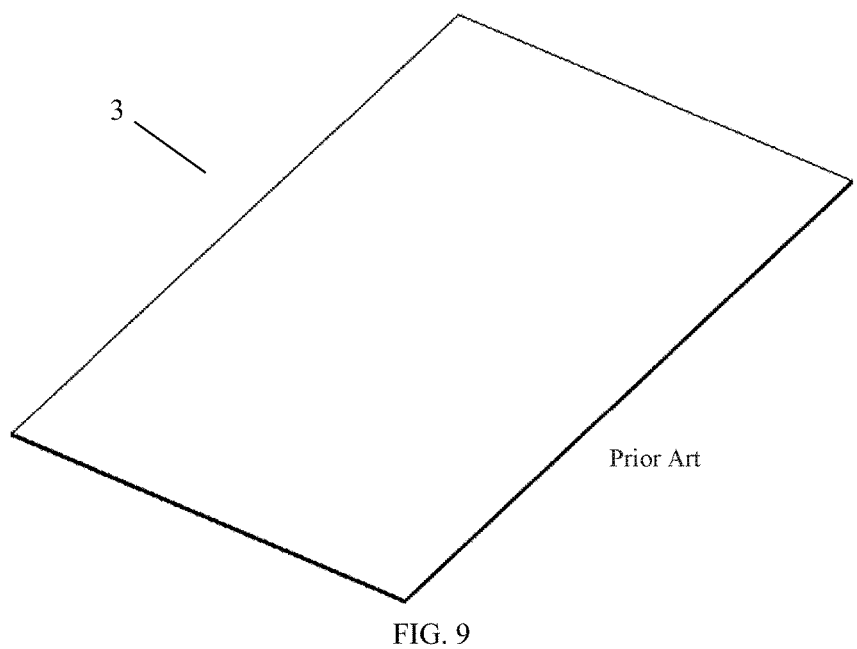
FIG. 9 is a perspective view of a component of a known solar panel.
Figure 27:
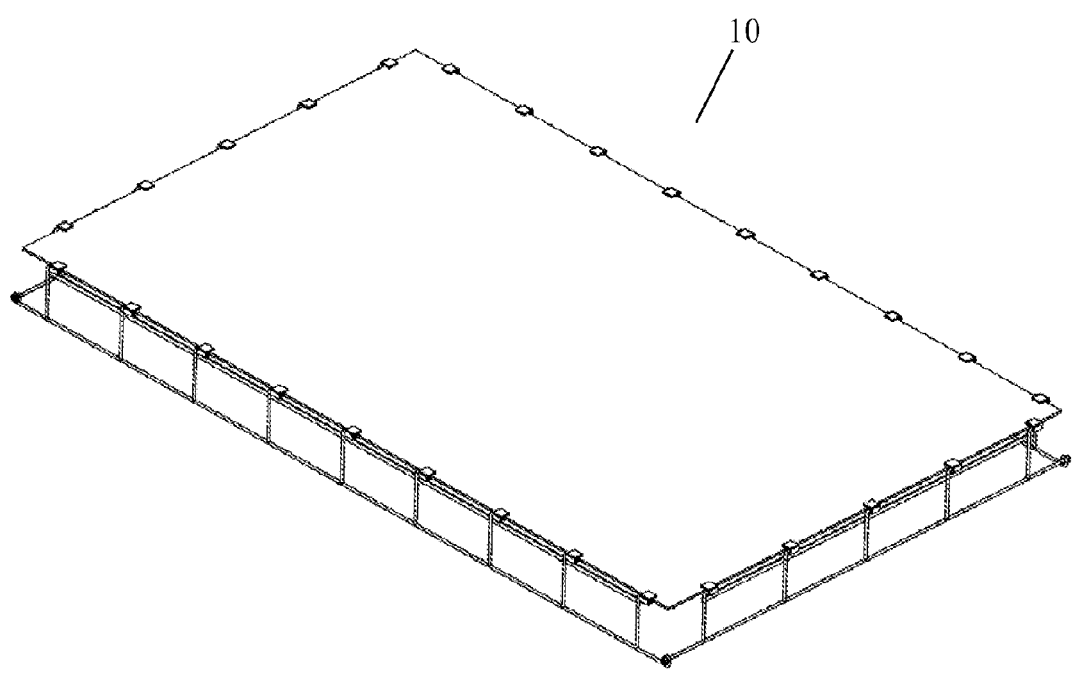
FIG. 27 is a perspective view of an embodiment of the invention.
Figure 28:
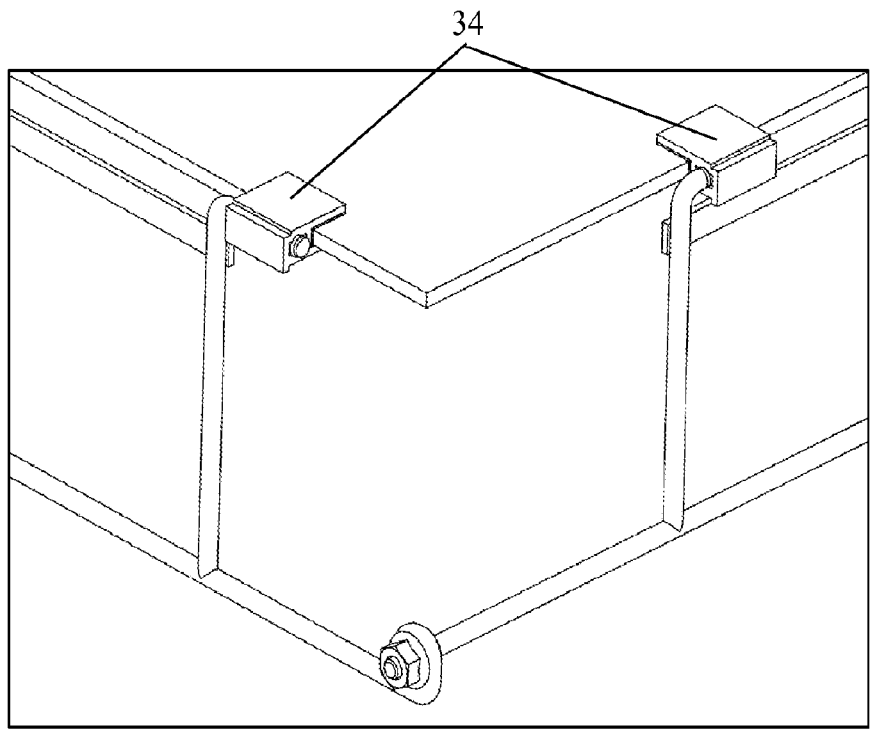
FIG. 28 is a perspective view of a component of an embodiment of the invention.

The Frame, 11, is continuous around the Laminate, 3, as shown in FIGS. 11 to 17. The Frame, 11, does not have to continuous to support the Laminate, 3. FIGS. 27 and 28 show a Segmented Frame, 34, for the Solar Panel, 10. The Laminate, 3, can be laminates as shown in FIGS. 5, 9, and 10 or any other type of photovoltaic, support or protective layers.

FIGS. 34 to 42 show connectors that both fasten the adjacent Pivot Supports, 12, and fasten the Solar Panels, 10 to other structures and to each other.

Figure 34:
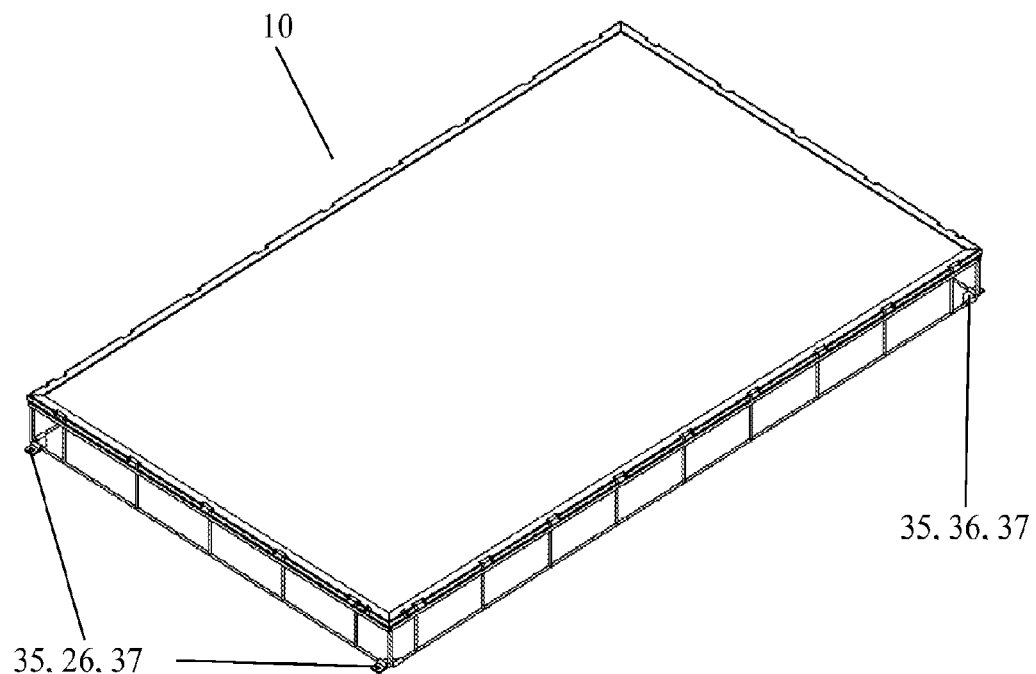
FIG. 34 is a perspective view of an embodiment of the invention.
Figure 35:
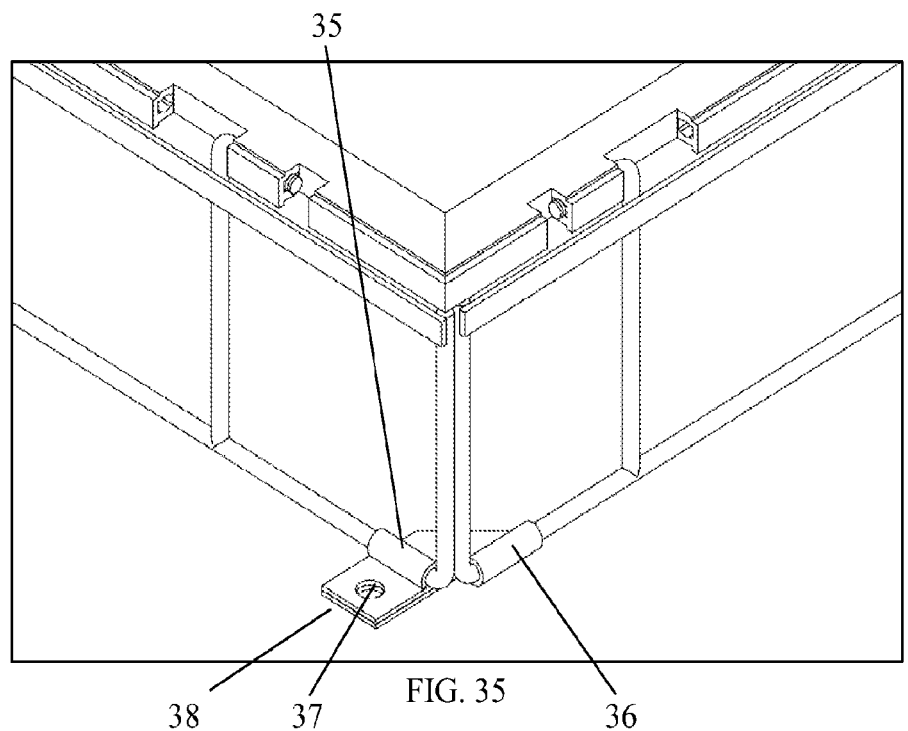
FIG. 35 is a perspective view of a component of an embodiment of the invention.
Figure 36:
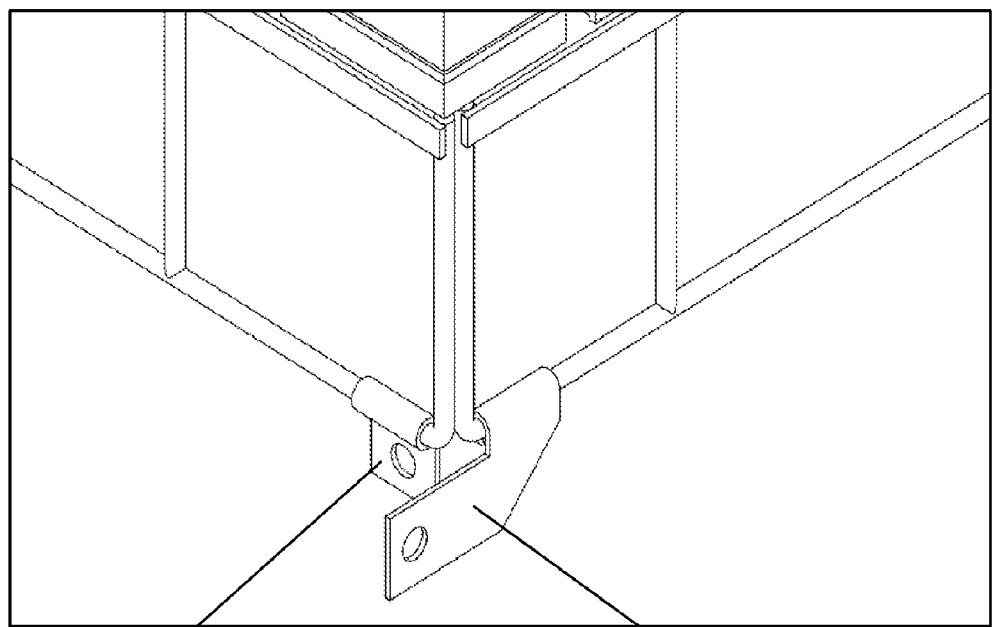
FIG. 36 is a perspective view of a component of an embodiment of the invention.

FIGS. 34 to 36 shows the Short Horizontal Connector, 35, and the Long Horizontal Connector, 36, fastened to two adjacent Pivot Supports, 12. In FIG. 36, the Short Horizontal Connector, 35, and the Long Horizontal Connector, 36, is shown in the position right after the Pivot Supports, 12, are pivoted down after shipping. FIG. 35, shows the Short Horizontal Connector, 35, and the Long Horizontal Connector, 36, rotated in a position ready to accept a fastener through the Connector Hole, 37. When the Short Horizontal Connector, 35, and the Long Horizontal Connector, 36, is in this position, it will be referred to as Horizontal Connectors, 38, as shown in FIG. 35 and FIGS. 37 to 40.

Figure 37:
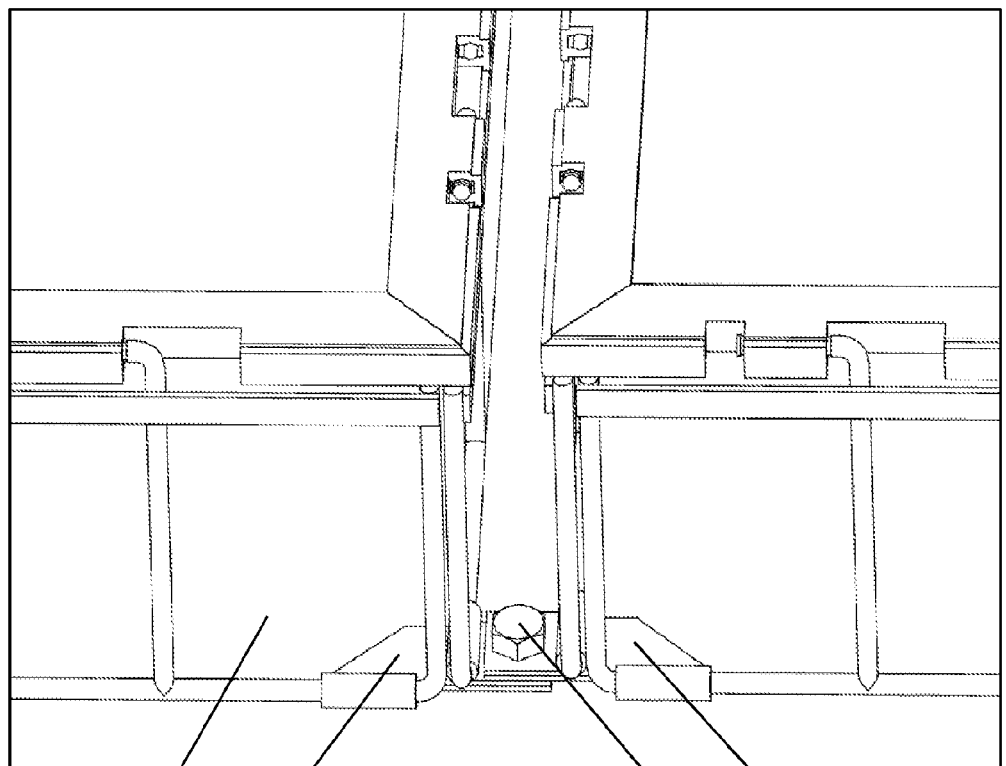
FIG. 37 is a perspective view of a component of an embodiment of the invention.
Figure 38:
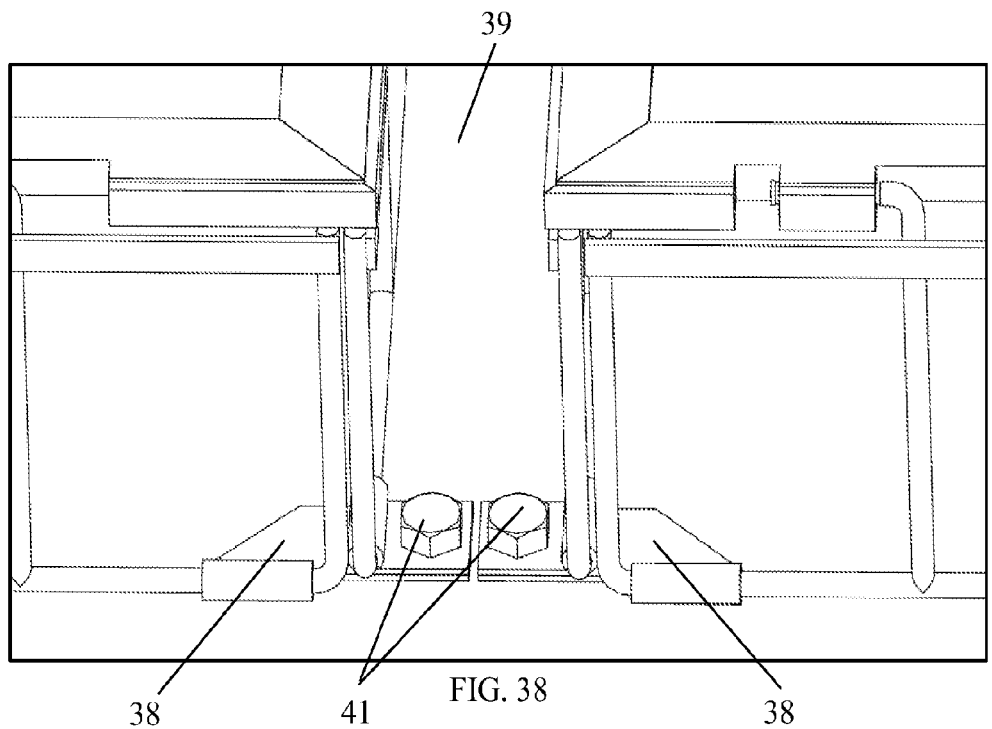
FIG. 38 is a perspective view of a component of an embodiment of the invention.

FIGS. 37 and 38 shows how the Horizontal Connectors, 38 can be fastened to a Surface, 39, using Connector Fasteners, 41. The Surface, 39, can be but not limited to a roof, balcony, patio, or other solid ground structure.

Figure 39:
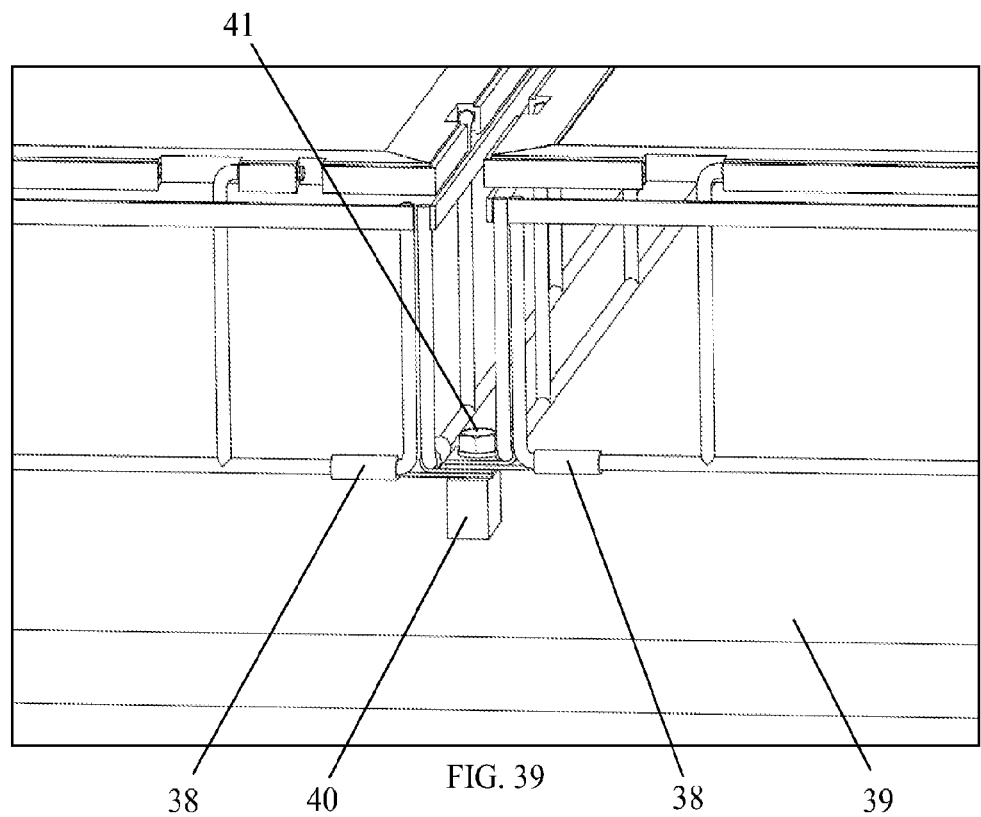
FIG. 39 is a perspective view of a component of an embodiment of the invention.
Figure 40:
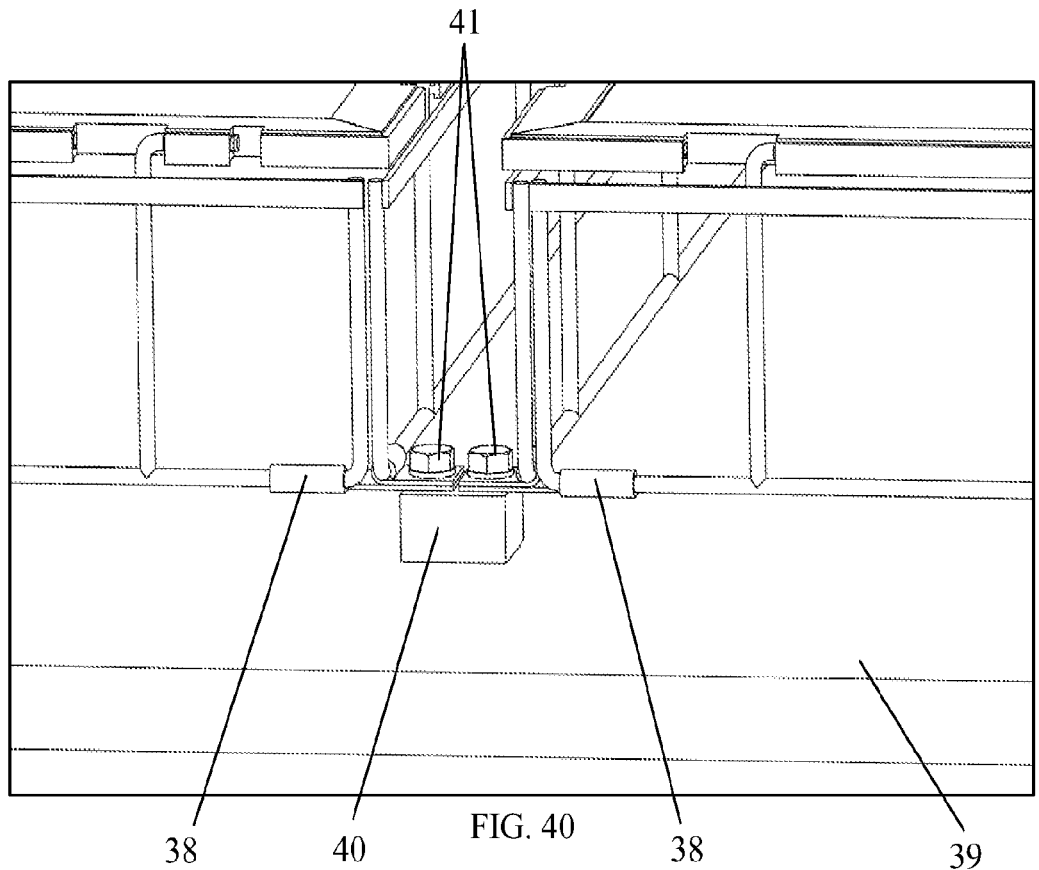
FIG. 40 is a perspective view of a component of an embodiment of the invention.

FIGS. 39 and 40 shows how the Horizontal Connectors, 38 can be fastened to a Mount, 40, using Connector Fasteners, 41. The Mount, 40, can be but is not limited to a roof mount, ground mount, or solar racking.

Figure 41:
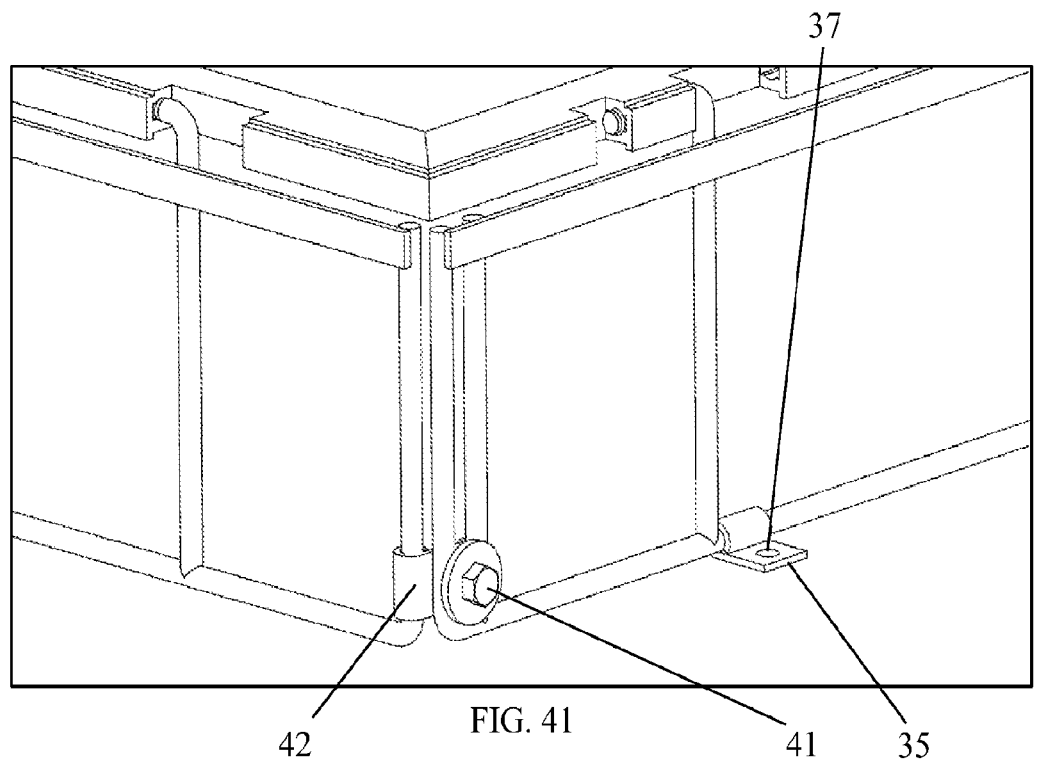
FIG. 41 is a perspective view of a component of an embodiment of the invention.

FIG. 41 shows a Short Vertical Connector, 42, connecting two adjacent Pivot Supports together using Connector Fastener 41. It also shows a Short Horizontal Connector, 35, on a Pivot Support, 12, that can be used to attach the Solar Panel. 10, by using a Connector Fastener, 41, inserted through the Connector Hole, 37. Note that the Short Vertical Connector, 42, is similar to the Short Horizontal Connector, 35, with a different orientation.

Figure 42:
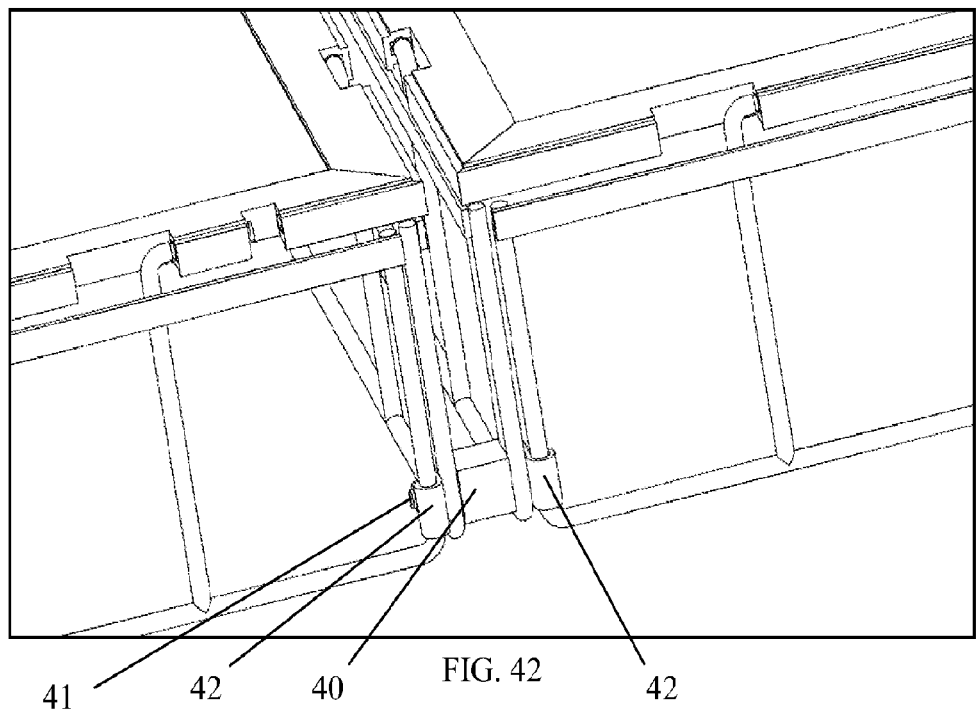
FIG. 42 is a perspective view of a component of an embodiment of the invention.
Figure 43:
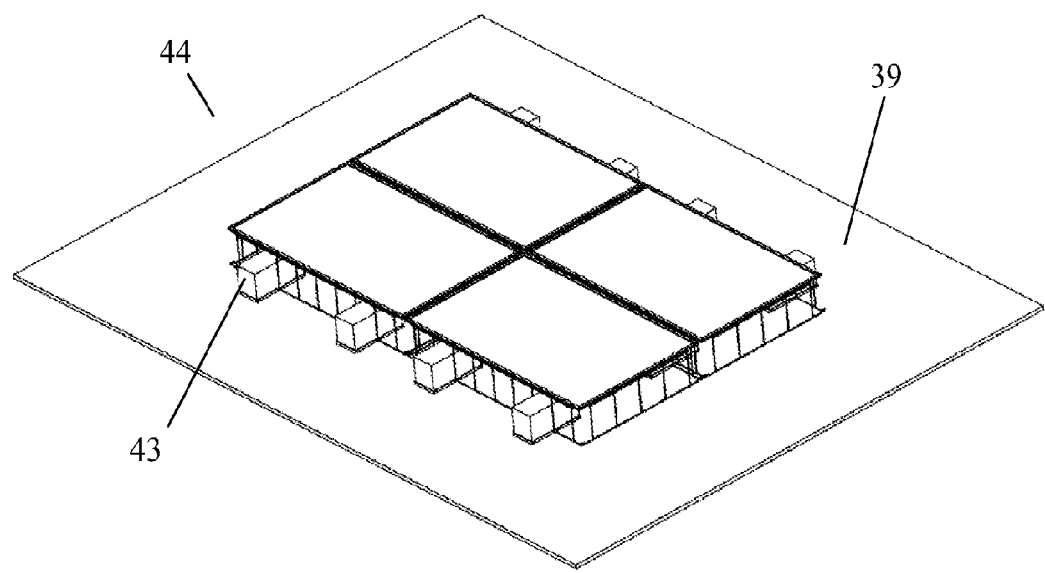
FIG. 43 is a perspective view of an embodiment of the invention.
Figure 44:
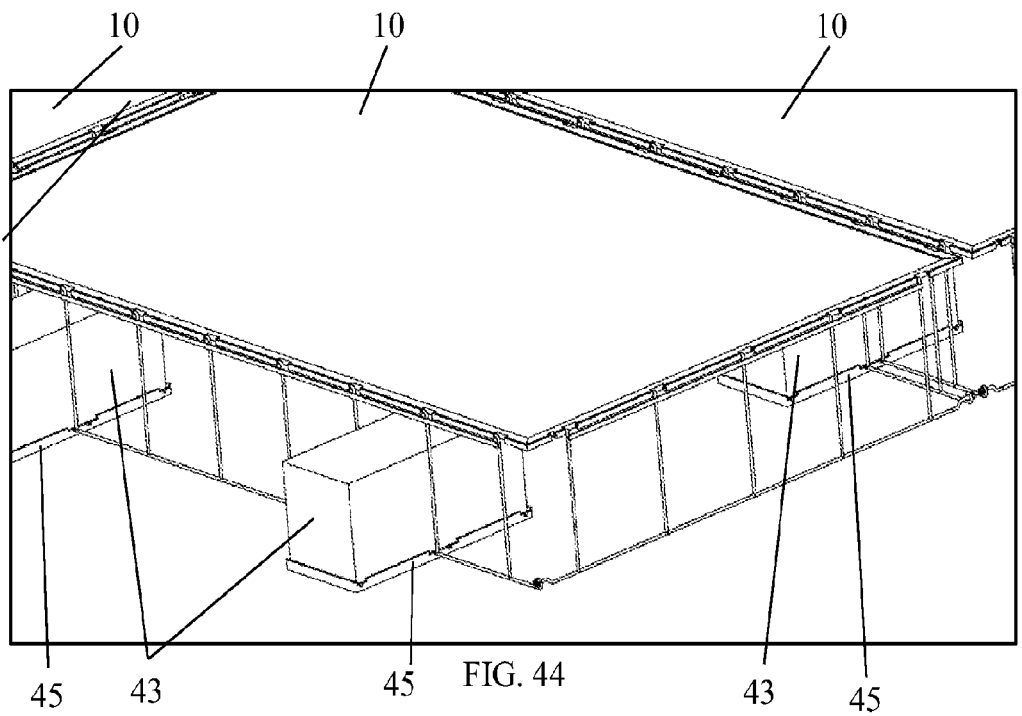
FIG. 44 is a perspective view of a component of an embodiment of the invention.
Figure 45:
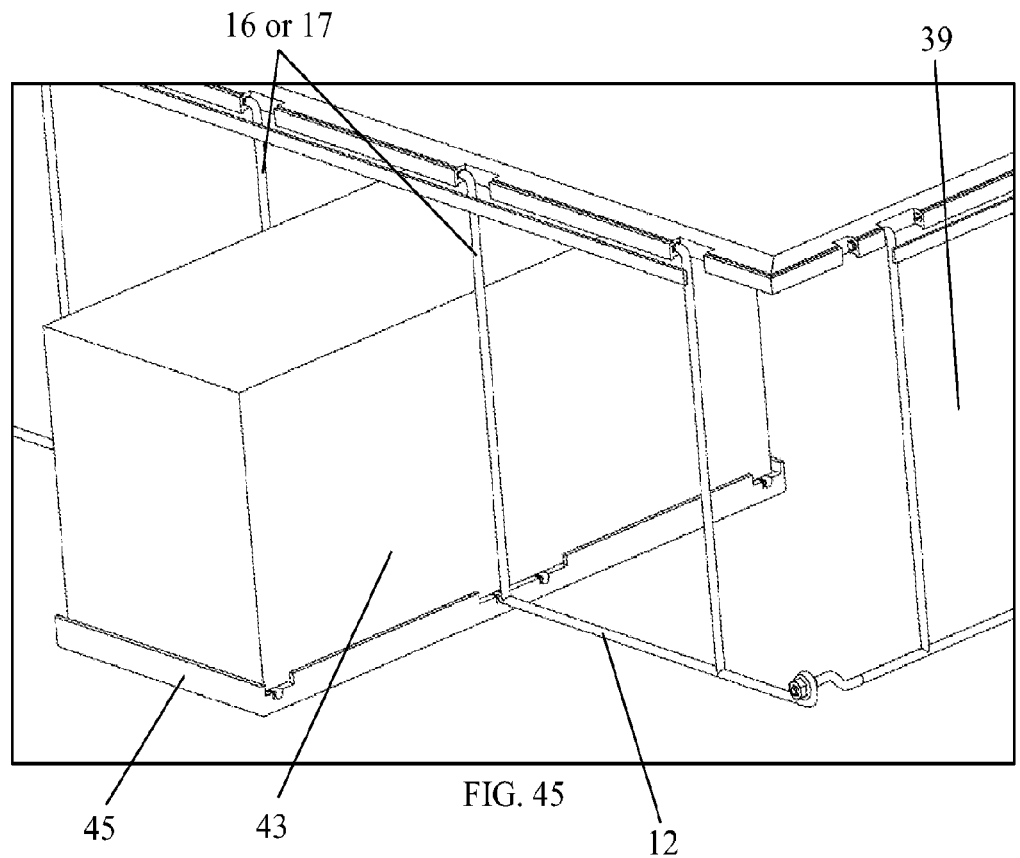
FIG. 45 is a perspective view of a component of an embodiment of the invention.
Figure 46:
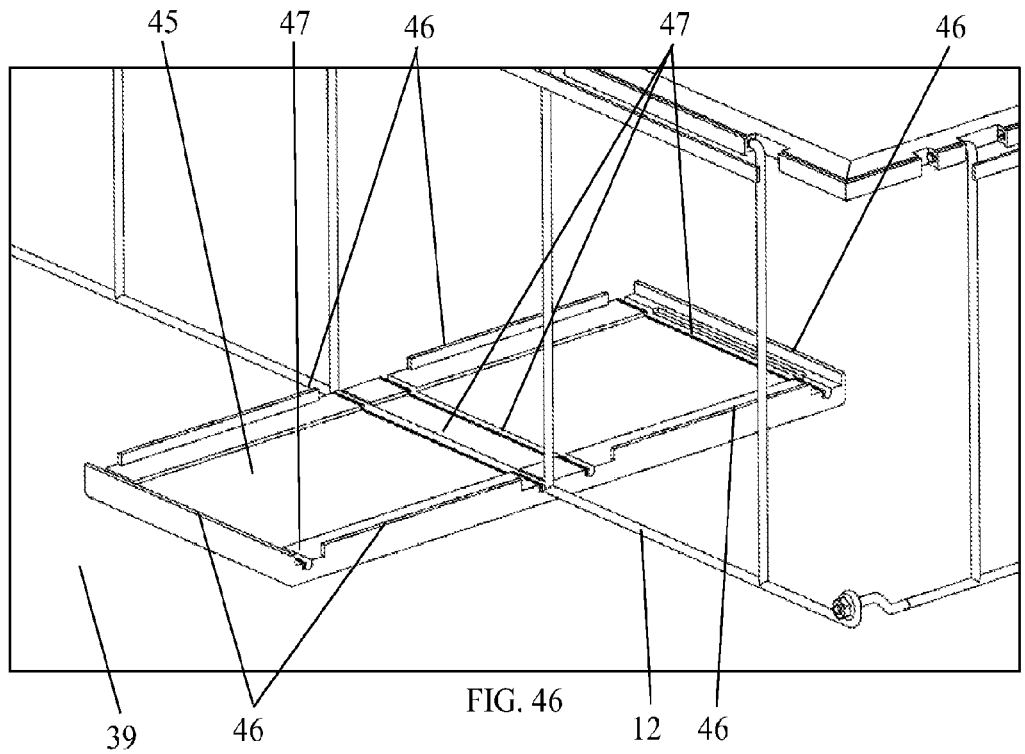
FIG. 46 is a perspective view of a component of an embodiment of the invention.
Figure 47:
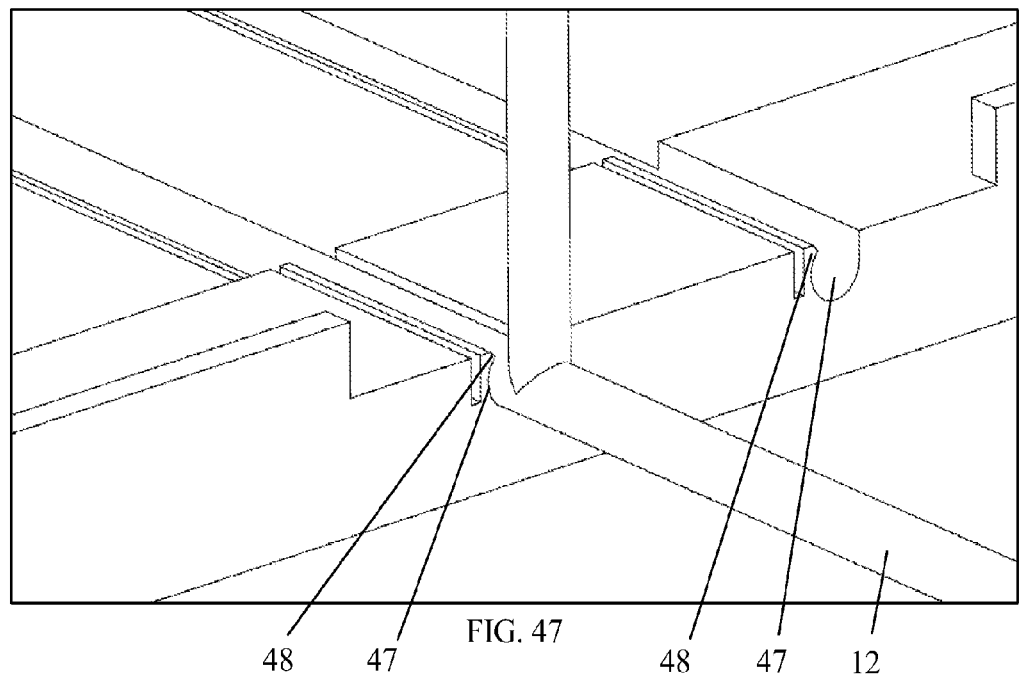
FIG. 47 is a perspective view of a component of an embodiment of the invention.
Figure 48:
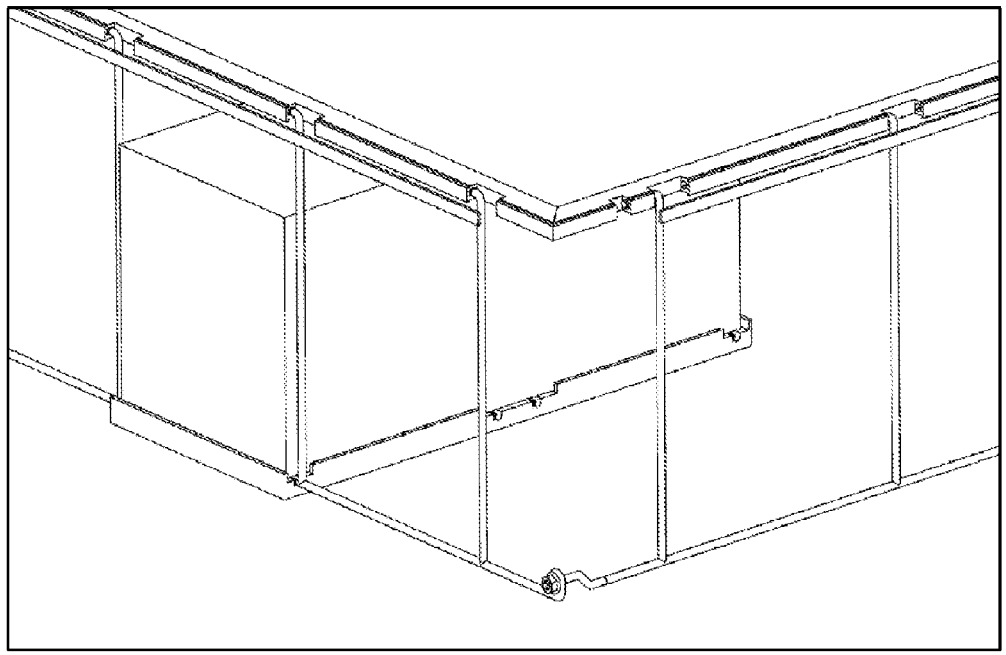
FIG. 48 is a perspective view of a component of an embodiment of the invention.

FIG. 42 shows two Solar Panels, 10, connected together with Connector Fasteners, 41, Short Vertical Connectors, 42, and Mount, 40. The adjacent Pivot Supports, 12, are also fastened together.

It should be noted that the Figures usually show only one corner of the adjacent Pivot Support, 12, fastened together and/or fastened to the Surface, 39 or Mount, 40. This can apply to all adjacent Pivot Supports, 12, on multiple Solar Panels, 10. One of more Solar Panels, 10, may be attached together. This applies throughout this patent.

Ballast, 43, can also be used to hold down the Solar Panel, 10 as shown in FIGS. 43-63. FIGS. 43-49 shows Ballast, 43, resting on top of the Ballast Feet, 45. The Ballast Foot, 45, rests on the Surface, 39. The Ballast Foot Lips, 46, locate the Ballast, 43, in the Ballast Foot, 45, and keeps the Ballast 43, contained on the Ballast Foot, 45.

Figure 49:
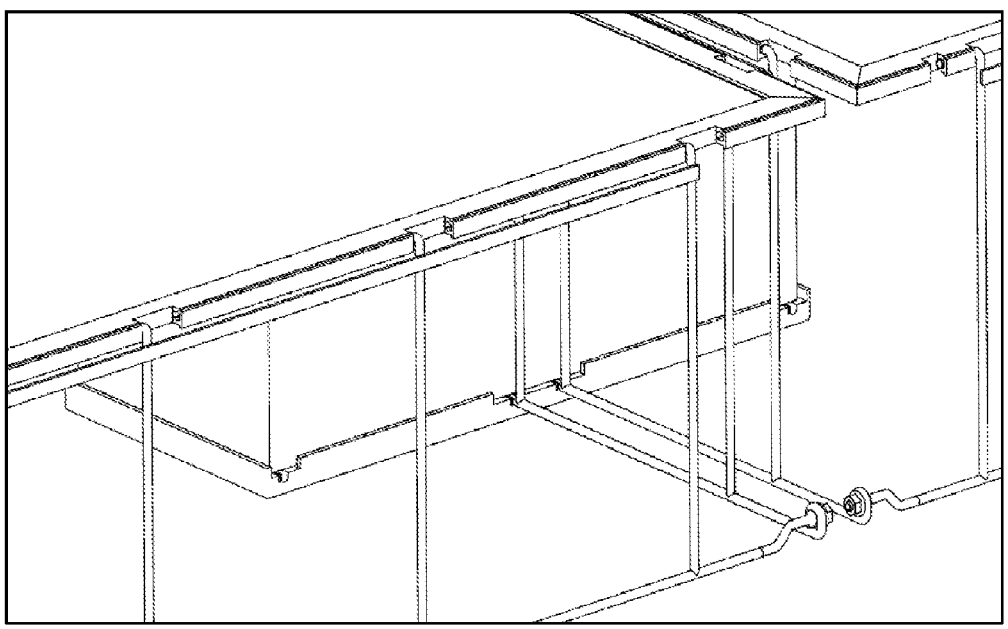
FIG. 49 is a perspective view of a component of an embodiment of the invention.

The Pivot Support, 12, is snapped into and confined to the Ballast Foot Groove, 47, with the Ballast Foot Snap, 48. The bottom of the Pivot Support, 12, can be placed in any of the Ballast Foot Grooves, 47, as shown in FIGS. 45 to 48. The Ballast Foot Grooves, 47, also can be used as a space locator between Solar Panels, 10 as can be seen in FIG. 49. The Ballast Foot, 45, can be used in between adjacent the Pivot Rods, 17, and Biting Pivot Rods, 16, on any of the four Pivot Supports, 12, on each Solar Panel, 10. Note that the Ballast, 43, could be placed directly on the bottom of the Pivot Support, 12, without a Ballast Foot, 45. In many situations, it is better to use the Ballast Foot, 45, to distribute the load on the Surface, 39, and to keep the Ballast, 43, from shifting.

Figure 50:
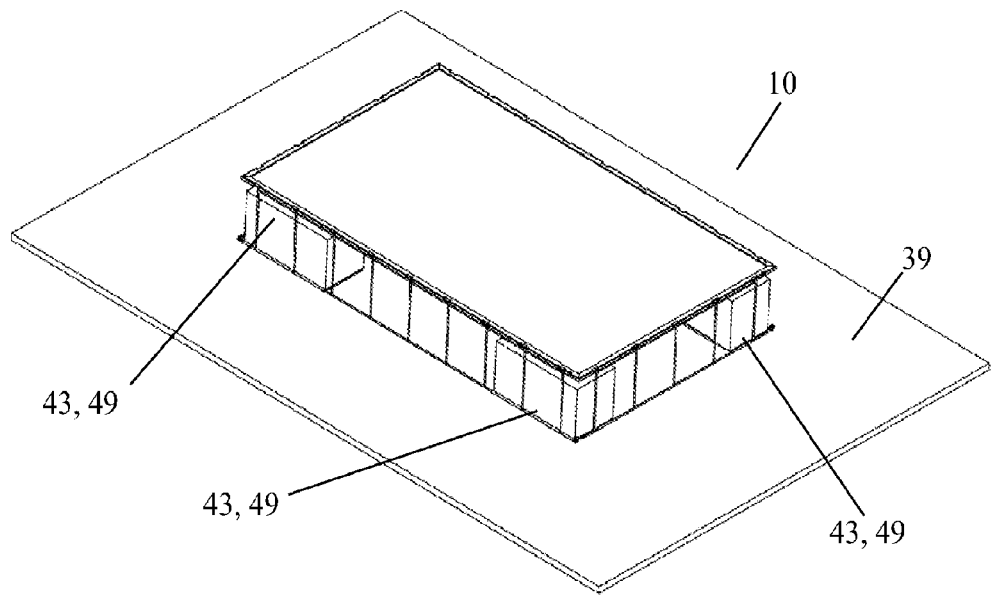
FIG. 50 is a perspective view of an embodiment of the invention.
Figure 51:
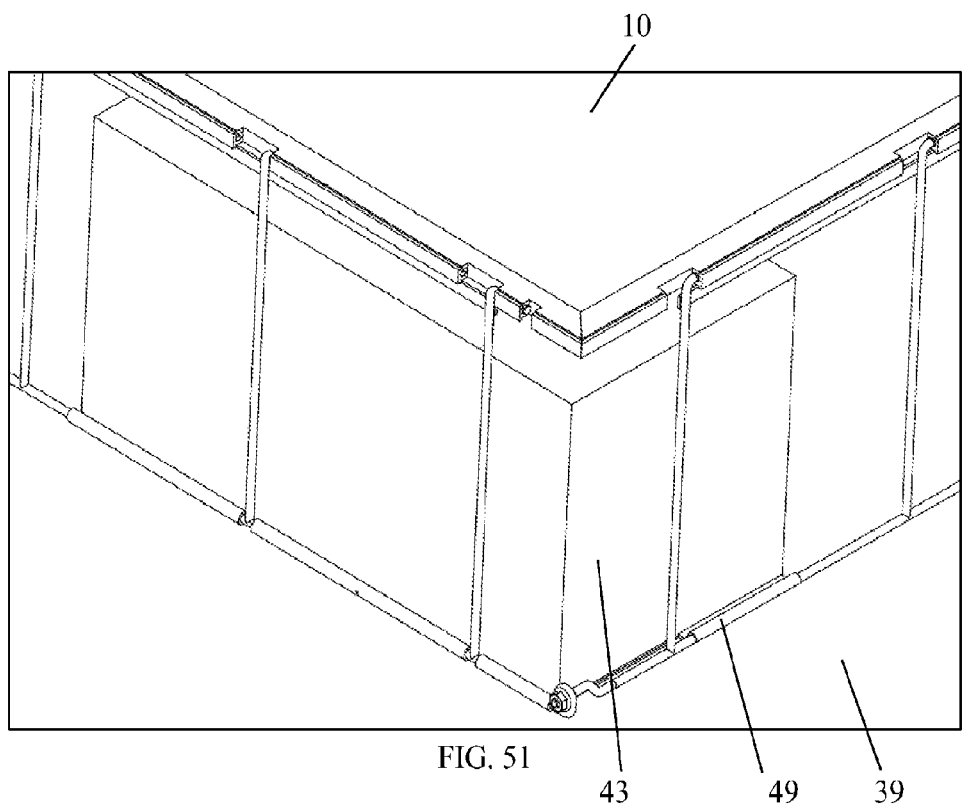
FIG. 51 is a perspective view of a component of an embodiment of the invention.
Figure 52:
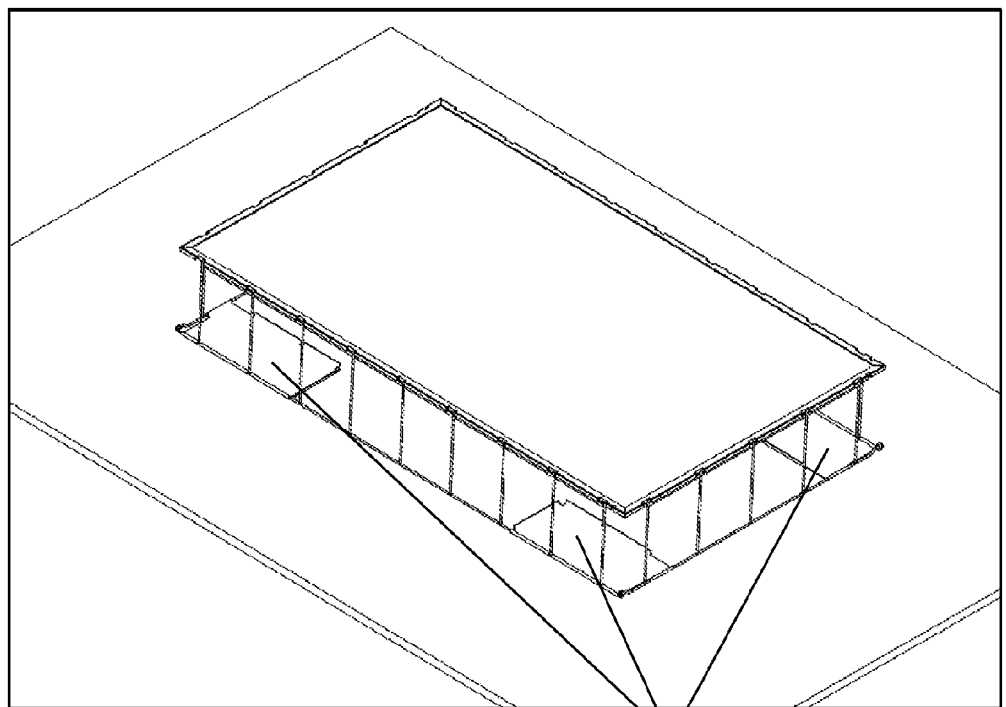
FIG. 52 is a perspective view of an embodiment of the invention.

FIGS. 50 to 63 show the Solar Panel, 10, with Folding Ballast Trays, 49. FIGS. 50 and 51 shows a Solar Panel, 10, with Ballast, 43, on the Folding Ballast Tray, 49, and FIGS. 52 to 55 show a Solar Panel, 10, without the Ballast, 43. The Folding Tray Ballast Lips, 51, hold the Ballast, 43 in place.

Figure 53:
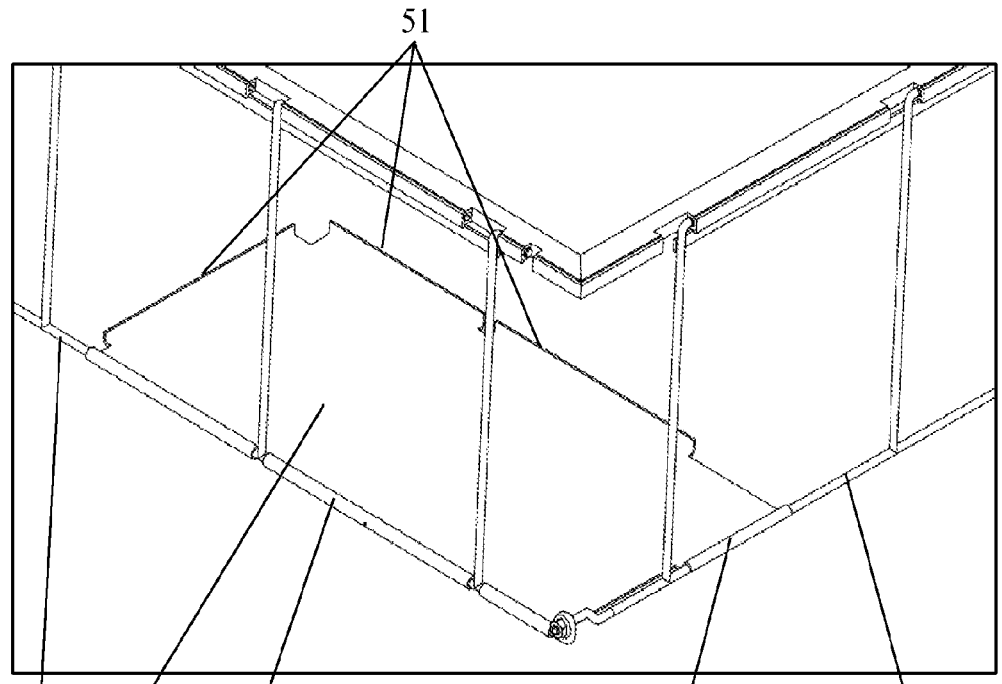
FIG. 53 is a perspective view of a component of an embodiment of the invention.
Figure 54:
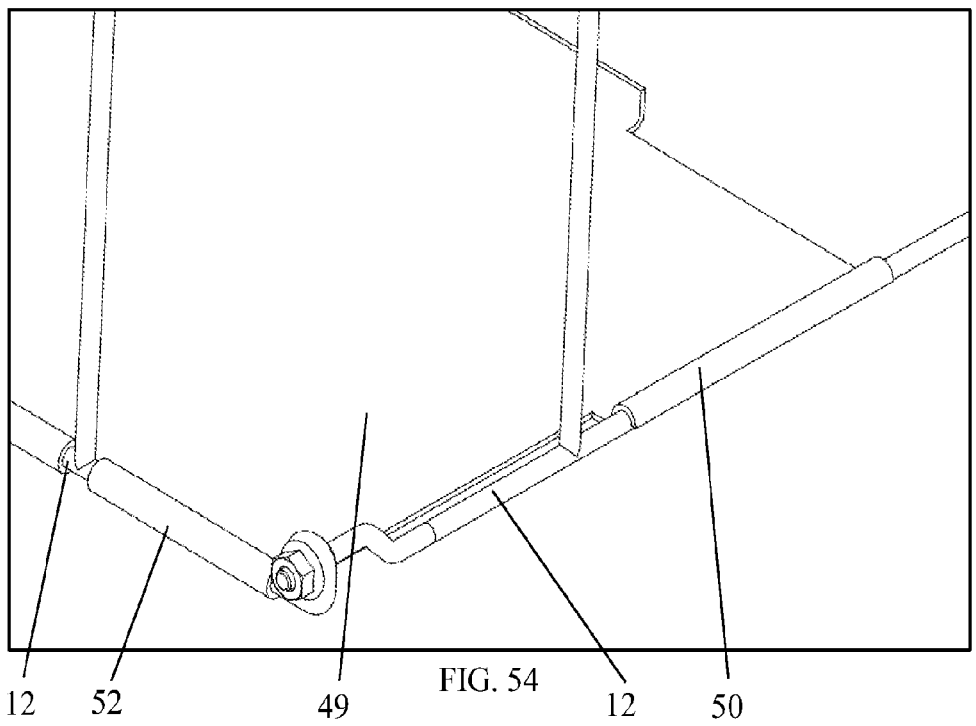
FIG. 54 is a perspective view of a component of an embodiment of the invention.
Figure 55:
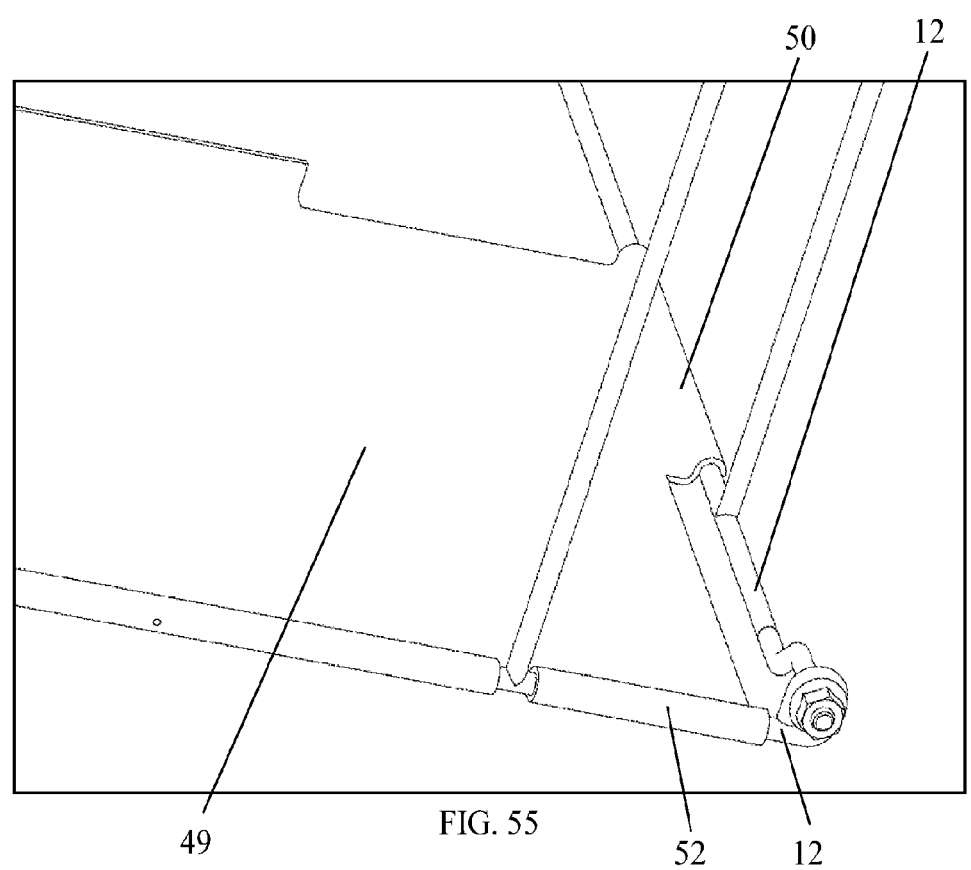
FIG. 55 is a perspective view of a component of an embodiment of the invention.
Figure 56:
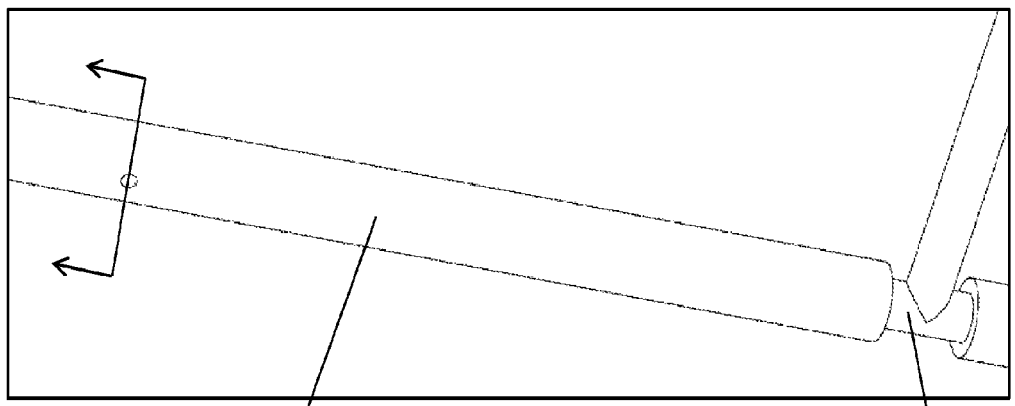
FIG. 56 is a perspective view of a component of an embodiment of the invention.
Figure 57:
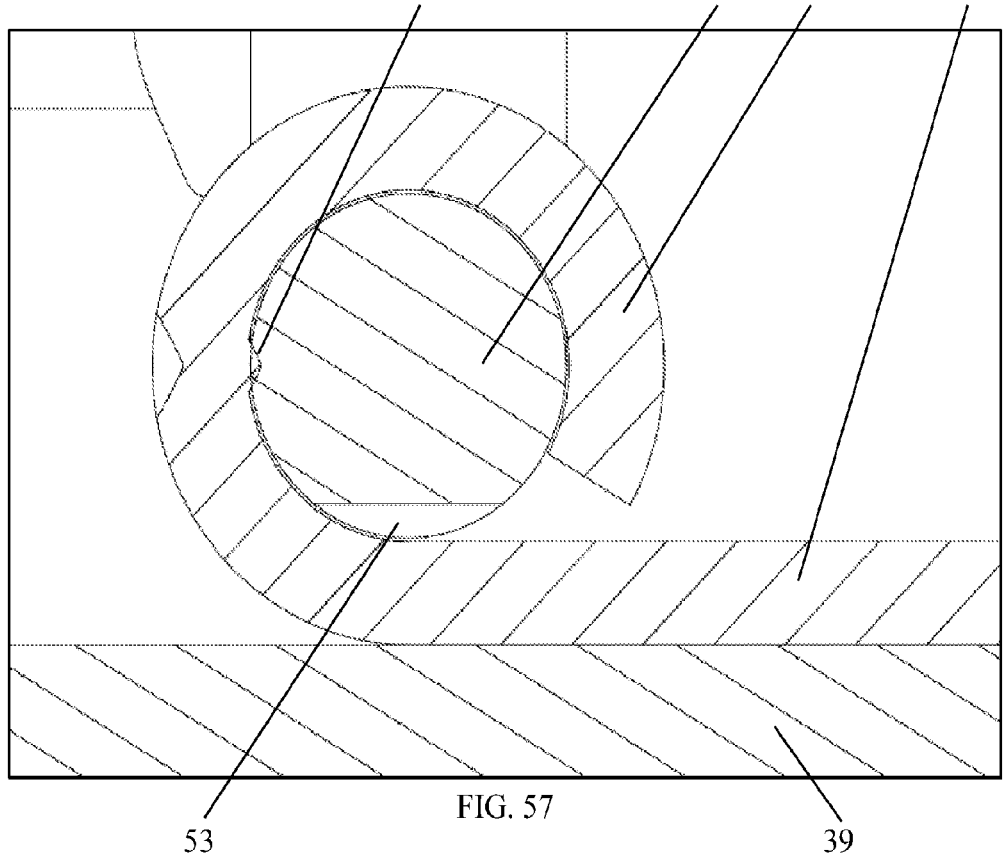
FIG. 57 is a cross-sectional view of a component of an embodiment of the invention.
Figure 58:
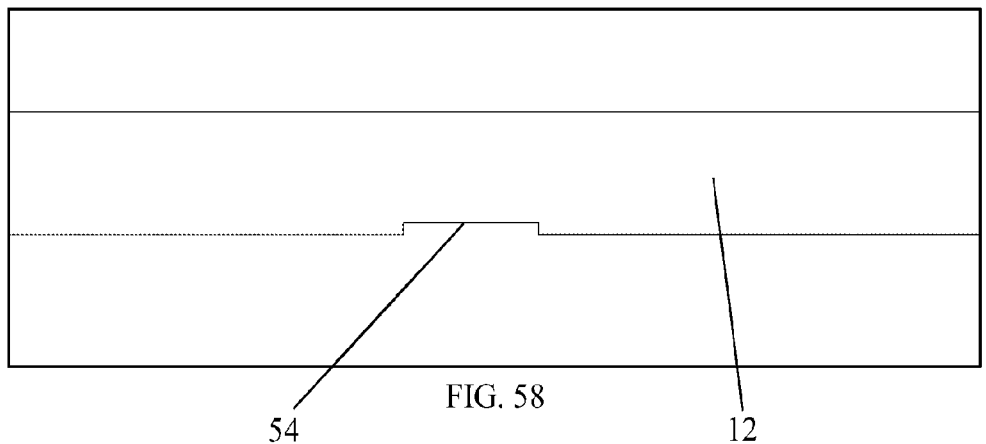
FIG. 58 is a perspective view of a component of an embodiment of the invention.
Figure 59:
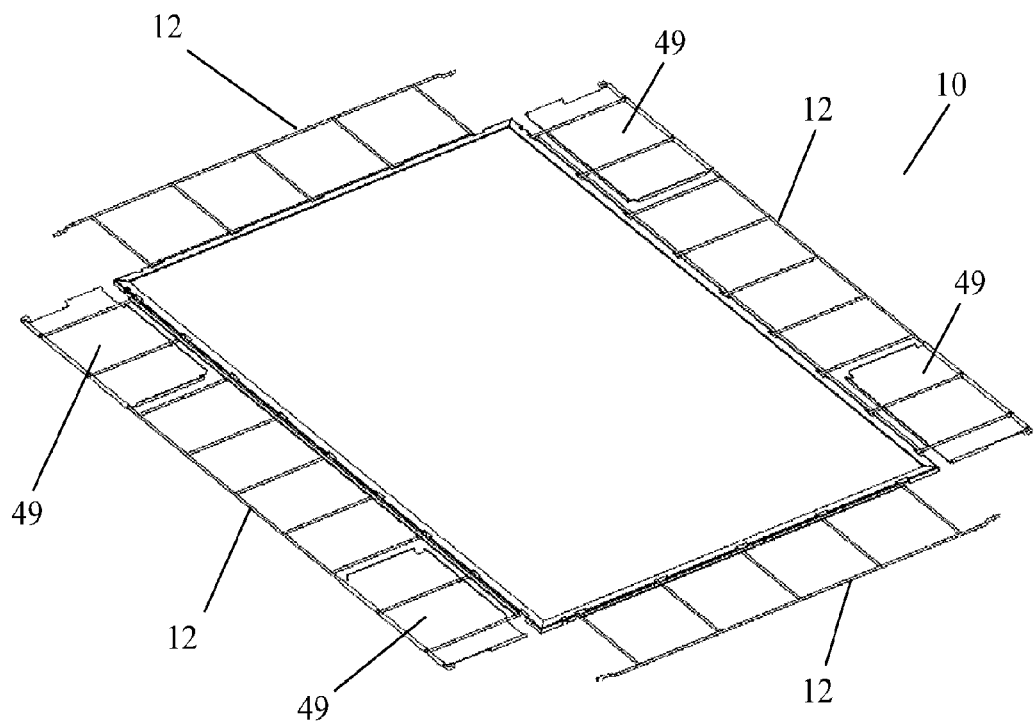
FIG. 59 is a perspective view of an embodiment of the invention.
Figures 60, 61:
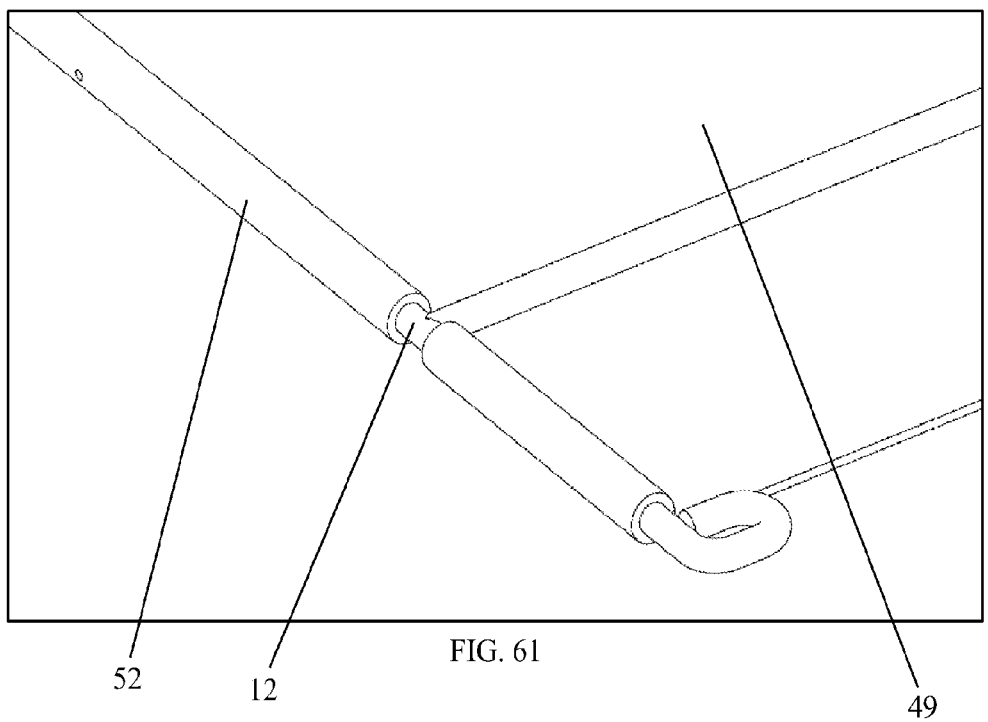
FIG. 60 is a perspective view of an embodiment of the invention.
FIG. 61 is a perspective view of a component of an embodiment of the invention.
Figure 62:
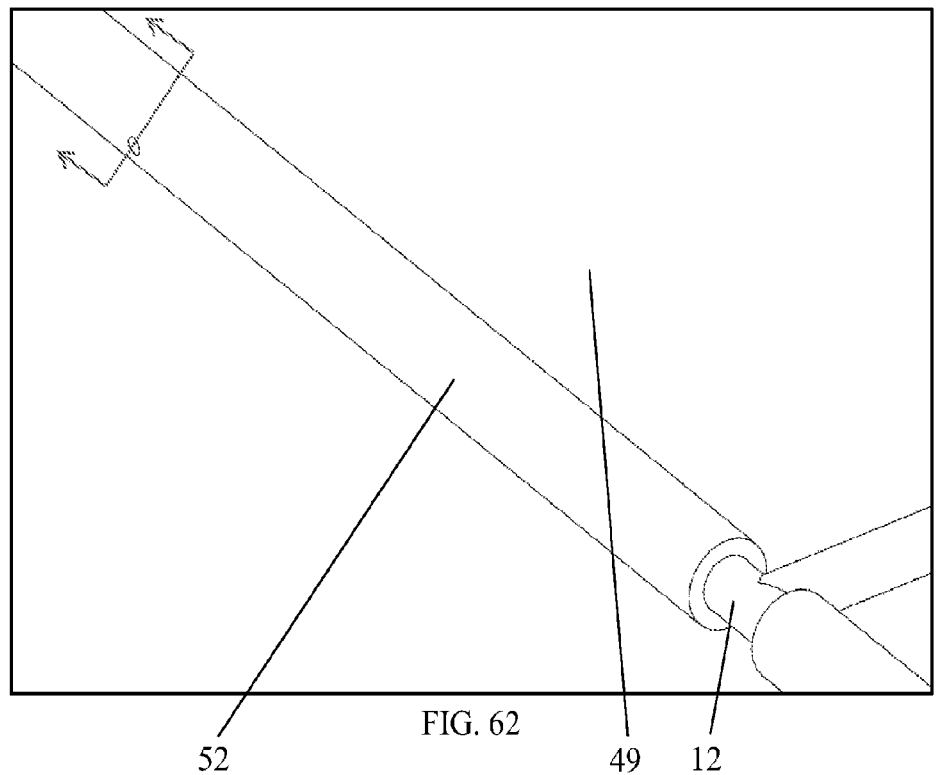
FIG. 62 is a perspective view of a component of an embodiment of the invention.

The Folding Ballast Tray, 49, is folded up in the shipping configuration as shown in FIG. 59. When the Pivot Supports, 12, are folded down, the Folding Ballast Tray, 49, is maneuvered so that the Folding Ballast Tray Support Lip, 50, rests on the adjacent Pivot Support, 12, as shown in FIGS. 53 to 55. The Folding Ballast Tray Retaining Fold, 52, on the Folding Ballast Tray, 49, rotates around the Pivot Support, 12, in FIGS. 53 to 58 and FIGS. 61 to 63.

Figure 63:
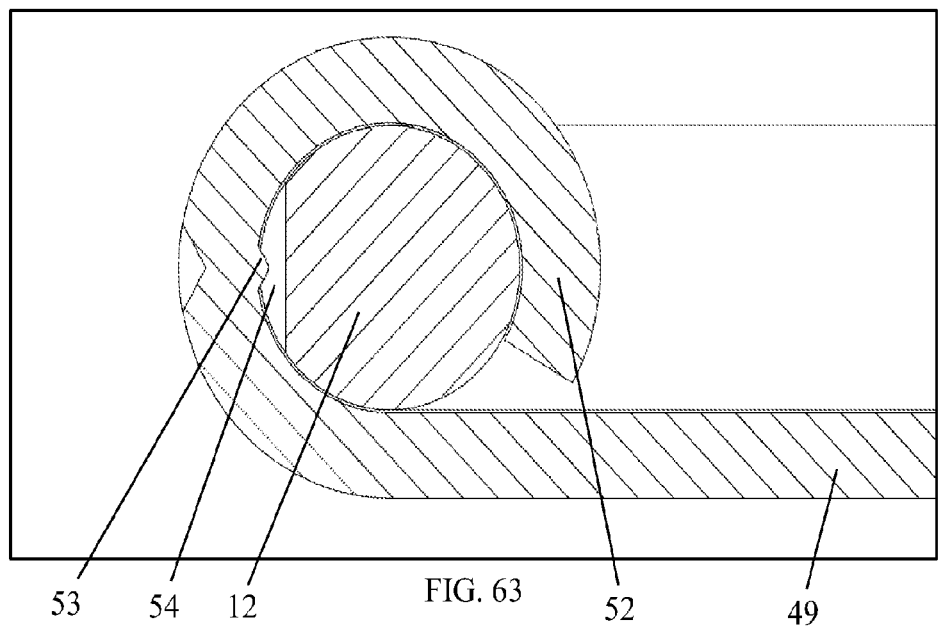
FIG. 63 is a cross-sectional view of a component of an embodiment of the invention.
Figure 64:
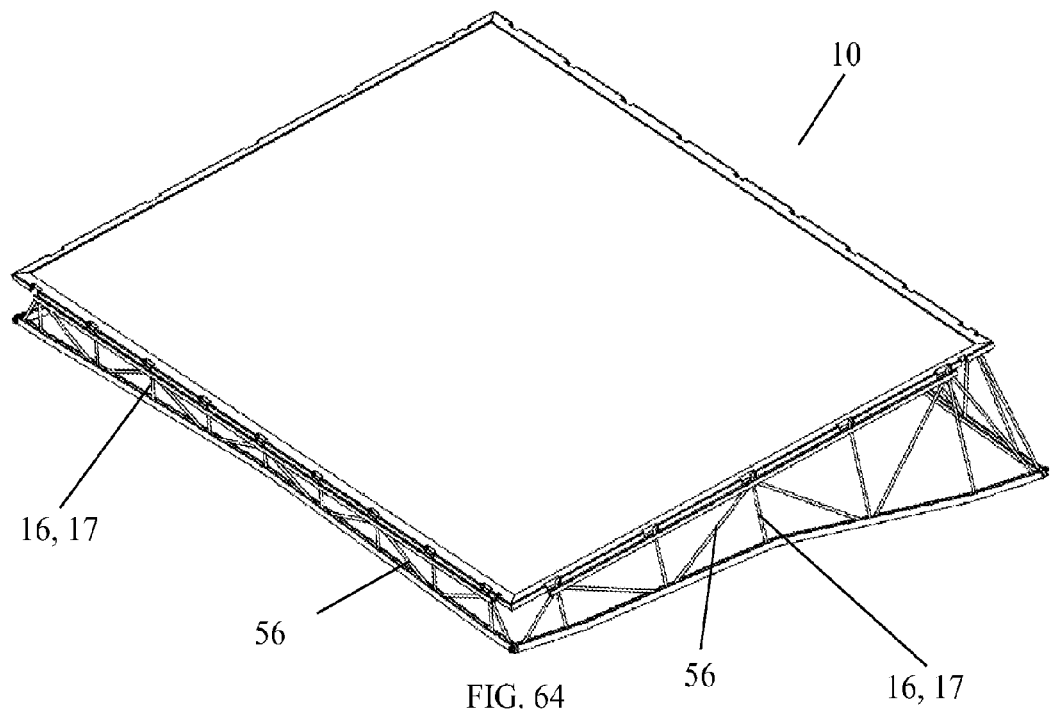
FIG. 64 is a perspective view of an embodiment of the invention.
Figure 65:
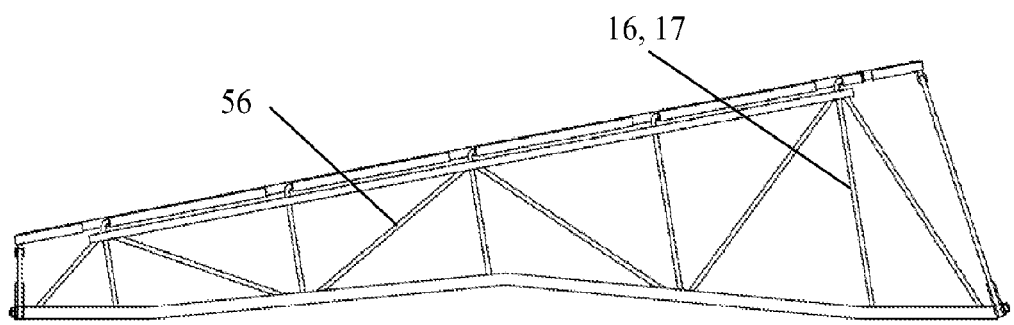
FIG. 65 is a perspective view of an embodiment of the invention.

When the Folding Ballast Tray, 49, is folded up as shown in FIGS. 59 to 63, the Folding Ballast Tray Protrusion, 53, is in the Pivot Support Notch, 54, as shown in the cross section in FIG. 63. The Pivot Support Notch, 54, is also shown in FIG. 58. When the Folding Ballast Tray, 49, is folded down as shown FIGS. 52 to 57, the Folding Ballast Tray Protrusion, 53, is highly compressed against the round section of the Pivot Support, 12, as shown in the cross section in FIG. 57. If the Pivot Support, 12, and the Folding Ballast Tray, 49, are made of conductive metal, then Interference Contact Area, 55, will create good electrical ground path between the Pivot Support, 12, and the Folding Ballast Tray, 49.

Another way to create an electrical bond, would be to create a thread shape like the Biting Pivot Rod, 16, on the bottom of the Pivot Support, 12, so the threads would cut into the oval formed Folding Ballast Tray Retaining Fold, 52.

The creation of a good electrical bond should not be limited to the 2 methods mentioned. The electrical bond and the Interference Contact Area, 55, may be created when the Folding Ballast Tray, 49, is rotated down to the position to accept the Ballast, 47.

It should be noted, that this same Interference Contact Area, 55, could be used for the Short Horizontal Connector, 35, the Long Horizontal Connector, 36, and the Short Vertical Connector, 42.

Figures to 64-110 show some of Pivot Supports, 12, are not perpendicular to the Solar Panels, 10. The Pivot Rods, 17, and Biting Pivot Rods, 16, are shown as before. Some other differences will be described further.

FIGS. 64 to 110 show Pivot Supports, 12, that are stronger than previously shown. Additional Cross Rods, 56, are added to the Pivot Supports, 12, in FIGS. 64 to 72 and FIGS. 98 to 110. Solid sides in the Pivot Supports, 12, are shown in FIGS. 86 to 97. Solid sides aid in reducing the aerodynamic lift during high winds on these slanted Solar Panels, 10. Slanted Pivot Supports, 12, in the low and high side of the Solar Panel, 10, help also.

Figure 69:
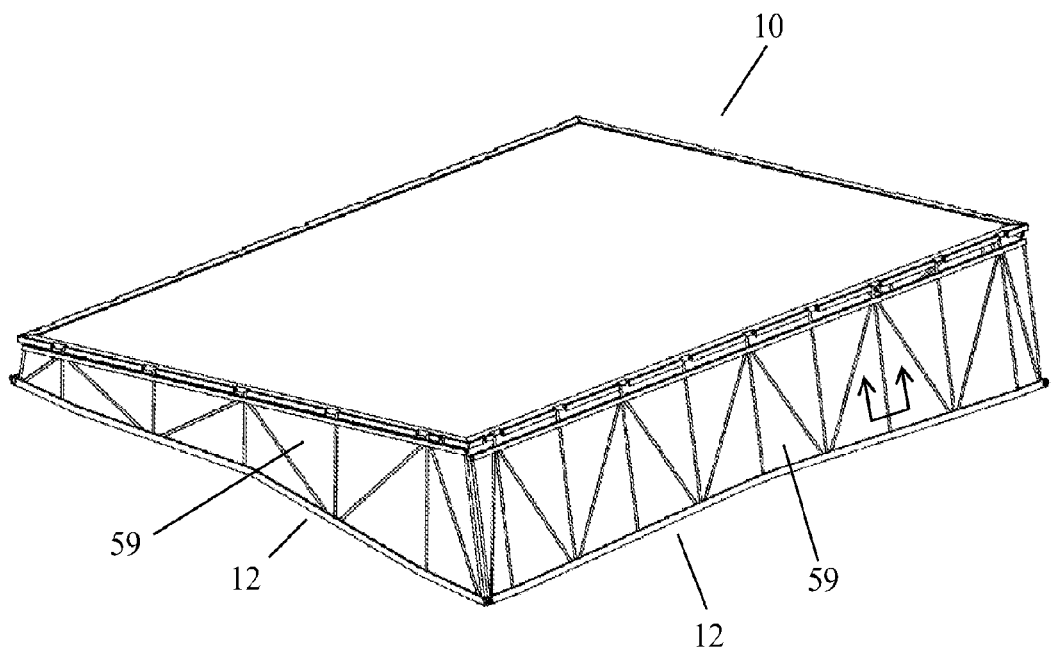
FIG. 69 is a perspective view of an embodiment of the invention.
Figure 70:
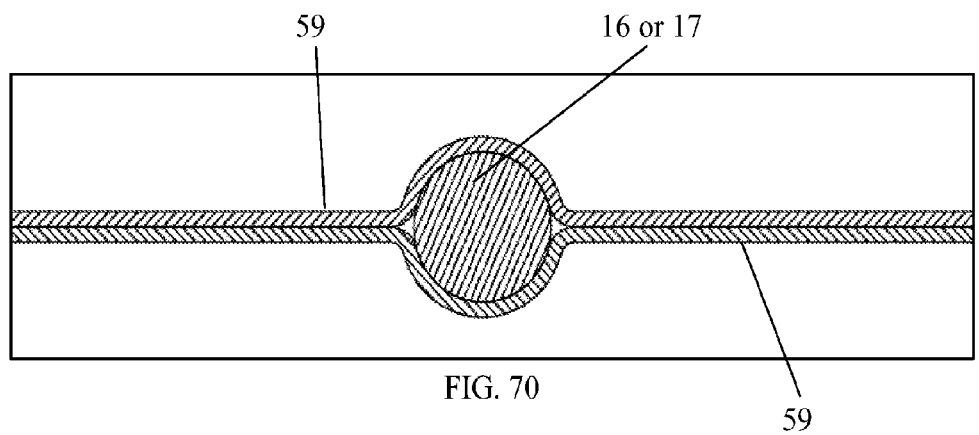
FIG. 70 is a cross-sectional view of a component of an embodiment of the invention.
Figure 71:
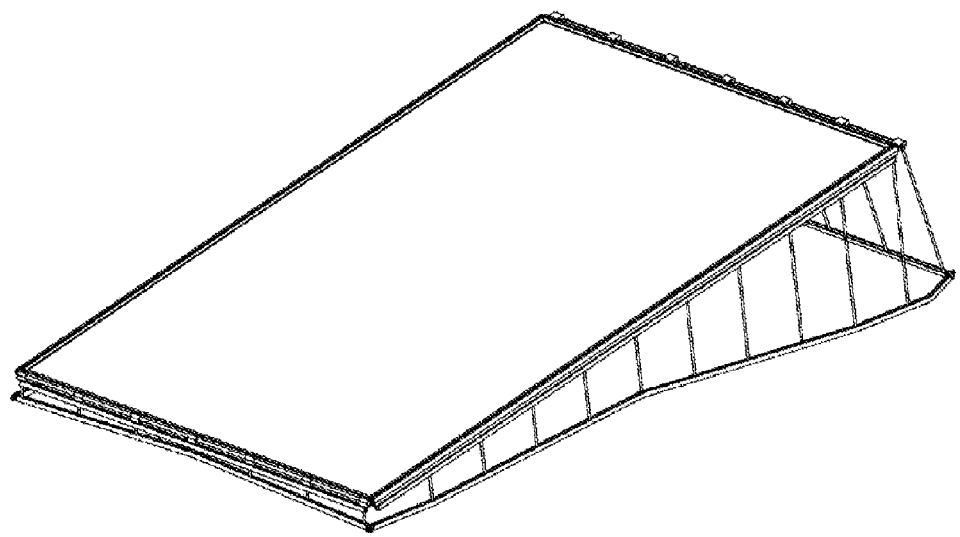
FIG. 71 is a perspective view of an embodiment of the invention.
Figure 72:
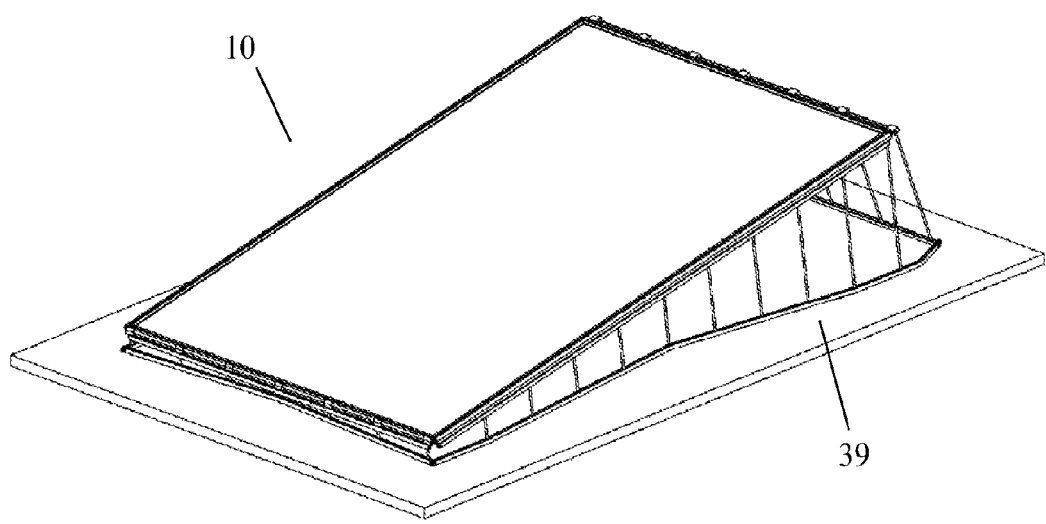
FIG. 72 is a perspective view of an embodiment of the invention.
Figure 73:
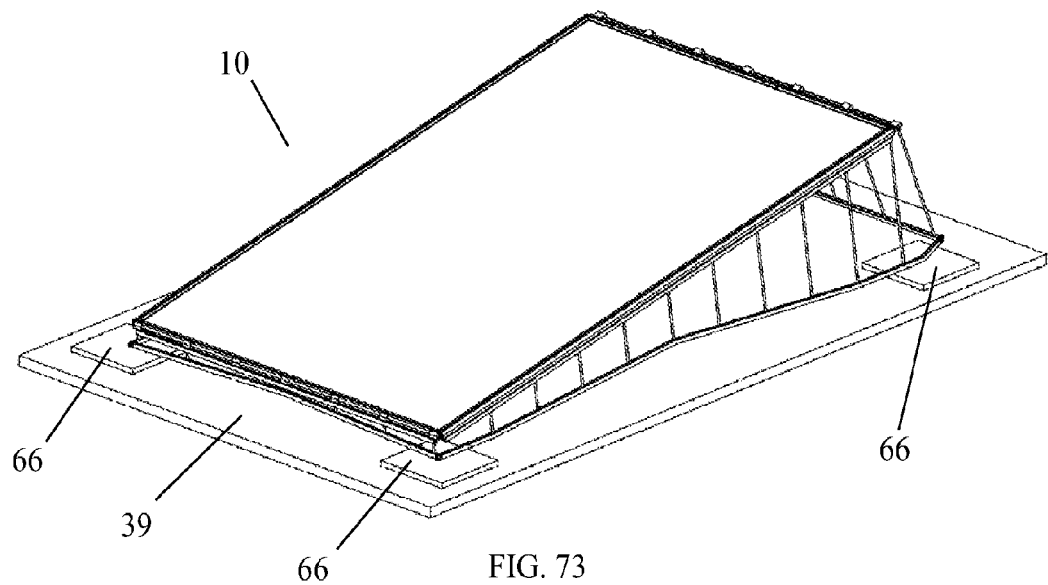
FIG. 73 is a perspective view of an embodiment of the invention.
Figure 74:
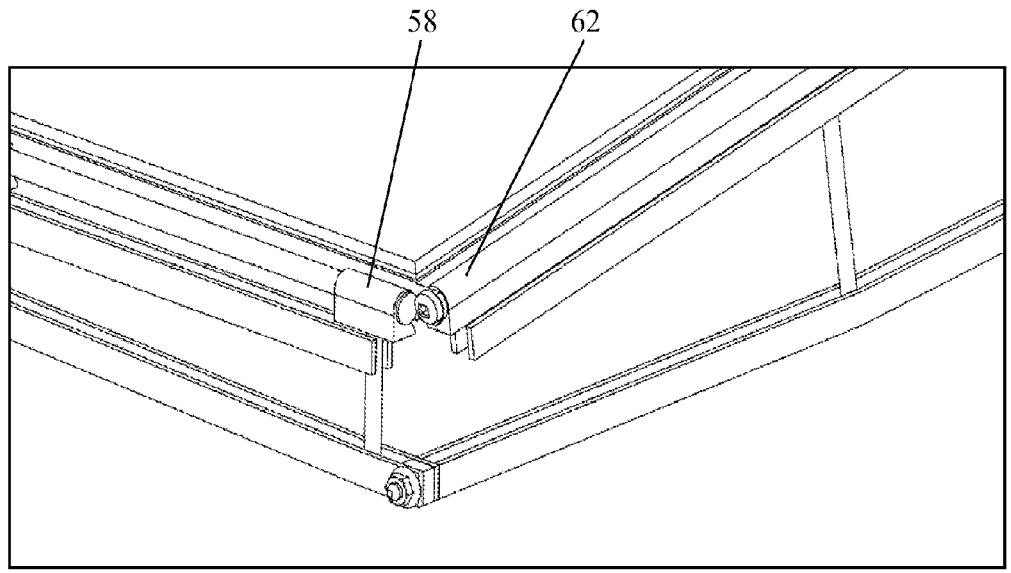
FIG. 74 is a perspective view of a component of an embodiment of the invention.

FIGS. 69 and 70 show a Plastic Film, 59, bonded to the Panel Supports, 12. A layer of Plastic Film, 59, is on each side of the Pivot Support, 12, and both sides of the Plastic Film, 59, is bonded to each other with the Pivot Support, 12, sandwiched in the middle. FIG. 70 shows a typical cross section of small part of the Pivot Support, 12.

Figure 66:
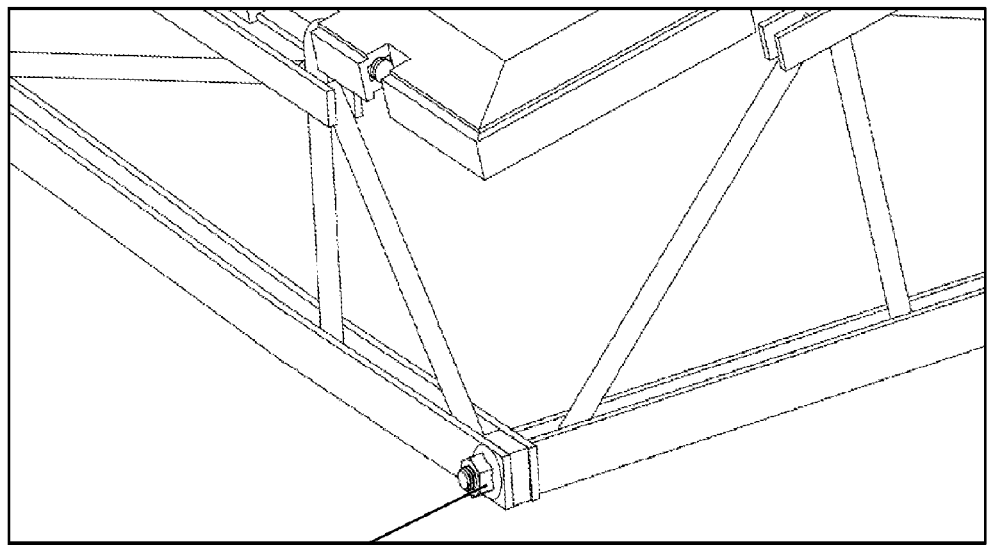
FIG. 66 is a perspective view of a component of an embodiment of the invention.
Figure 67:
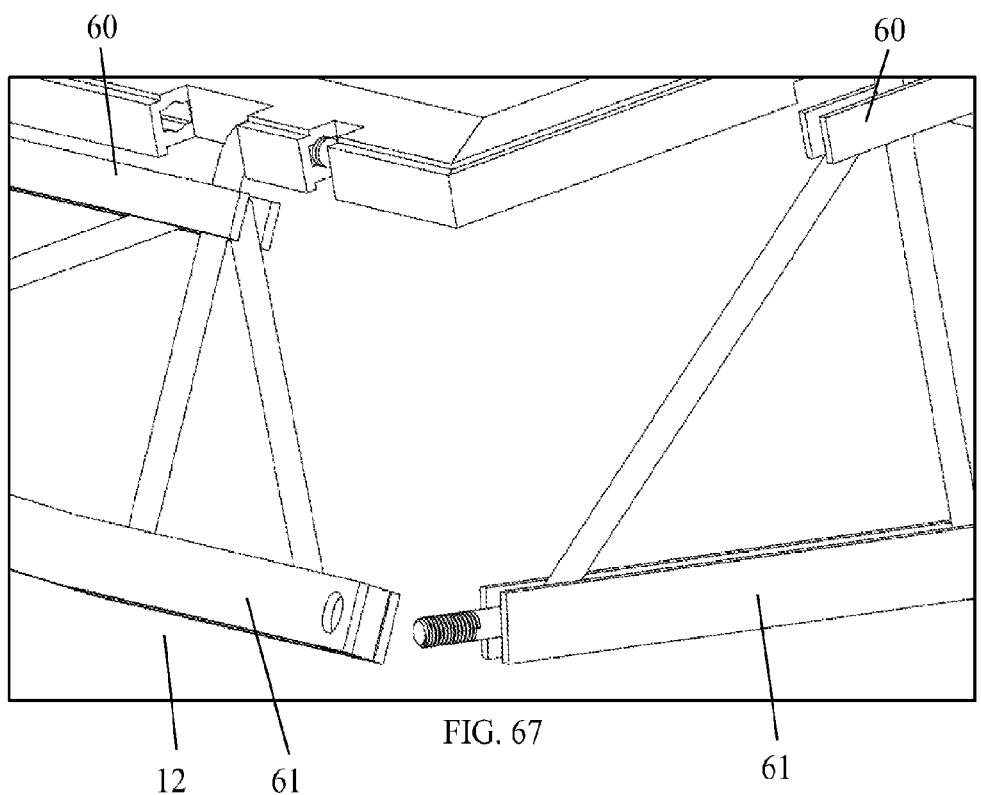
FIG. 67 is a perspective view of a component of an embodiment of the invention.

FIGS. 66 and 67 show a slight variation of the Pivot Support, 12, and shows how the adjacent Pivot Supports, 12, are attached with the Support Nut, 13. Notice that the Pivot Support Top Beam, 60, and the Pivot Support Bottom Beam, 61, are larger which makes the Pivot Support, 12, Stronger.

Figure 68:
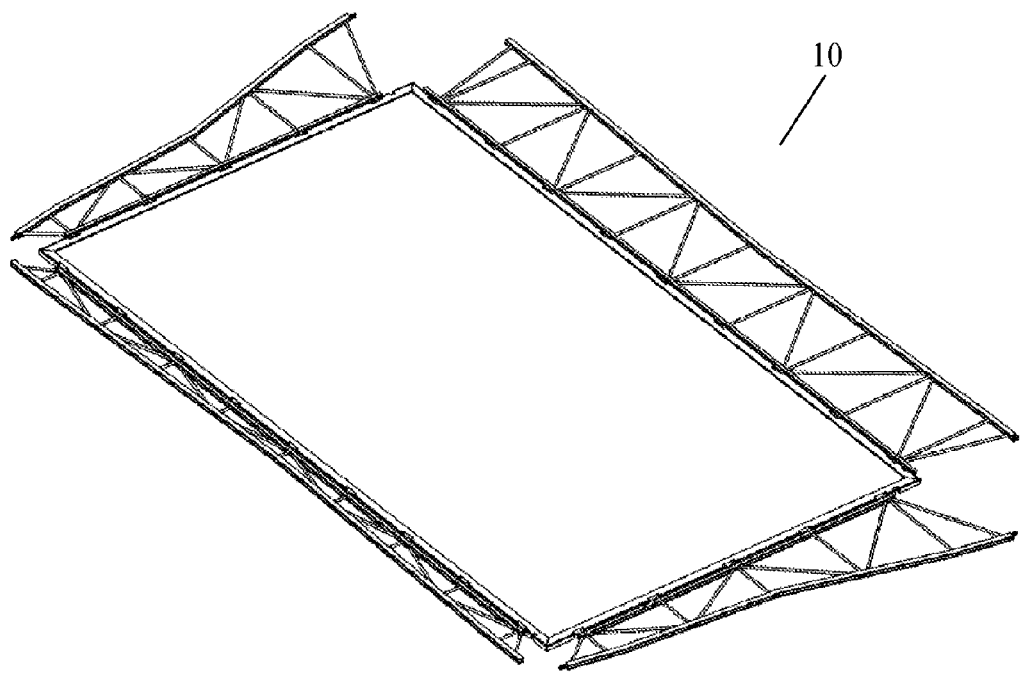
FIG. 68 is a perspective view of an embodiment of the invention.

FIG. 68 shows the Solar Panel, 10 ready to be stacked prior to packaging for warehousing or shipping.

FIGS. 71 to 97 show Inside Pivot Frame, 63. This can be seen more clearly in FIGS. 78 and 79.

The Pivot Support, 12 can have Offset Segmented Outside Pivot Support Tops, 57, Segmented Outside Pivot Support Tops, 58, and Continuous Outside Pivot Support Tops, 62. See FIGS. 74 to 97 for more detail. Any Pivot Support, 12, can be interchanged with the different outside pivot Support top types. One is better than the other depending of the type of design and application. Shown are the most common types for the Solar Panel, 10.

Figure 75:
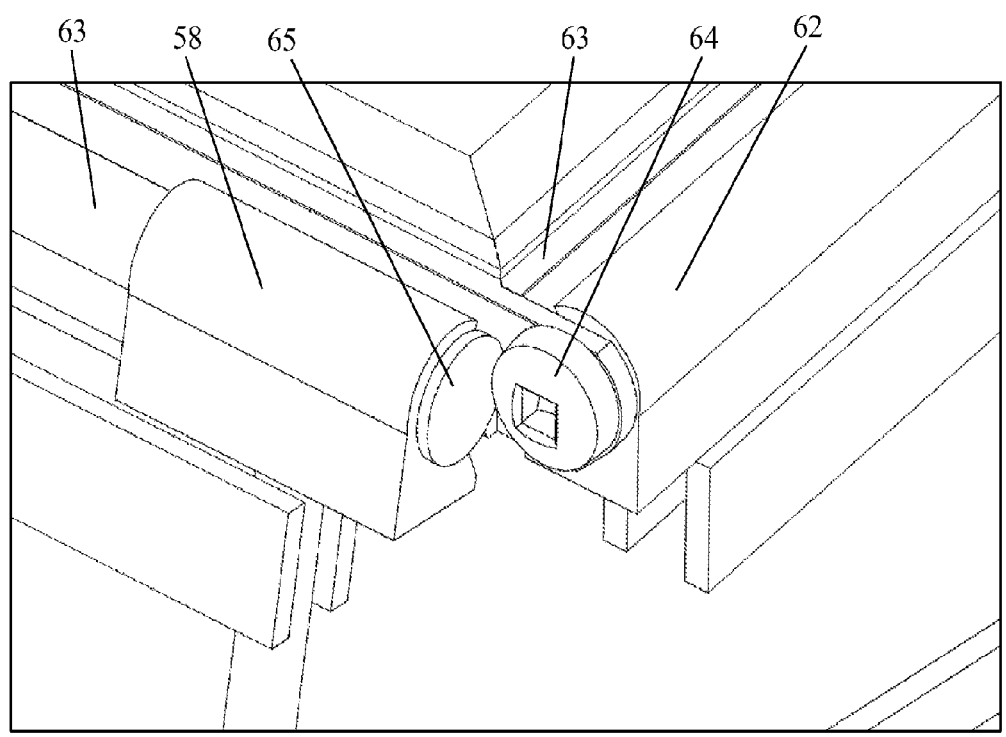
FIG. 75 is a perspective view of a component of an embodiment of the invention.
Figure 76:
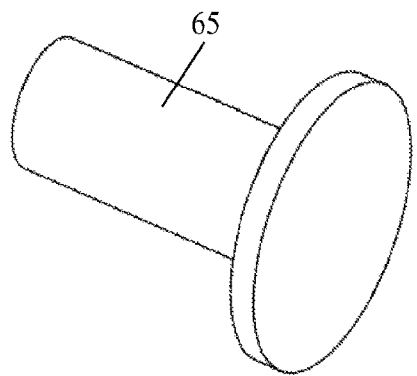
FIG. 76 is a perspective view of a component of an embodiment of the invention.
Figure 77:
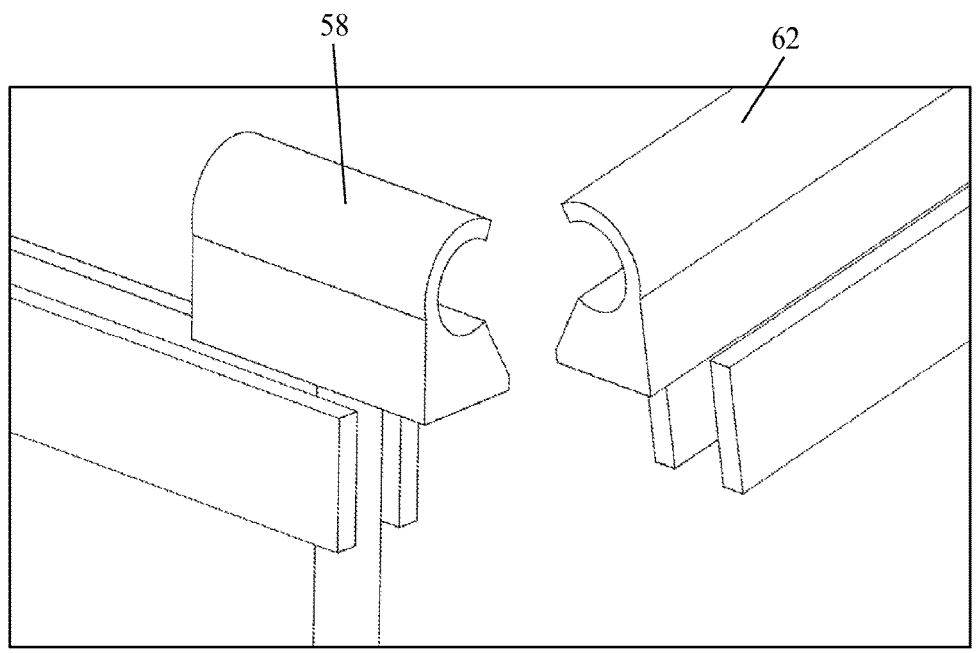
FIG. 77 is a perspective view of a component of an embodiment of the invention.
Figure 78:
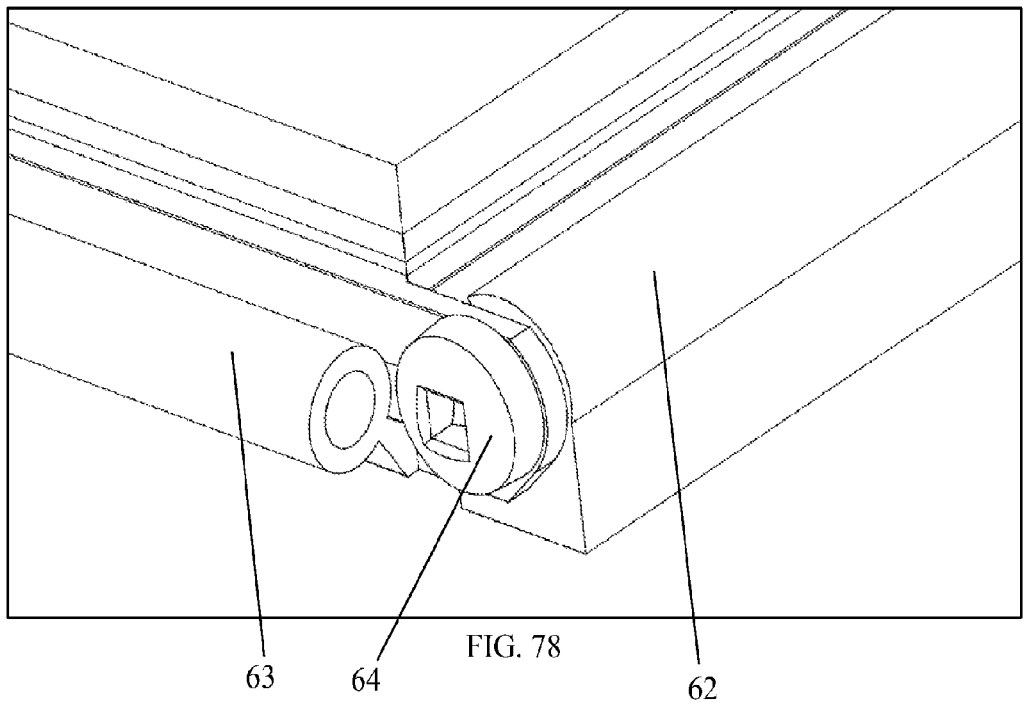
FIG. 78 is a perspective view of a component of an embodiment of the invention.
Figure 79:
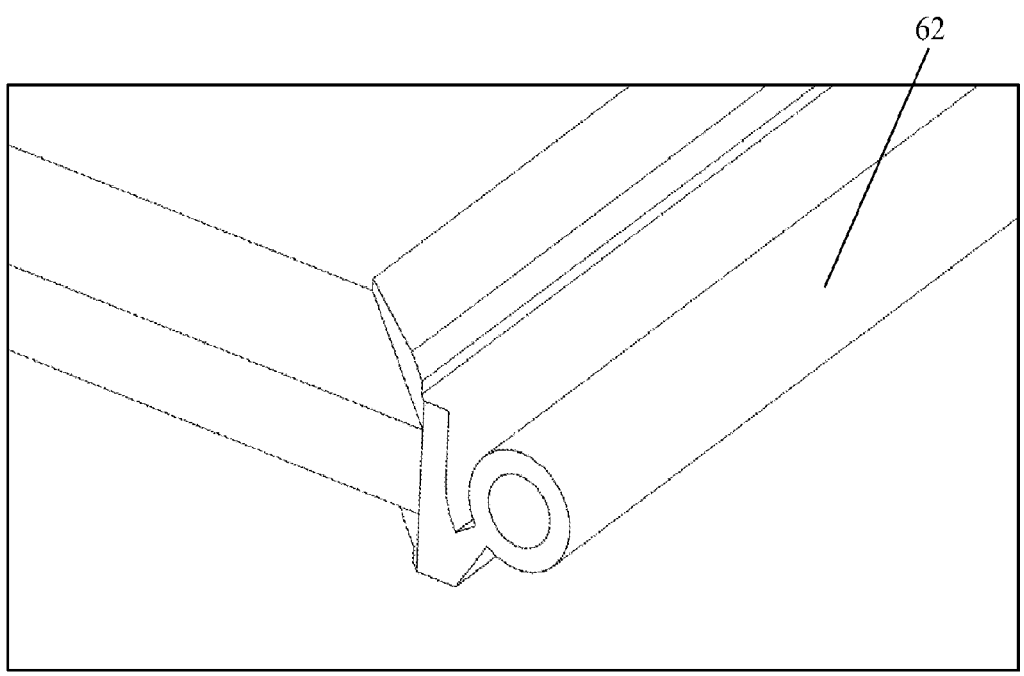
FIG. 79 is a perspective view of a component of an embodiment of the invention.
Figure 80:
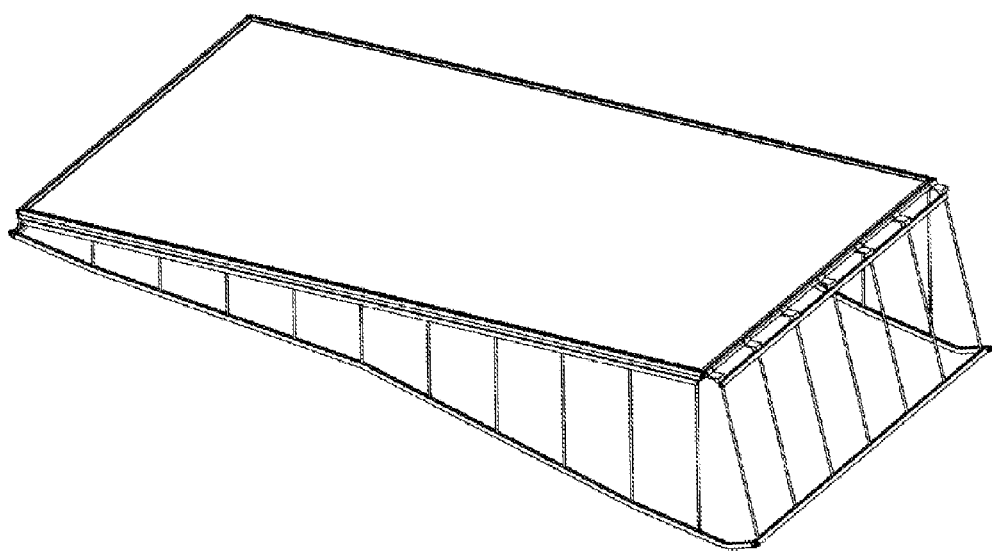
FIG. 80 is a perspective view of an embodiment of the invention.
Figure 81:
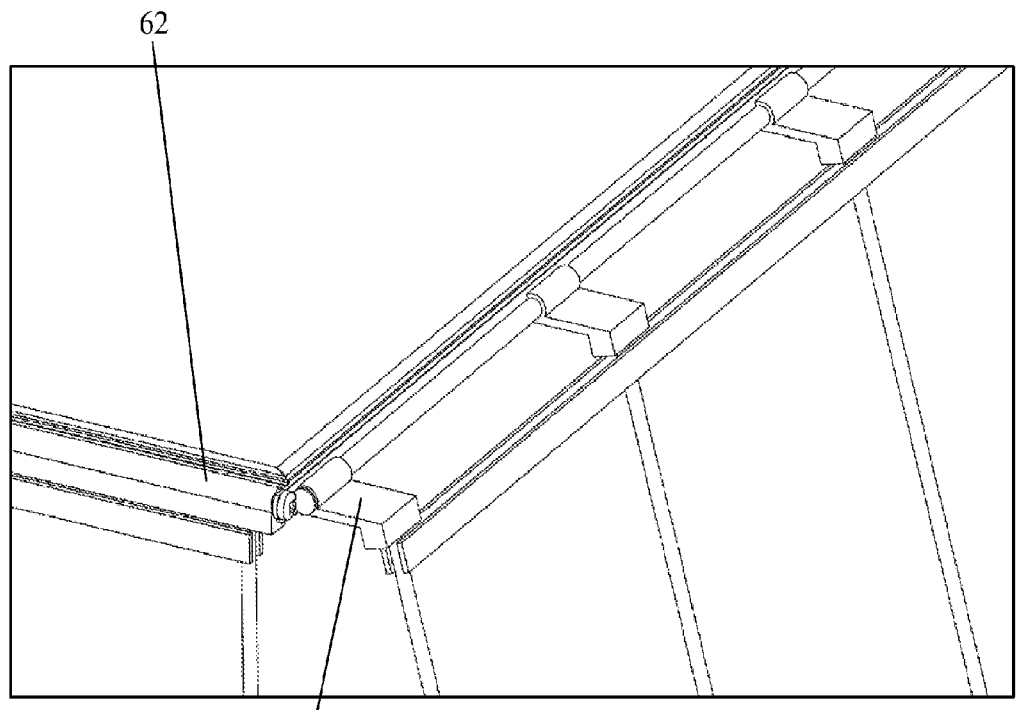
FIG. 81 is a perspective view of a component of an embodiment of the invention.
Figure 82:
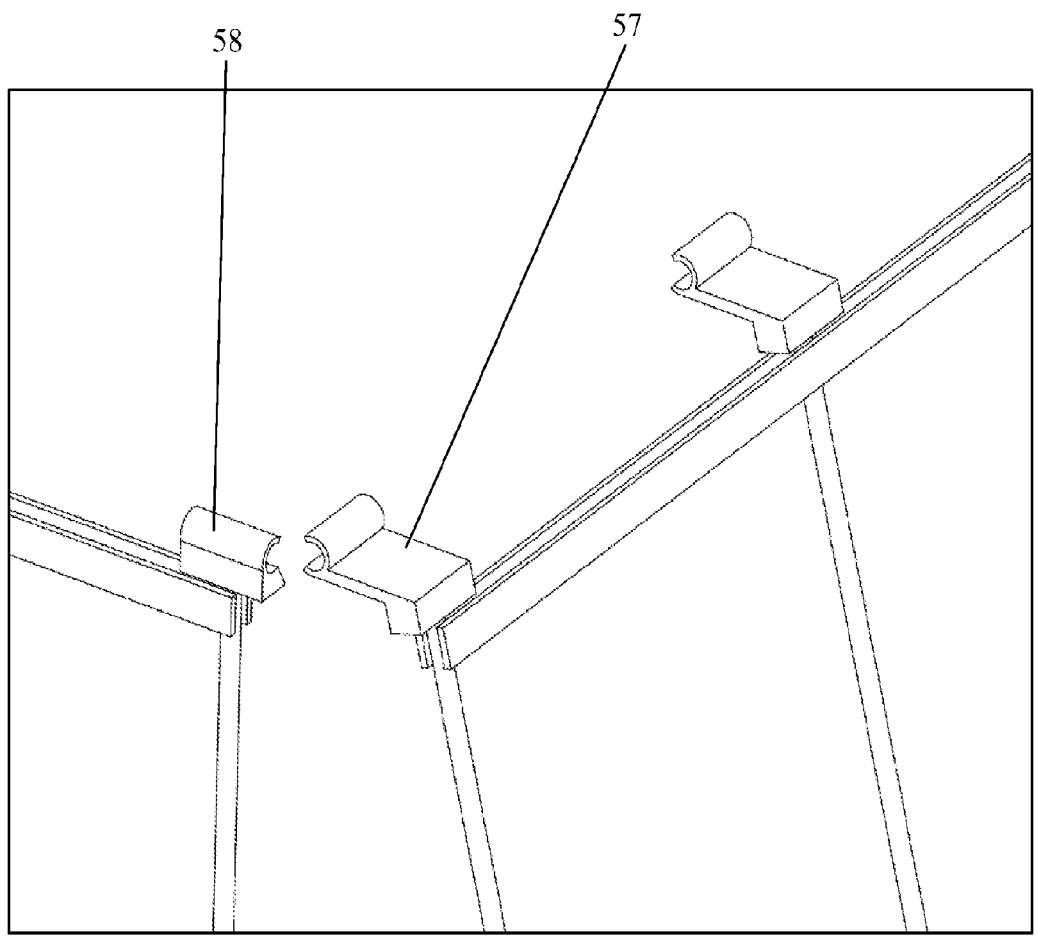
FIG. 82 is a perspective view of a component of an embodiment of the invention.

Adjacent inside Pivot Frames, 63, are joined together with a Frame Screw, 64, as shown in FIG. 75. The head of the Frame Screw, 64, holds in the Retaining Plug, 65, as shown in FIGS. 75 and 76. The Retaining Plug, 65, holds the adjacent Segmented Outside Pivot Support Top, 58. It could also hold the Offset Segmented Outside Pivot Support Top, 57, or the Continuous Outside Pivot Support Top, 62.

Figure 83:
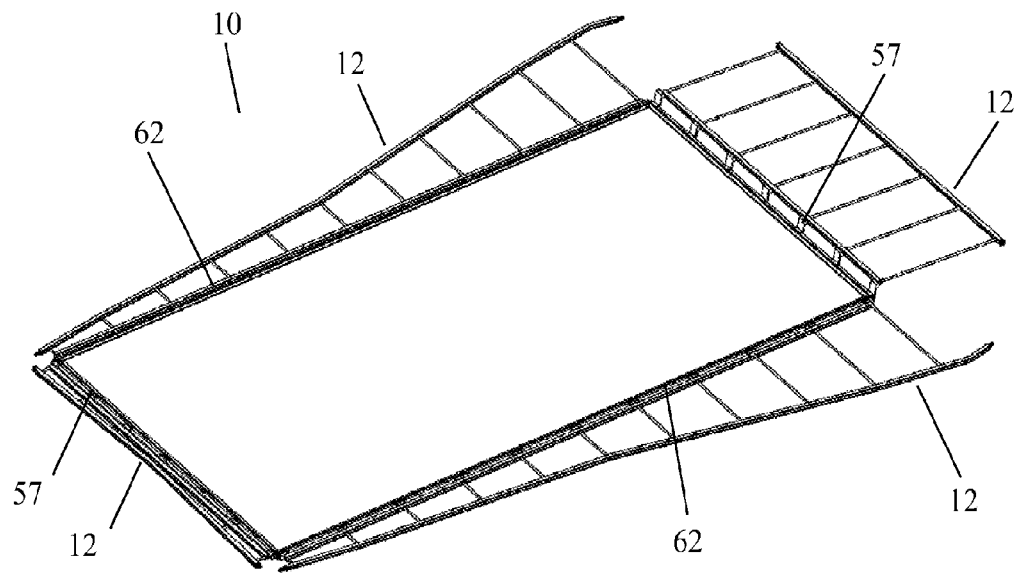
FIG. 83 is a perspective view of an embodiment of the invention.
Figure 84:
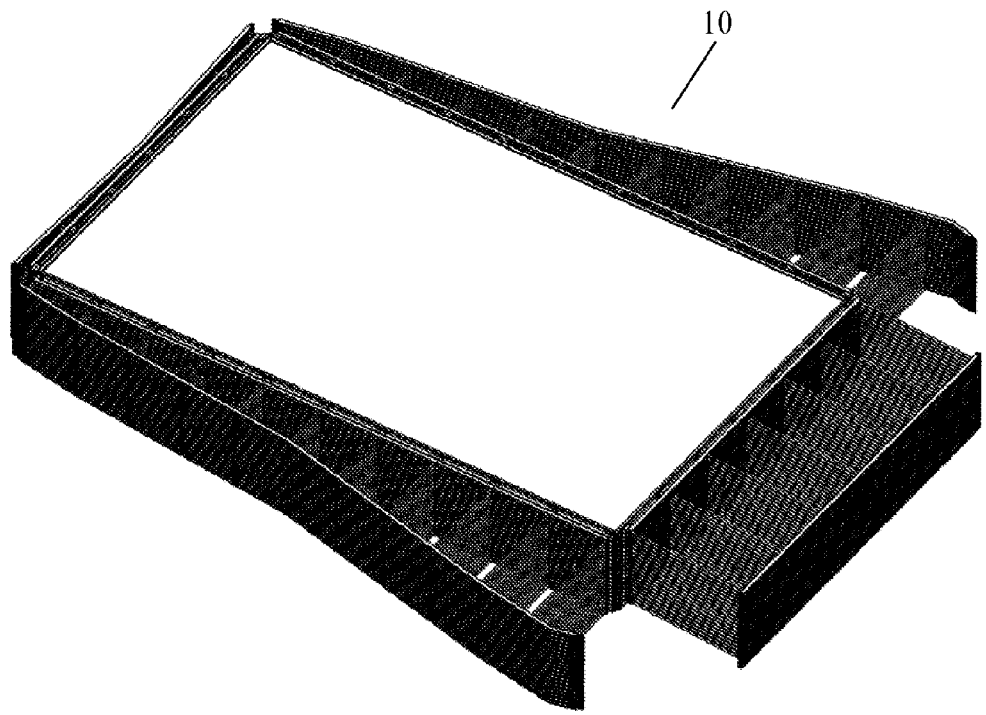
FIG. 84 is a perspective view of an embodiment of the invention.
Figure 85:
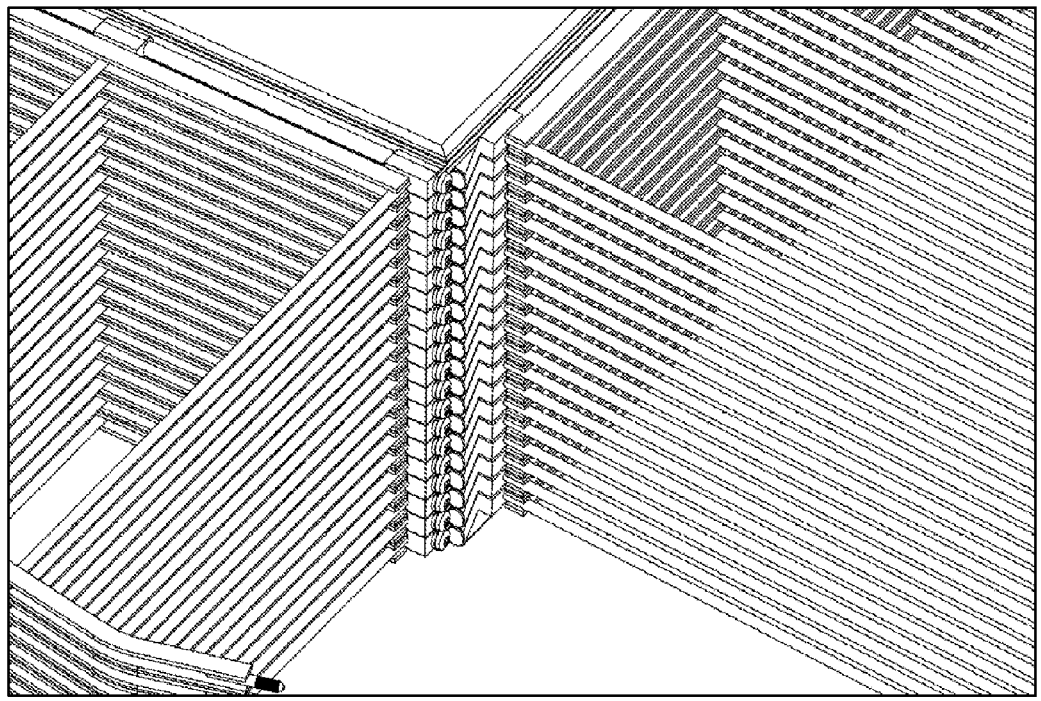
FIG. 85 is a perspective view of a component of an embodiment of the invention.
Figure 86:
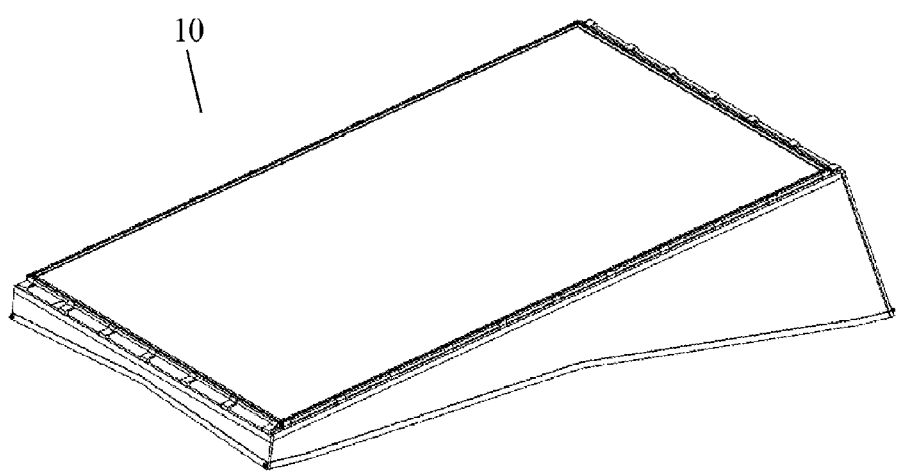
FIG. 86 is a perspective view of an embodiment of the invention.
Figure 87:
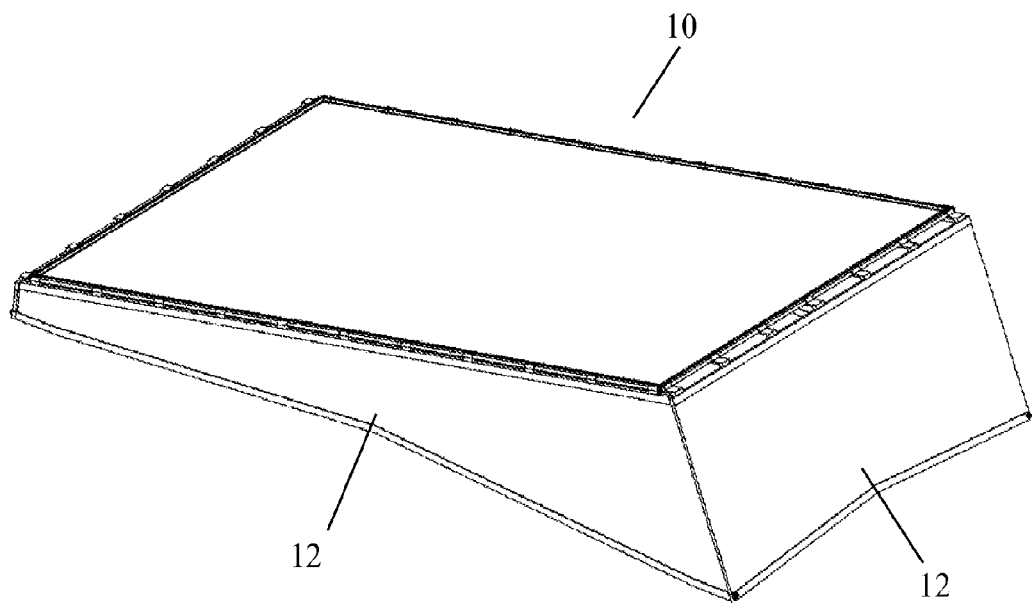
FIG. 87 is a perspective view of an embodiment of the invention.
Figure 88:
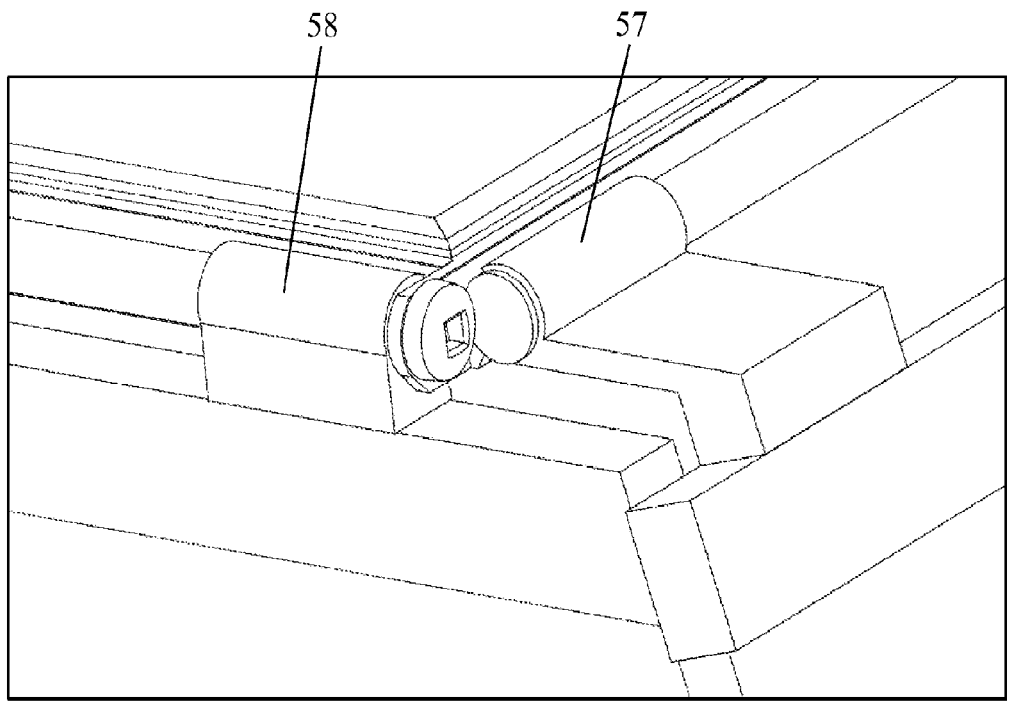
FIG. 88 is a perspective view of a component of an embodiment of the invention.
Figure 89:
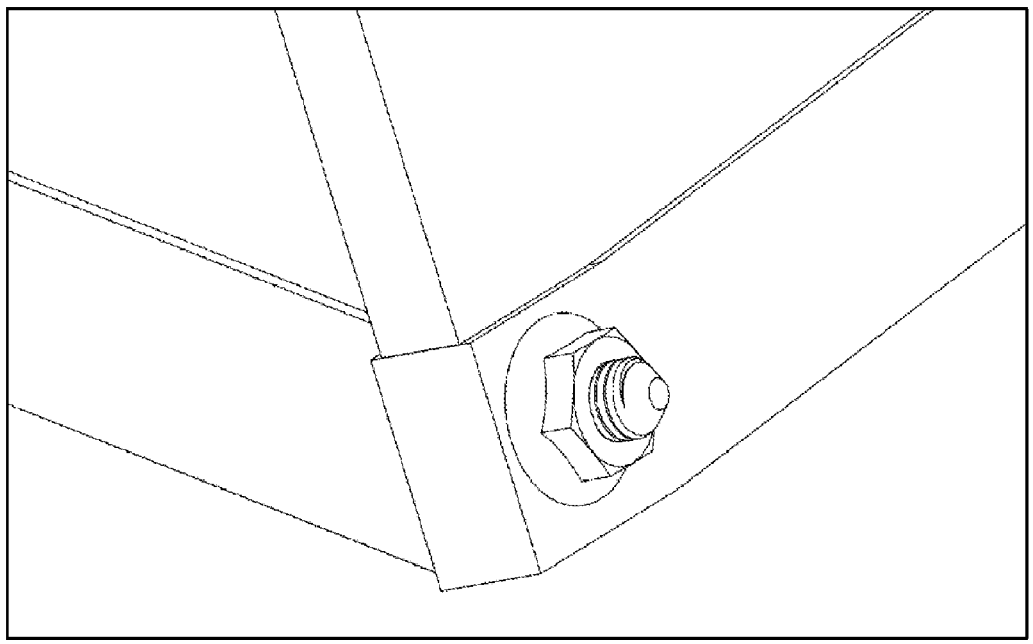
FIG. 89 is a perspective view of a component of an embodiment of the invention.
Figure 90:
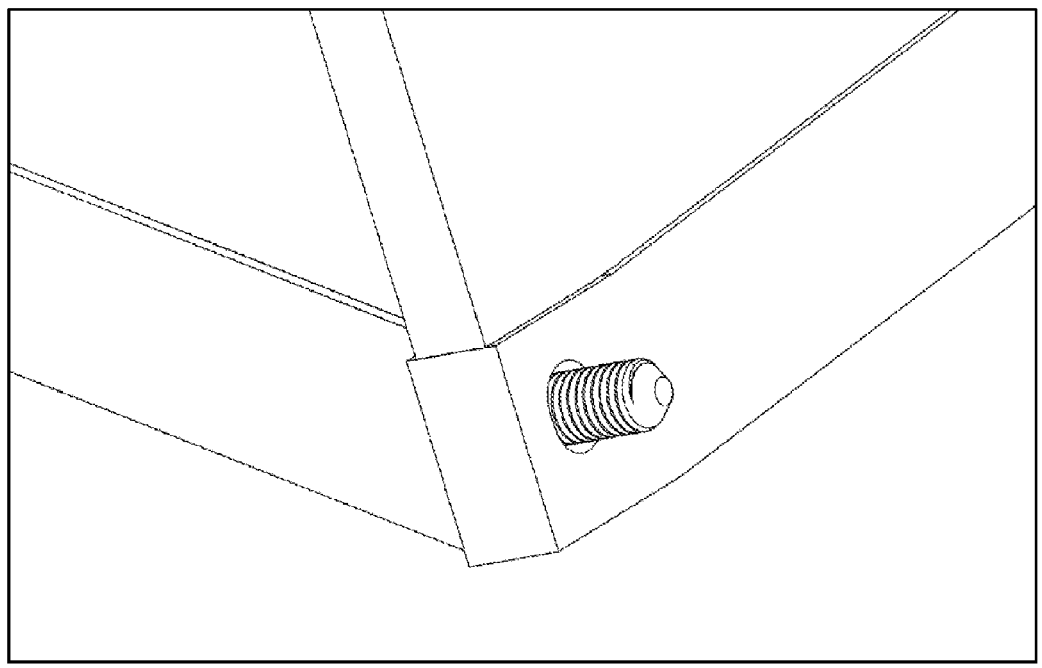
FIG. 90 is a perspective view of a component of an embodiment of the invention.

FIG. 83 shows a Solar Panel, 10, with Continuous Outside Pivot Support Top, 62, and Offset Segmented Outside Pivot Support Top, 57, with the Pivot Supports, 12, in an up position. FIGS. 84 and 85 show how the Solar Panel 10 would look with these Solar Panels, 10, stacked.

Figure 91:
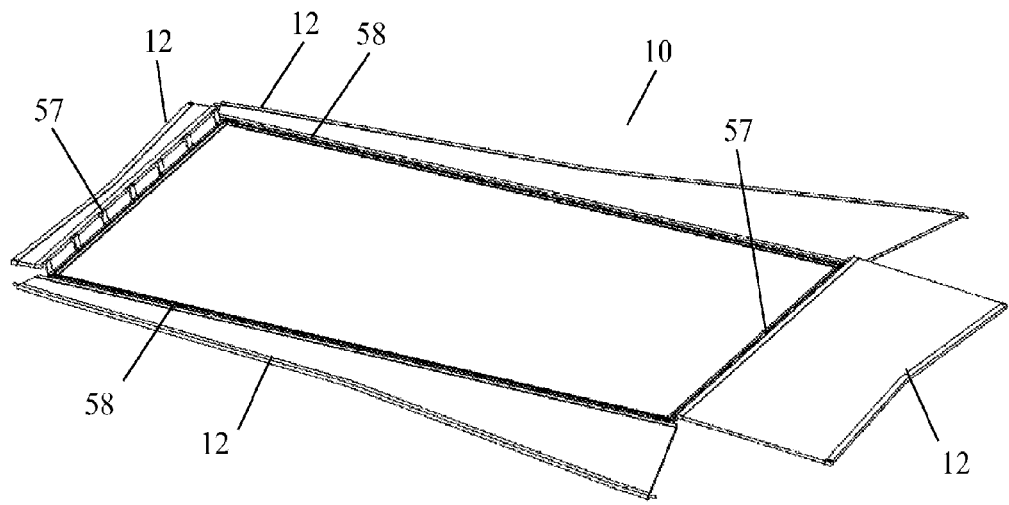
FIG. 91 is a perspective view of an embodiment of the invention.
Figure 92:
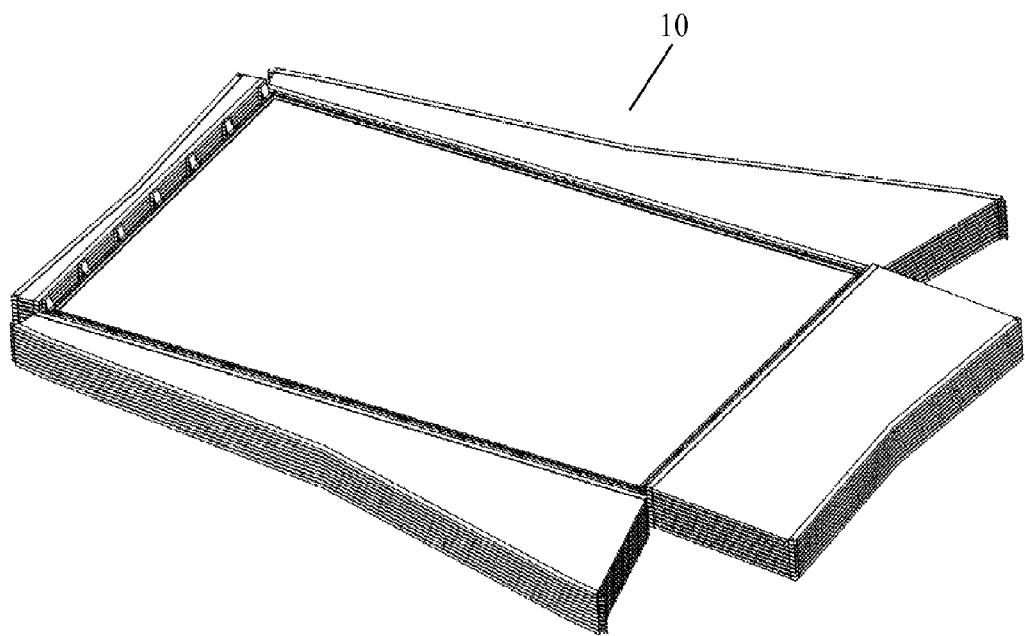
FIG. 92 is a perspective view of an embodiment of the invention.

FIG. 91 shows a Solar Panel, 10, with Segmented Outside Pivot Support Top, 58, and Offset Segmented Outside Pivot Support Top, 57, with the solid Pivot Supports, 12, in an up position. FIG. 92 to shows how the Solar Panel 10 would look with these Solar Panels, 10, stacked.

Offset Segmented Outside Pivot Support Top, 57, Segmented Outside Pivot Support Top, 58, and Continuous Outside Pivot Support Top, 62, grip the Inside Pivot Frame, 63, with a C grip. This allows these Outside Pivot Supports to pivot around the Inside Pivot Frame, 63, to allow rotation from packaging location to final assembly location. See FIGS. 77 to 79 and FIG. 81.

The Solar Panel, 10, can be placed directly on the Surface, 39, or on as Intermediate Structure, 70, and the Intermediate Structure, 70, would contact the Surface, 39. The Intermediate Structure, 70 may be but not limited to a mount, solar panel spacer, foot, pad, or solar racking. See FIGS. 72 and 73.

FIGS. 86 to 97 show the Solar Panel, 10 with solid Pivot Supports, 12. The solid can be but is not limited to wavy sheet, composite, hollow core, honeycomb, foam sheet, lamination, plastic or lightweight solid.

Figure 93:
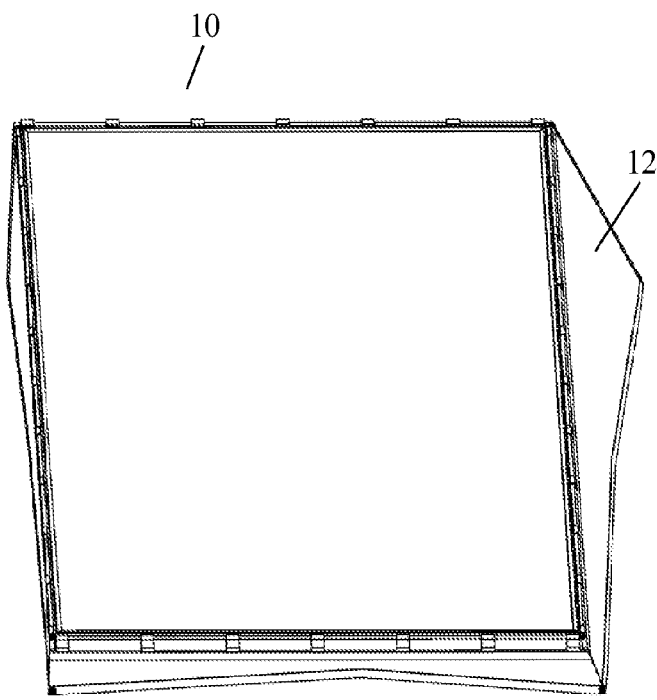
FIG. 93 is a perspective view of an embodiment of the invention.
Figure 94:
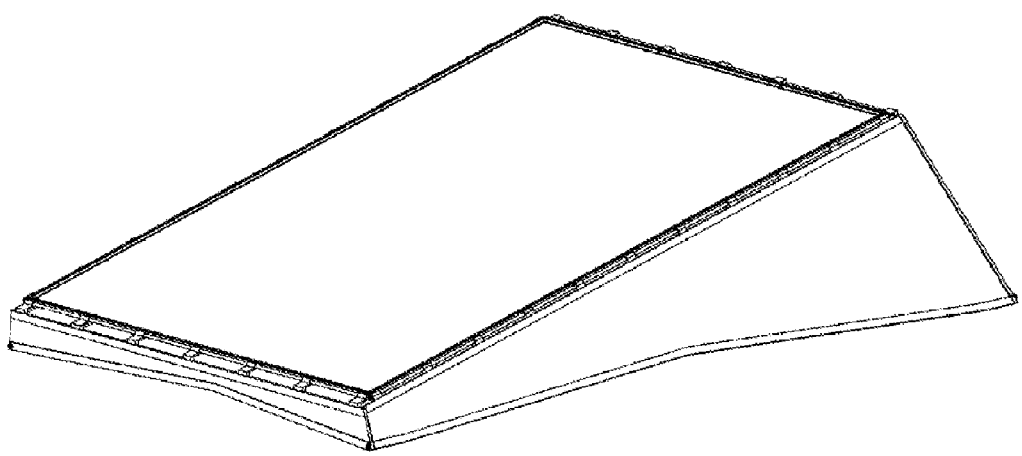
FIG. 94 is a perspective view of an embodiment of the invention.
Figure 95:
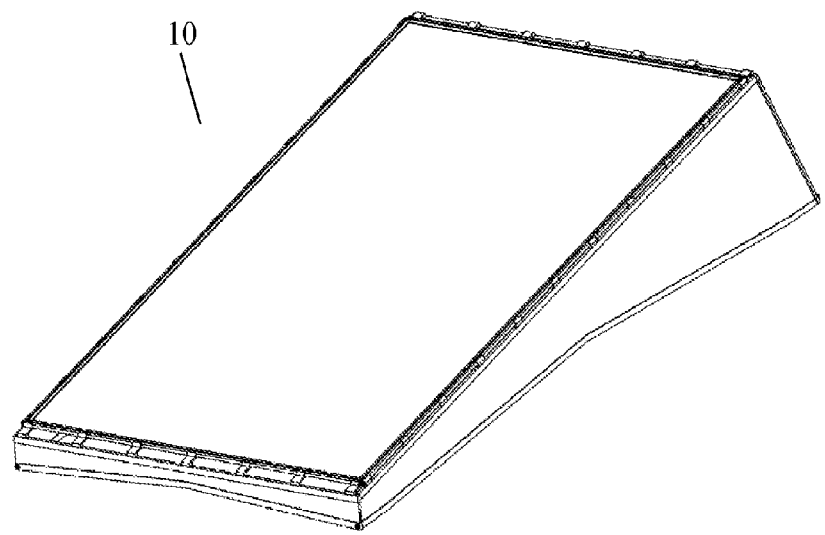
FIG. 95 is a perspective view of an embodiment of the invention.

FIG. 93 shows a Solar Panel, 10, with a solid side Pivot Support, 12, that is slanted to reduce wind lift. Any of the Pivot Supports, 12, can be of different angles shown in order to reduce the wind drag and minimize lift.

FIGS. 98 to 110 show a Solar Panel, 10, with 2 Pivot Supports, 12, 2 Ballast Pivot Supports, 67, with Ballast, 43 and Pads, 68. The Ballast Pivot Supports, 67, are formed so that the Ballast, 43, rests on the Ballast Pivot Support Cross Rods, 73. See FIGS. 101 and 102.

Figure 98:
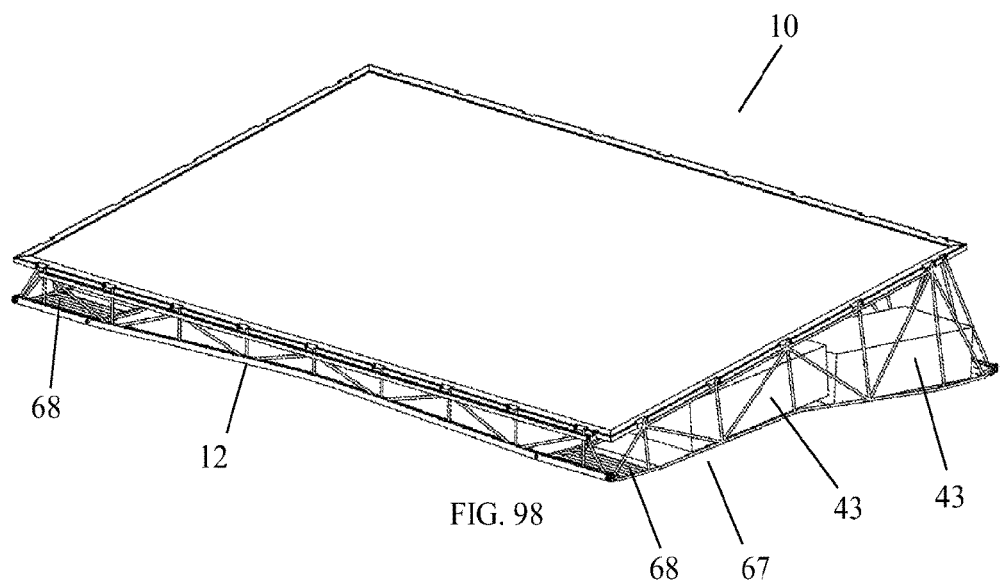
FIG. 98 is a perspective view of an embodiment of the invention.
Figure 99:
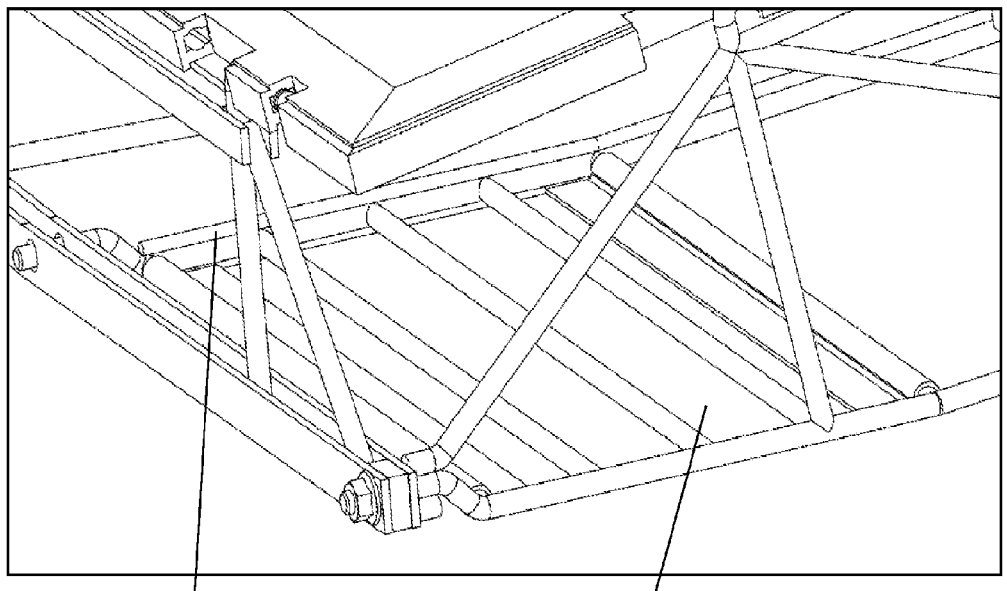
FIG. 99 is a perspective view of a component of an embodiment of the invention.

As shown in FIGS. 98 and 99, there may be a Pad, 68, on each corner of the Solar Panel, 10. This helps distribute the loan on a Surface, 39, protects the Surface, 39, and helps increase friction to prevent the Solar Panel, 10, from sliding on the Surface, 39.

Figure 100:
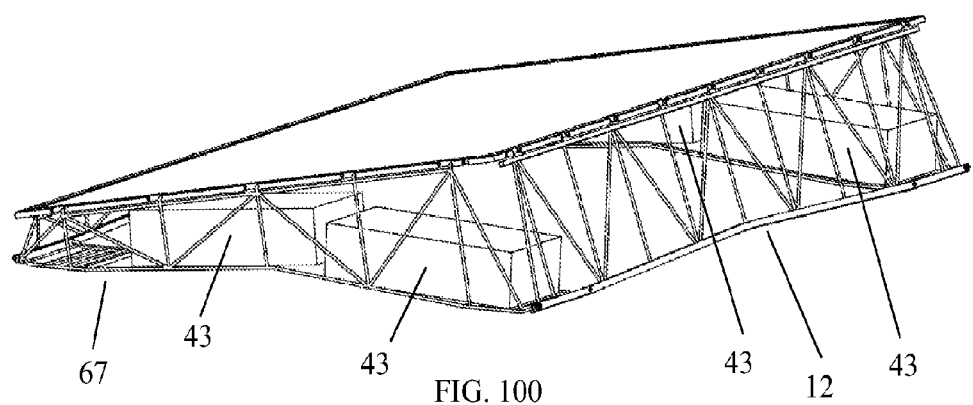
FIG. 100 is a perspective view of an embodiment of the invention.
Figure 101:
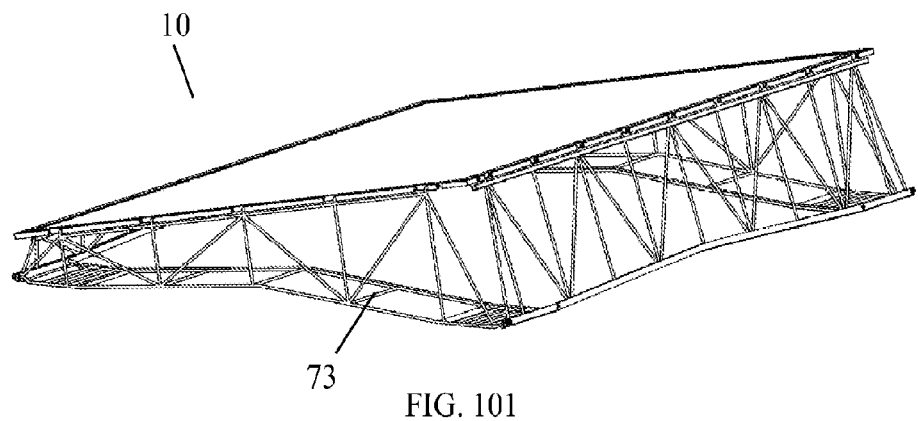
FIG. 101 is a perspective view of an embodiment of the invention.

FIG. 100, shows another view of the Solar Panel, 10, in FIG. 98. FIG. 101 is the same as FIG. 100 except the Ballast, 43, is removed to get a better view of the Ballast Pivot Supports, 67.

Figure 102:
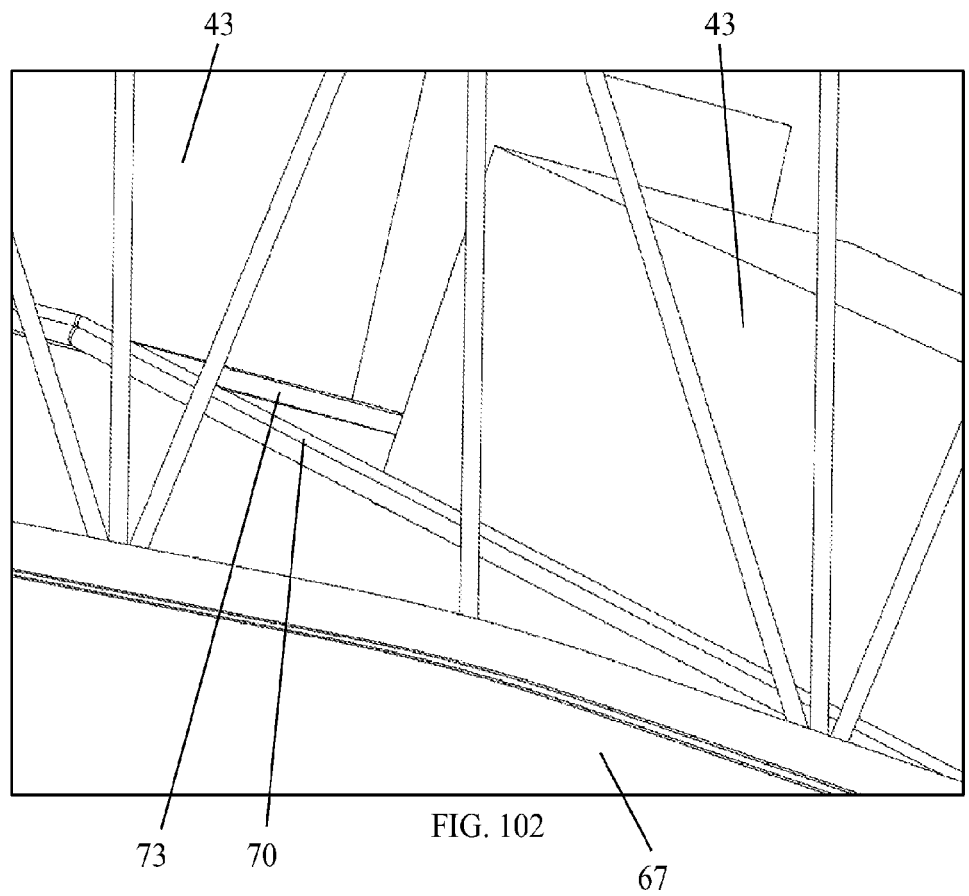
FIG. 102 is a perspective view of a component of an embodiment of the invention.
Figure 103:
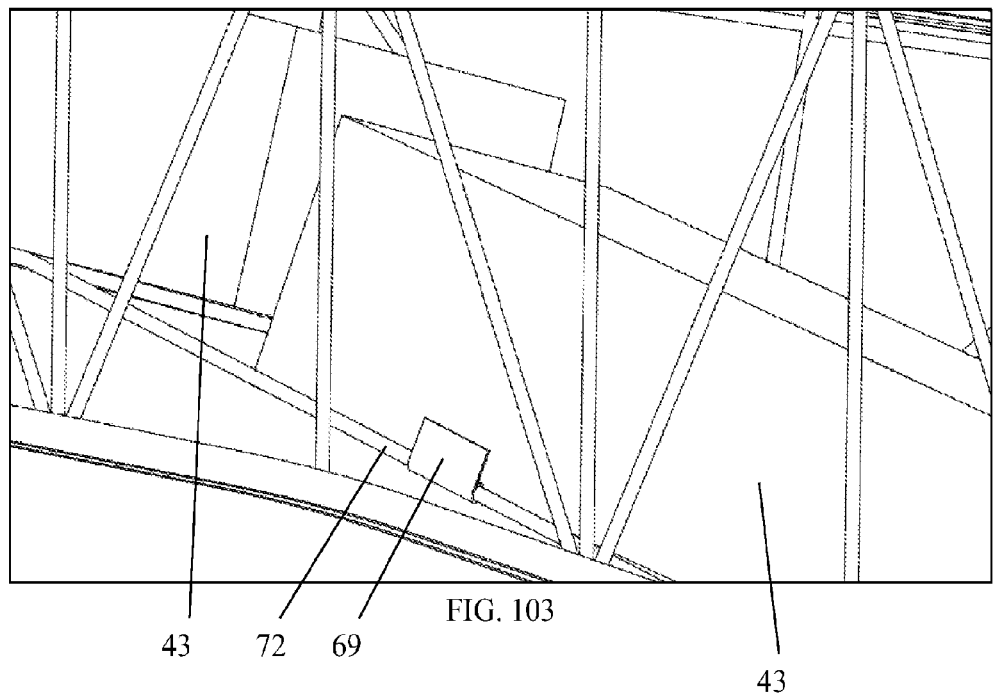
FIG. 103 is a perspective view of a component of an embodiment of the invention.
Figure 104:
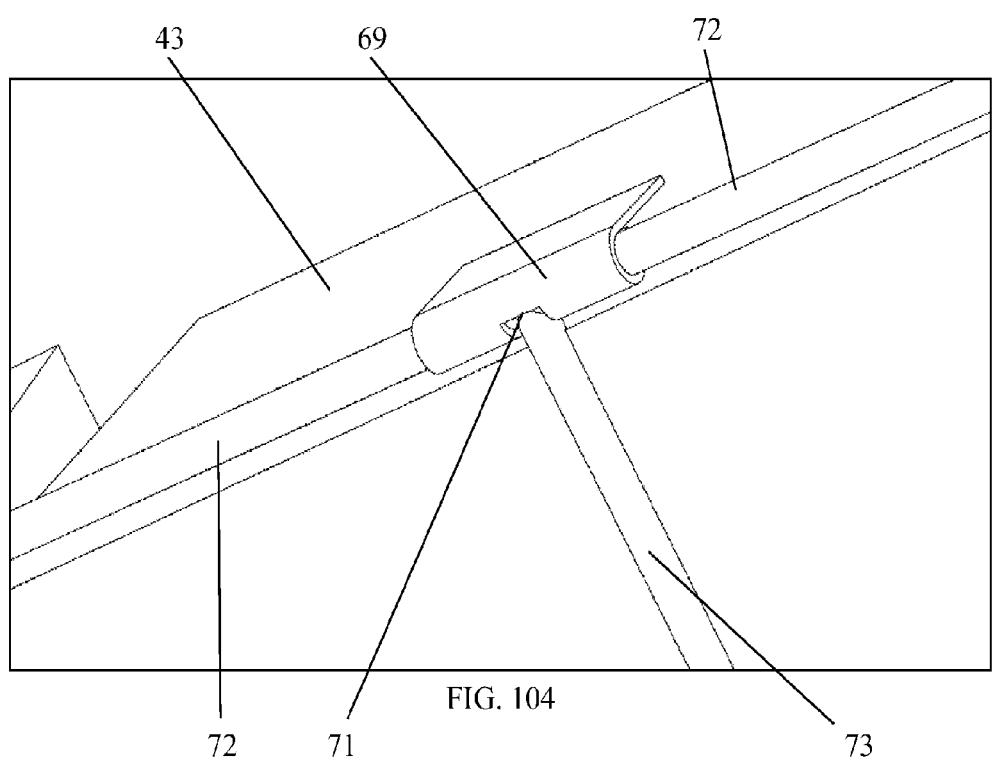
FIG. 104 is a perspective view of a component of an embodiment of the invention.
Figure 105:
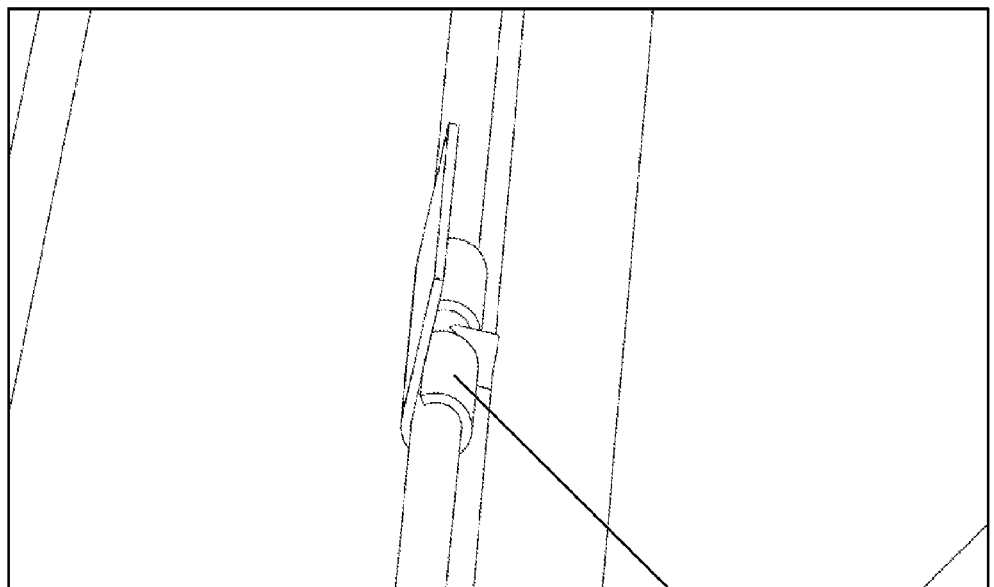
FIG. 105 is a perspective view of a component of an embodiment of the invention.
Figure 106:
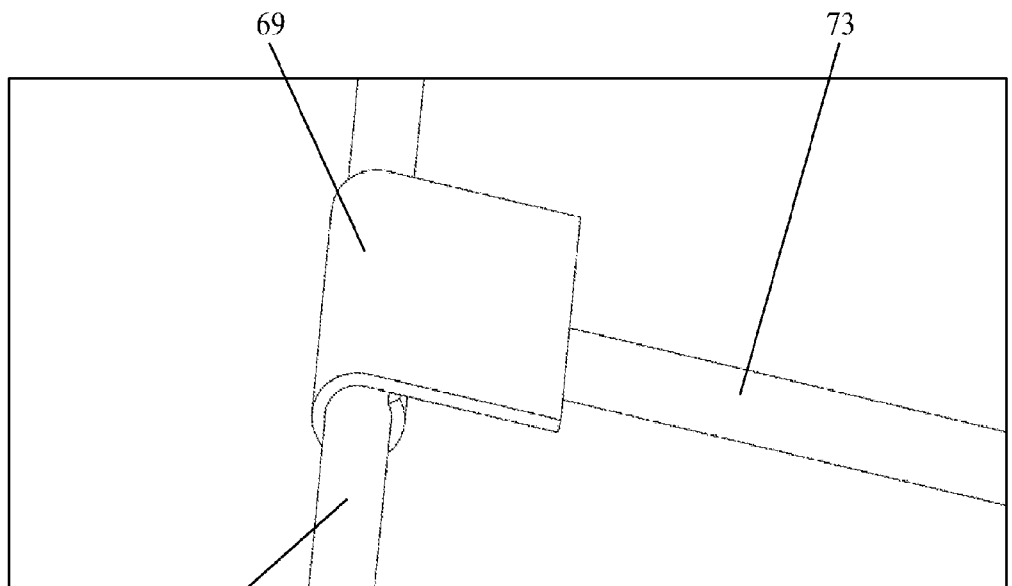
FIG. 106 is a perspective view of a component of an embodiment of the invention.
Figure 107:
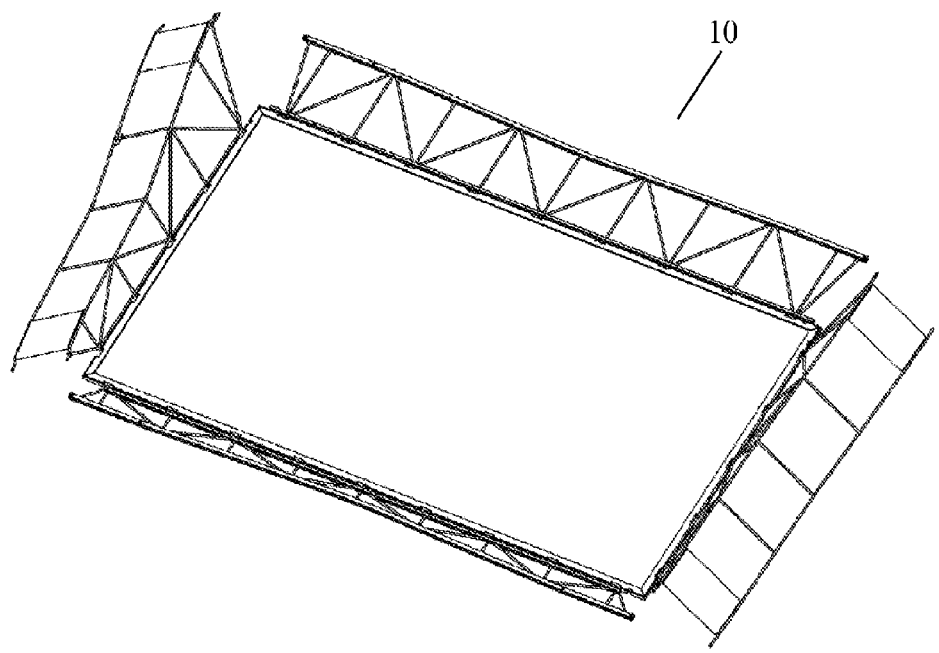
FIG. 107 is a perspective view of an embodiment of the invention.

As shown in FIG. 102, a Ballast Rod, 70, keeps the Ballast, 43, contained on the Ballast Pivot Support, 67. A Ballast Clip, 69, can also contain the Ballast, 43, as shown in FIGS. 103 to 105. The Ballast Clip, 69 is shipped in the position shown in FIGS. 106 and 110. Before putting the Ballast, 43 on the Ballast Pivot Cross Rods, 73, the Ballast Clip, 69 is rotated on the Ballast Pivot Support Rod, 72 to the position shown in FIGS. 103 to 105. The Ballast Pivot, 73, is restricted from rotating further when the Ballast Clip Stop Edge, 71, contacts the Ballast Pivot Support Cross Rod, 73, as shown in FIG. 104.

Electrical ground continuity between the Ballast Clip, 69, and the Ballast Pivot Support Rod, 72 may be done with the same grounding discussed for the Folding Ballast Tray, 49.

Figure 96:
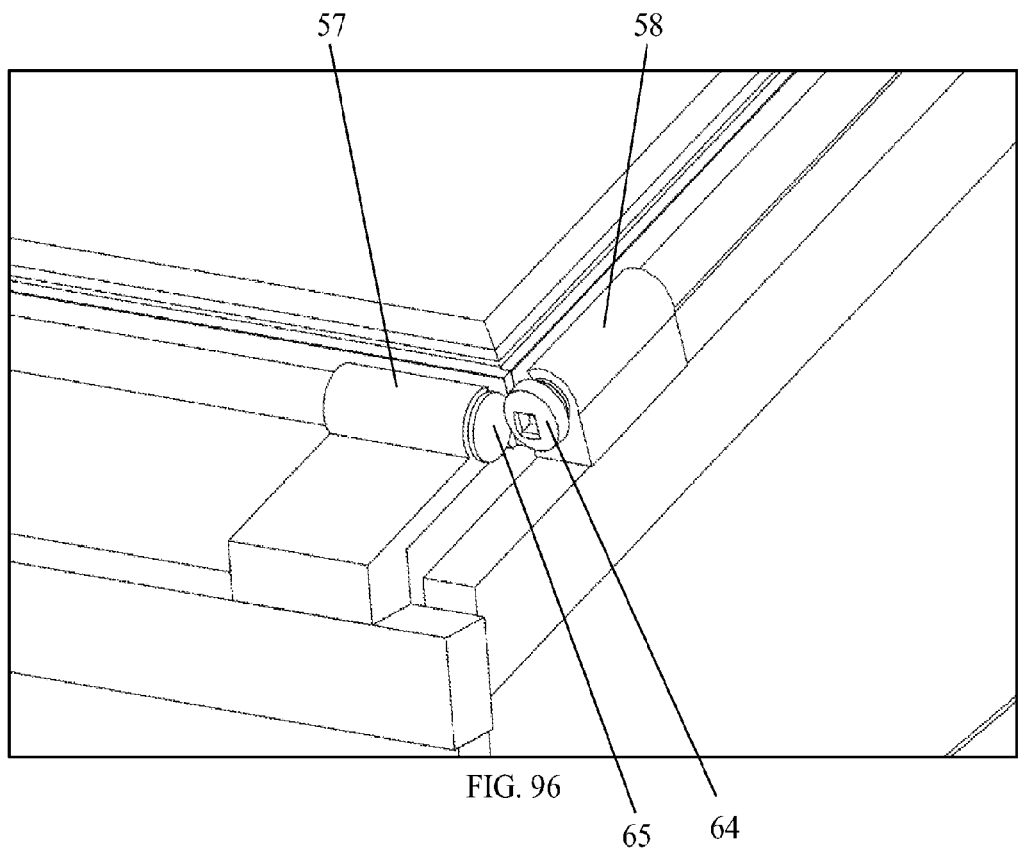
FIG. 96 is a perspective view of a component of an embodiment of the invention.
Figure 97:
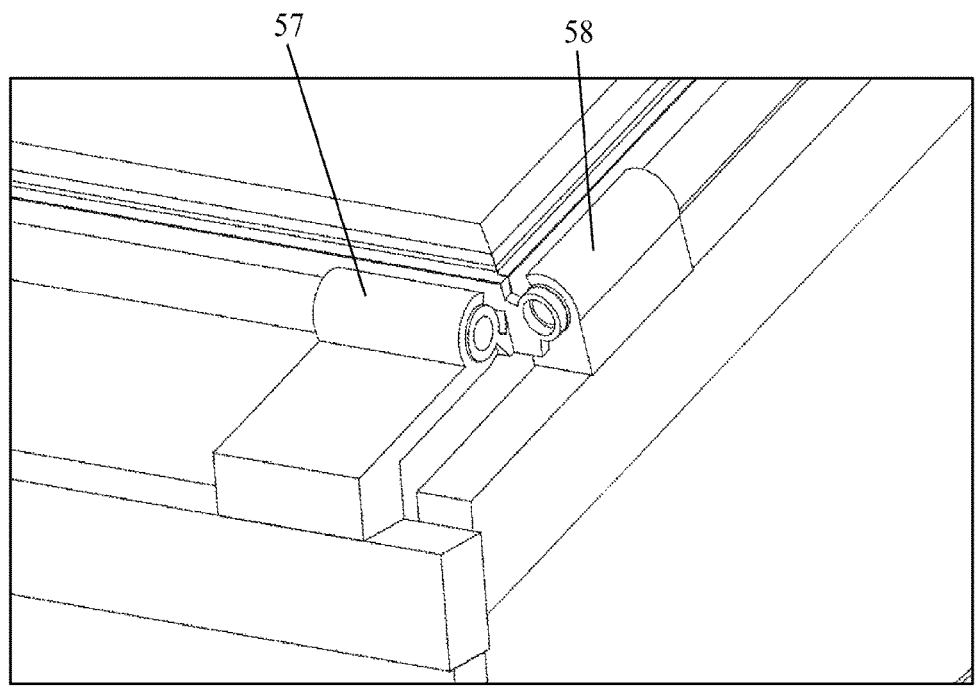
FIG. 97 is a perspective view of a component of an embodiment of the invention.

It should be noted, that the Pivot Supports, 12 and Ballast Pivot Supports, 71, could be inserted after shipping. This is valid for Solar Panels except for some of the Pivot Supports, 12, in FIGS. 75 to 92. If the Frames, 11, in these FIGS. 75 to 92, were changed to the Frames, 11, as shown in FIGS. 96 and 97, then all these Pivot Supports, 12, could also be installed later.

Figure 20:
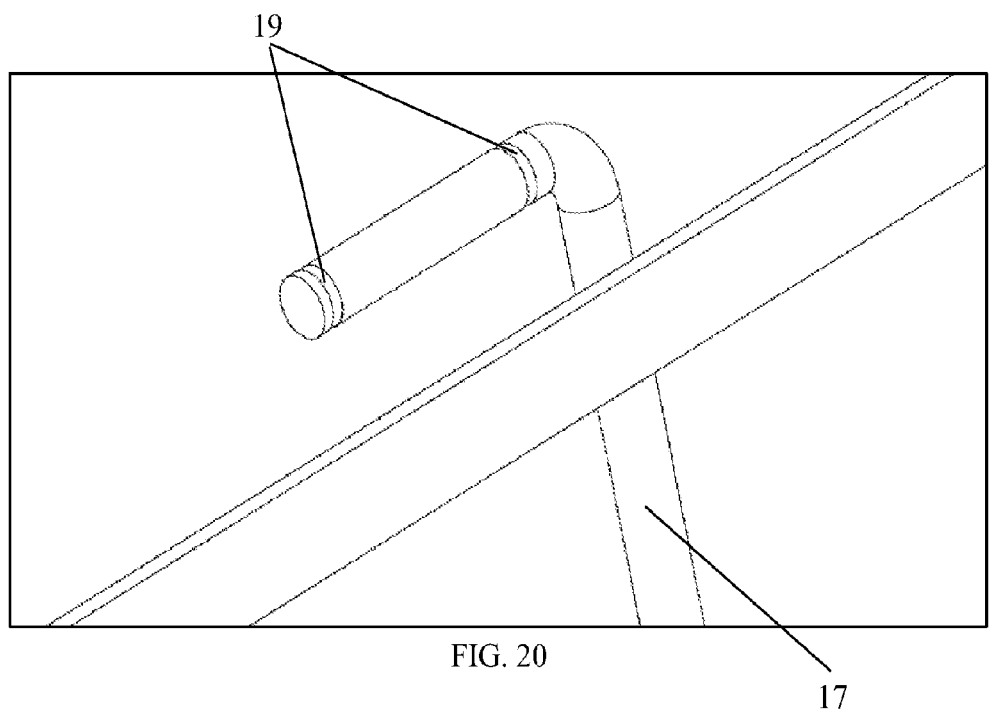
FIG. 20 is a perspective view of a component of an embodiment of the invention.
Figure 21:
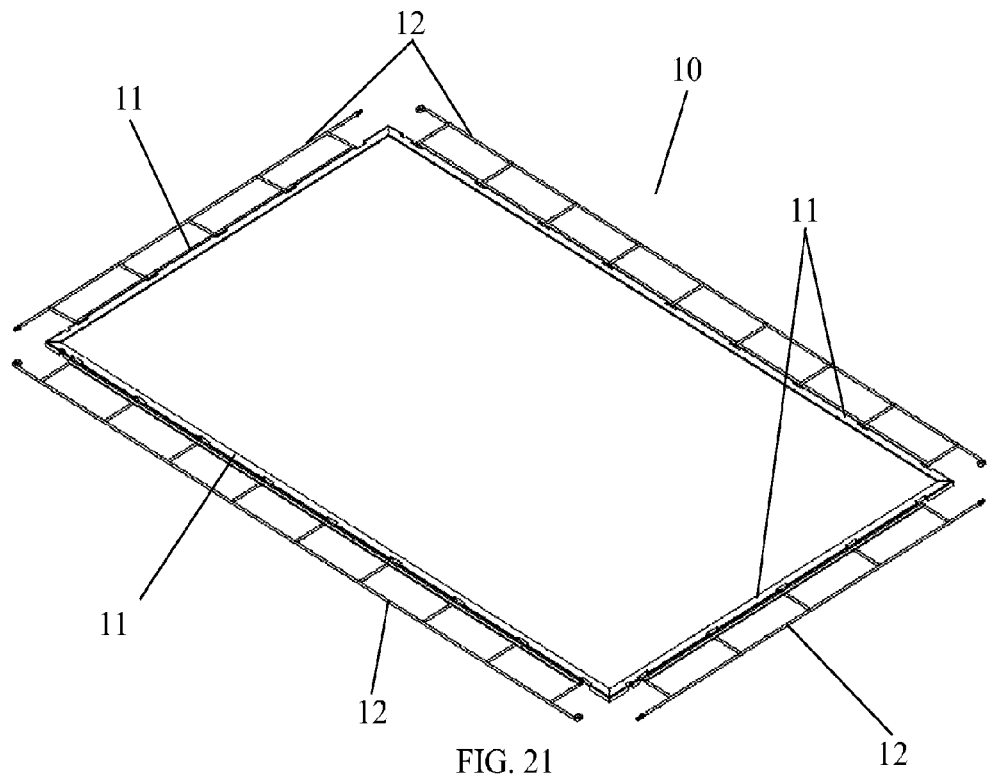
FIG. 21 is a perspective view of an embodiment of the invention.

For the Pivot Supports, 12, with the Biting Pivot Rods, 16, and the Pivot Rods, 17, the Retaining Ring, 18, would have to be installed after the Pivot Supports, 12, were installed as shown in FIGS. 19-21. For the Solar Panels, 10, with the Pivot Supports, 12, like the ones shown in FIGS. 96 and 97, the Frame Screw, 64, would have to be removed and the Pivot Supports, 12, installed as shown in FIG. 97. The Retaining Plug, 65, and the Frame Screw, 64, would be installed after the Pivot Supports were installed as shown in FIG. 96.

Figure 116:
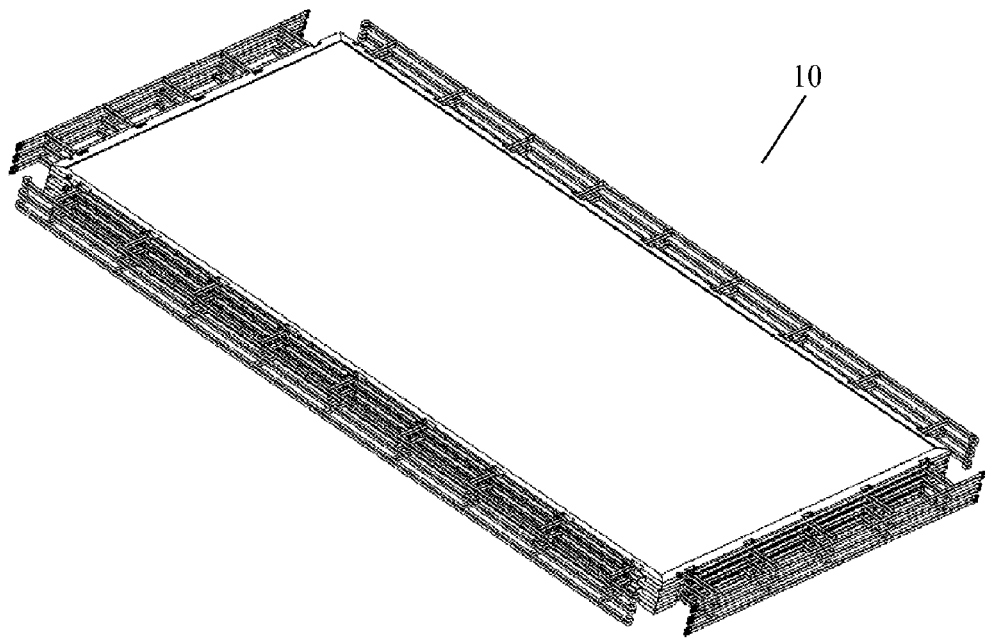
FIG. 116 is a perspective view of an embodiment of the invention.

For the Solar Panels, 10, to be stacked as shown in FIGS. 25, 84, 92, and 108, the Junction Box with Cable, 74, needs to be thin. See FIG. 111. If the Junction Box and Cable, 74, is too thick, then the Solar Panels, 10, will need to be stacked differently as shown in FIGS. 116 and 117. Two Solar Panels, 10, are stacked together with the Junction Boxes with Cables, 74, facing each other but at opposite ends. See FIGS. 112 to 115. This leaves a space between the frames for the Junction Boxes and Cable, 74. The space increases as the Junction Box is thicker. The thickness of the frame on the glass side could be reduced to allow for higher stacking density. For shipment, the space would be maintained with packaging spacers not shown.

The Junction Box and Cable, 74, could also be attached to the edge of the Laminate, 3 (not shown). This could further increase the stacking density.

Figure 108:
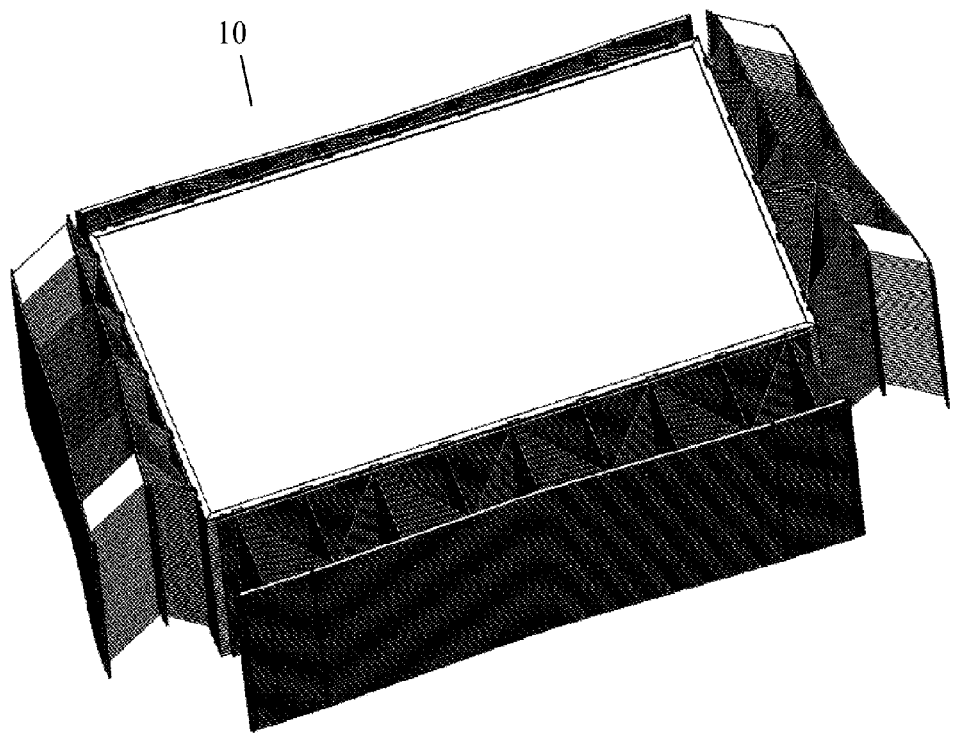
FIG. 108 is a perspective view of an embodiment of the invention.
Figure 109:
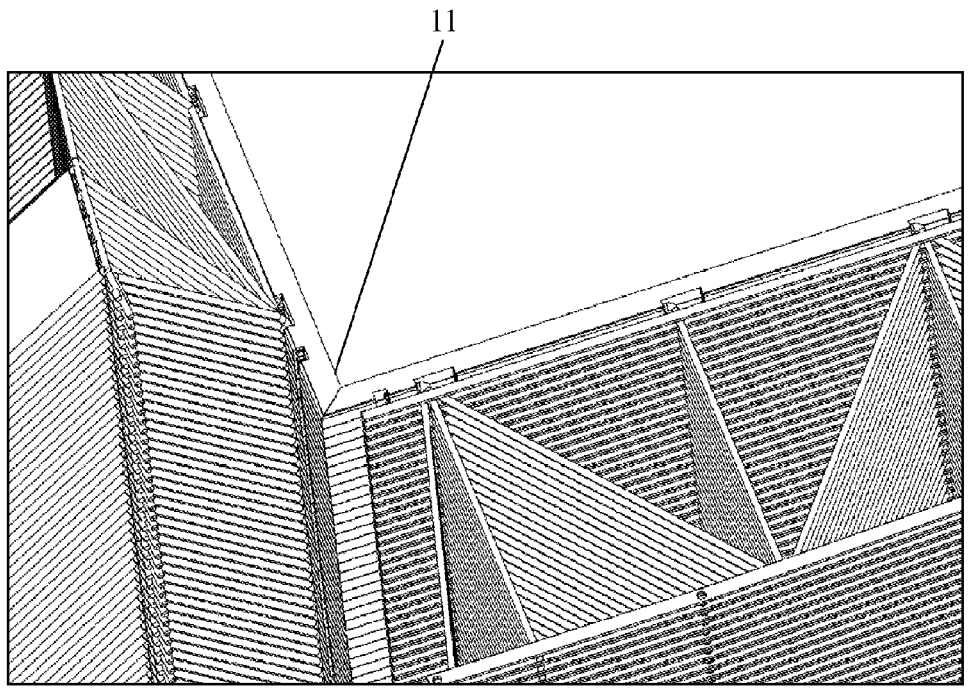
FIG. 109 is a perspective view of a component of an embodiment of the invention.
Figure 110:
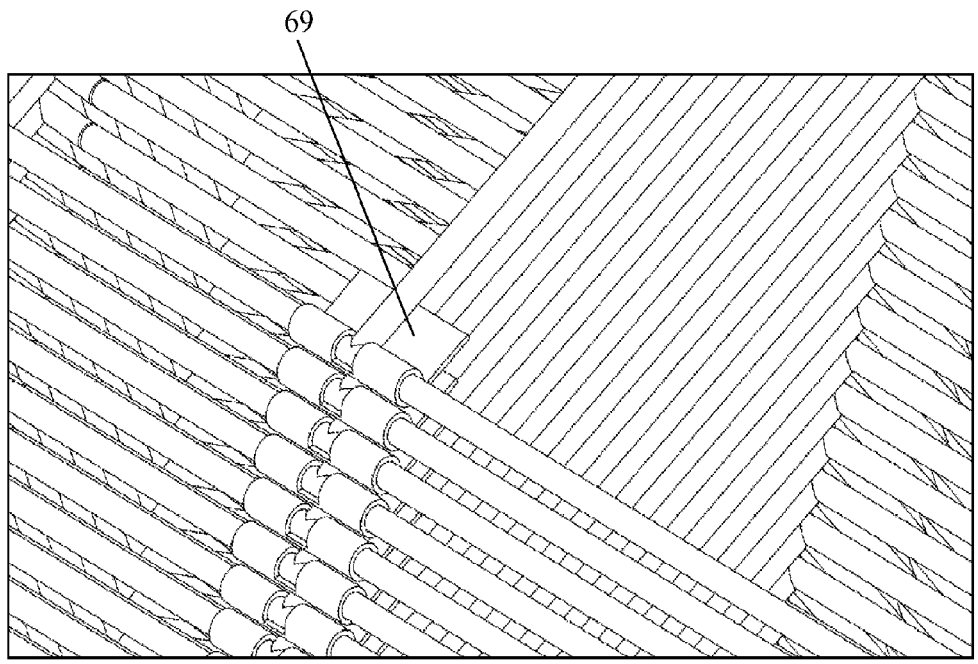
FIG. 110 is a perspective view of a component of an embodiment of the invention.
Figure 111:
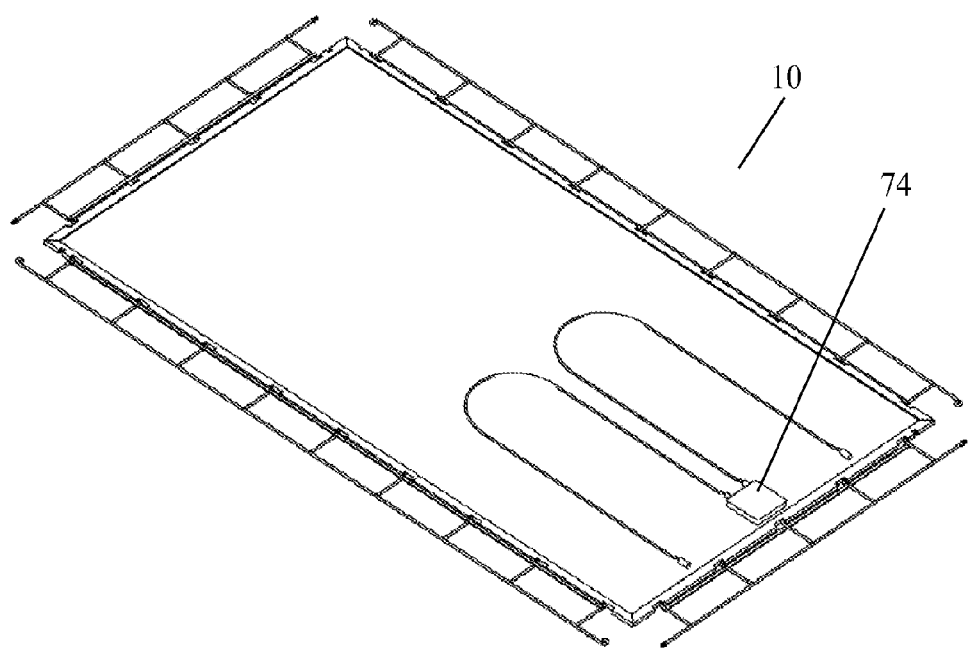
FIG. 111 is a perspective view of an embodiment of the invention.
Figure 112:
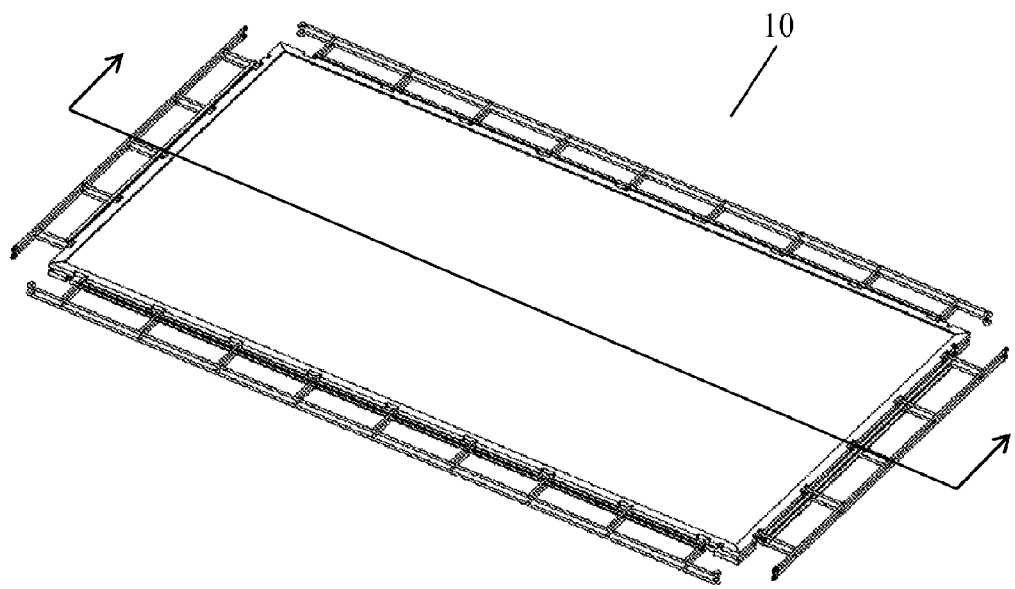
FIG. 112 is a perspective view of an embodiment of the invention.
Figure 113:
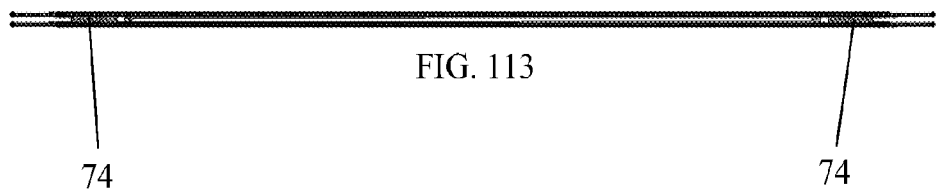
FIG. 113 is a cross-sectional view of an embodiment of the invention.
Figure 114:
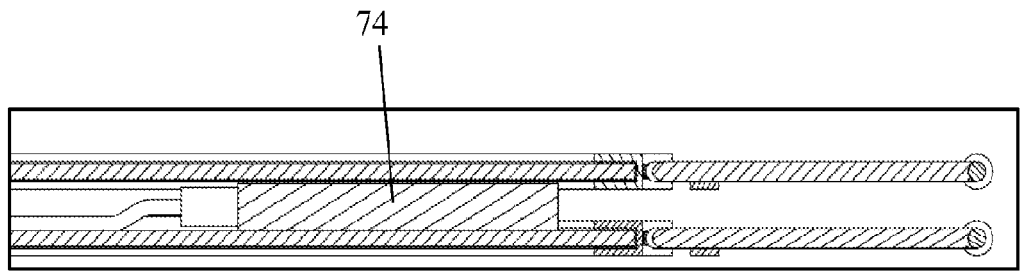
FIG. 114 is a cross-sectional view of a component of an embodiment of the invention.
Figure 115:
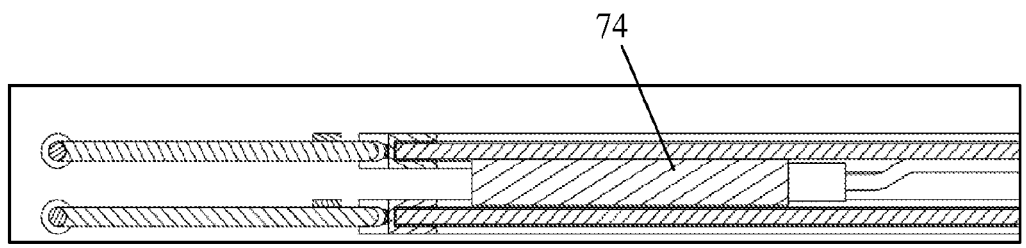
FIG. 115 is a cross-sectional view of a component of an embodiment of the invention.

Each of these pair of Solar Panels, 10, is stacked as shown in FIGS. 116 and 117. This works for all the Solar Panels, 10, except for the Solar Panel, 10, with the Ballast Panel Support, 67, as shown in FIGS. 98 to 110. These would need to be stacked as shown in FIGS. 108 and 109 but with more space between each of the Frames, 11.

The Solar Panels, 10, shown in FIGS. 64 to 110 are shown with the low and high side on the long side of the Solar Panel, 10, which is considered in the Landscape direction. This invention is not limited to this orientation but also includes Solar Panels, 10 with the low and high side on the short side of the Solar Panel, 10, which is in the Portrait direction.

Again, different features were discussed for various photovoltaic modules. The features of each of the photovoltaic modules are not to be considered unique to one photovoltaic module but should be considered as useful for all of the presented photovoltaic modules. Any of the biting features on the pivot supports are examples and could change without distracting from the purpose of the biting features. All the solar panels were shown in the landscape direction. These solar panels could also be in the portrait direction. While the invention has been described in connection with a preferred embodiment, it is not intended to limit the scope of the invention to the particular form set forth, but on the contrary, it is intended to cover such alternatives, modifications, and equivalents as may be included within the spirit and scope of the invention.

Examples of alternative clauses and claims to be considered as part of this invention disclosure and available for eventual assertion as claims include:

1. A photovoltaic module comprising:
    at least one photovoltaic solar panel laminate; and
    at least one repositional side support along an edge of said laminate.
2. A photovoltaic module as described in clause 1, or any other clause, wherein said at least one repositional side support is continuous along said edge of said laminate.
3. A photovoltaic module as described in clause 1, or any other clause, wherein said at least one repositional side support is segmented along said edge of said laminate.
4. A photovoltaic module as described in clause 1, or any other clause, wherein said at least one repositional side support allows efficient stacking of multiple modules.
5. A photovoltaic module as described in clause 1, or any other clause, wherein at least two of said repositional side supports are interlocked with an interlock.
6. A photovoltaic module as described in clause 5, or any other clause, wherein said interlock comprises at least one fastener.
7. A photovoltaic module as described in clause 5, or any other clause, wherein said interlock comprises a snap feature.
8. A photovoltaic module as described in clause 5, or any other clause, wherein said interlock comprises a slide lock.
9. A photovoltaic module as described in clause 5, or any other clause, wherein said interlock comprises a crimp lock.
10. A photovoltaic module as described in clause 5, or any other clause, wherein said interlock comprises interlocking brackets.
11. A photovoltaic module as described in clause 5, or any other clause, wherein said interlock comprises a bracket and connector interlock.
12. A photovoltaic module as described in clause 1, or any other clause, further comprising at least one repositional mounting bracket.
13. A photovoltaic module as described in any of clauses 10, 11, and 12, or any other clause, wherein said bracket is self-grounded after repositioning.
14. A photovoltaic module as described in clause 1, or any other clause, further comprising at least one repositional ballast tray.
15. A photovoltaic module as described in clause 1, or any other clause, further comprising at least one ballast tray that is added after repositioning said repositional side support.
16. A photovoltaic module as described in clause 1, or any other clause, wherein said at least one repositional side support is configured to hold ballast.
17. A photovoltaic module as described in clause 1, or any other clause, further comprising at least one inside pivot.

18. A photovoltaic module as described in clause 1, or any other clause, further comprising at least one outside pivot.
19. A photovoltaic module as described in clause 1, or any other clause, wherein said at least one repositional side support is self-grounded after repositioning.
20. A photovoltaic module as described in clause 1, or any other clause, wherein said at least one repositional side support is interlockable with repositional side supports on separate photovoltaic solar panel modules.
21. A photovoltaic module as described in clause 20, or any other clause, further comprising at least one bracket and connector interlock.
22. A photovoltaic module as described in clause 21, or any other clause, further comprising at least one racking interlock.
23. A photovoltaic module as described in clause 1, or any other clause, further comprising at least one wind deflector.
24. A photovoltaic module as described in clause 1, or any other clause, wherein said repositional side support comprises a welded rod.
25. A photovoltaic module as described in any of clauses 23 and 24, or any other clause, wherein said wind deflector comprises at least one laminate film attached to at least one welded rod.
26. A photovoltaic module as described in clause 1, or any other clause, wherein said at least one repositional side support can be added before installation of said photovoltaic module on a surface.
27. A method of supporting photovoltaic modules comprising the steps of:
    providing at least one photovoltaic solar panel laminate;
    establishing at least one repositional side support along an edge of said laminate;
    repositioning said repositional side support; and
    supporting said laminate with said repositional side support.
28. A method as described in clause 27, or any other clause, wherein said repositional side support is continuous along said edge of said laminate.
29. A method as described in clause 27, or any other clause, wherein said repositional side support is segmented along said edge of said laminate.
30. A method as described in clause 27, or any other clause, further comprising the step of efficiently stacking more than one photovoltaic module, wherein said step of efficiently stacking more than one photovoltaic module is accomplished before said step of repositioning said repositional side support.
31. A method as described in clause 27, or any other clause, further comprising the step of interlocking at least two repositional side supports.
32. A method as described in clause 31, or any other clause, wherein said step of interlocking at least two repositional side supports comprises the step of fastener interlocking at least two repositional side supports.
33. A method as described in clause 31, or any other clause, wherein said step of interlocking at least two repositional side supports comprises the step of snap interlocking at least two repositional side supports.
34. A method as described in clause 31, or any other clause, wherein said step of interlocking at least two repositional side supports comprises the step of slide interlocking at least two repositional side supports.
35. A method as described in clause 31, or any other clause, wherein said step of interlocking at least two repositional side supports comprises the step of crimp interlocking at least two repositional side supports.
36. A method as described in clause 31, or any other clause, wherein said step of interlocking at least two repositional side supports comprises the step of bracket interlocking at least two repositional side supports.
37. A method as described in clause 31, or any other clause, wherein said step of interlocking at least two repositional side supports comprises the step of bracket-and-connector interlocking at least two repositional side supports.
38. A method as described in clause 27, or any other clause, further comprising the step of repositional bracket mounting said photovoltaic module.
39. A method as described in any of clauses 36, 37, or 38, or any other clause, further comprising the step of self-grounding said bracket after said step of repositioning said repositional side support is accomplished.
40. A method as described in clause 27, or any other clause, further comprising the step of establishing at least one repositional ballast tray.
41. A method as described in clause 27, or any other clause, further comprising the step of adding at least one repositional ballast tray after said step of repositioning said repositional side support is accomplished.
42. A method as described in clause 27, or any other clause, further comprising the step of holding ballast after said step of repositioning said repositional side support is accomplished.
43. A method as described in clause 27, or any other clause, wherein said step of repositioning said repositional side support comprises the step of inside pivoting said repositional side support.
44. A method as described in clause 27, or any other clause, wherein said step of repositioning said repositional side support comprises the step of outside pivoting said repositional side support.
45. A method as described in clause 27, or any other clause, further comprising the step of self-grounding said repositional side support after said step of repositioning said repositional side support is accomplished.
46. A method as described in clause 27, or any other clause, further comprising the step of cross-module interlocking at least two repositional side supports.
47. A method as described in clause 46, or any other clause, wherein said step of cross-module interlocking at least two repositional side supports comprises the step of bracket-and-connector interlocking at least two repositional side supports.
48. A method as described in clause 47, or any other clause, wherein said step of cross-module interlocking at least two repositional side supports comprises the step of racking at least two photovoltaic modules.
49. A method as described in clause 27, or any other clause, further comprising the step of deflecting wind from said photovoltaic module.
50. A method as described in clause 27, or any other clause, wherein said repositional side support comprises at least one welded rod.
51. A method as described in any of clauses 49 and 50, or any other clause, wherein said repositional side support comprises at least one welded rod and further comprising the steps of:
    attaching at least one laminate film to said welded rod; and
    deflecting wind from said photovoltaic module.

52. A method as described in clause 27, or any other clause, wherein said step of establishing at least one repositional side support can be accomplished before said module is installed on a surface.

53. A photovoltaic module comprising:
   at least one photovoltaic solar panel laminate; and
   at least one stackable side support along an edge of said photovoltaic solar panel laminate.

54. A photovoltaic module as in clause 53, or any other clause, wherein said stackable side support is continuous along said edge of said photovoltaic solar panel laminate.

55. A photovoltaic module as in clause 53, or any other clause, wherein said stackable side support is segmented along said edge of said photovoltaic solar panel laminate.

56. A photovoltaic module as in clause 53, or any other clause, further comprising additional modules efficiently stacked with said photovoltaic solar panel module.

57. A photovoltaic module as in clause 53, or any other clause, further comprising at least one stackable support interlock.

58. A photovoltaic module as in clause 57, or any other clause, wherein said stackable support interlock comprises a fastener.

59. A photovoltaic module as in clause 57, or any other clause, wherein said stackable support interlock comprises a snap feature.

60. A photovoltaic module as in clause 57, or any other clause, wherein said stackable support interlock comprises a slide lock.

61. A photovoltaic module as in clause 57, or any other clause, wherein said stackable support interlock comprises a crimp lock.

62. A photovoltaic module as in clause 57, or any other clause, wherein said stackable support interlock comprises a bracket interlock.

63. A photovoltaic module as in clause 57, or any other clause, wherein said stackable support interlock comprises a bracket and connector interlock.

64. A photovoltaic module as in clause 53, or any other clause, further comprising at least one stackable mounting bracket.

65. A photovoltaic module as in any of clauses 62, 63, or 64, or any other clause, wherein said bracket is self-grounded after repositioning.

66. A photovoltaic module as in clause 53, or any other clause, further comprising at least one stackable ballast tray.

67. A photovoltaic module as in clause 53, or any other clause, further comprising at least one ballast tray added to said photovoltaic module after repositioning said stackable side support.

68. A photovoltaic module as in clause 53, or any other clause, wherein said stackable side support is configured to hold ballast after it is repositioned.

69. A photovoltaic module as in clause 53, or any other clause, further comprising at least one inside pivot.

70. A photovoltaic module as in clause 53, or any other clause, further comprising at least one outside pivot.

71. A photovoltaic module as in clause 53, or any other clause, wherein said stackable side support is self-grounding after it is repositioned.

72. A photovoltaic module as in clause 53, or any other clause, wherein said stackable side support is interlockable with stackable side supports on separate photovoltaic solar panel modules.

73. A photovoltaic module as in clause 72, or any other clause, further comprising at least one stackable bracket & connector interlock.

74. A photovoltaic module as in clause 73, or any other clause, further comprising at least one stackable racking interlock.

75. A photovoltaic module as in clause 53, or any other clause, further comprising at least one stackable wind deflector.

76. A photovoltaic module as in clause 53, or any other clause, wherein said stackable side support comprises at least one welded rod.

77. A photovoltaic module as in any of clauses 75 or 76, or any other clause, wherein said stackable wind deflector comprises at least one stackable laminate film attached to at least one welded rod.

78. A photovoltaic module as in clause 53, or any other clause, wherein said stackable side support can be added to said photovoltaic solar panel laminate before installation of said photovoltaic module on a surface.

79. A method of storing photovoltaic modules comprising the steps of:
   establishing at least two photovoltaic solar panel laminates;
   providing at least two stackable side supports along at least two edges of said at least two photovoltaic solar panel laminates;
   positioning said at least two stackable side supports such that they are substantially parallel to said at least two photovoltaic solar panel laminates; and
   stacking said at least two photovoltaic solar panel laminates and said at least two stackable side supports atop each other.

80. A method as described in clause 79, or any other clause, wherein said stackable side supports are continuous along said edges of said laminates.

81. A method as described in clause 79, or any other clause, wherein said stackable side supports are segmented along said edges of said laminates.

82. A method as described in clause 79, or any other clause, wherein said step of stacking comprises the step of efficiently stacking at least two photovoltaic modules atop each other.

83. A method as described in clause 79, or any other clause, further comprising the steps of:
   providing at least two stackable interlocks; and
   stacking said at least two stackable interlocks atop each other.

84. A method as described in clause 83, or any other clause, wherein said step of providing at least two stackable interlocks comprises the step of providing at least two fastener interlocks.

85. A method as described in clause 83, or any other clause, wherein said step of providing at least two stackable interlocks comprises the step of providing at least two snap features.

86. A method as described in clause 83, or any other clause, wherein said step of providing at least two stackable interlocks comprises the step of providing at least two slide locks.

87. A method as described in clause 83, or any other clause, wherein said step of providing at least two stackable interlocks comprises the step of providing at least two crimp locks.

88. A method as described in clause 83, or any other clause, wherein said step of providing at least two stackable interlocks comprises the step of providing at least two interlocking brackets.
89. A method as described in clause 83, or any other clause, wherein said step of providing at least two stackable interlocks comprises the step of providing at least two bracket-and-connector interlocks.
90. A method as described in clause 79, or any other clause, further comprising the steps of:
providing at least two stackable bracket mounts; and
stacking said at least two stackable bracket mounts atop each other.
91. A method as described in any of clauses 88, 89, or 90, or any other clause, further comprising the steps of:
separating said brackets from each other;
repositioning said brackets; and
self-grounding said brackets.
92. A method as described in clause 79, or any other clause, further comprising the steps of:
establishing at least two stackable ballast trays; and
stacking said at least two stackable ballast trays atop each other.
93. A method as described in clause 79, or any other clause, further comprising the steps of:
separating said photovoltaic solar panel laminates and said stackable side supports;
repositioning said stackable side supports; and
adding at least one repositional ballast tray.
94. A method as described in clause 79, or any other clause, further comprising the steps of:
separating said photovoltaic solar panel laminates and said stackable side supports;
repositioning said stackable side supports; and
holding ballast.
95. A method as described in clause 79, or any other clause, wherein said step of positioning said stackable side supports comprises the step of inside pivoting said stackable side supports.
96. A method as described in clause 79, or any other clause, wherein said step of positioning said stackable side supports comprises the step of outside pivoting said stackable side supports.
97. A method as described in clause 79, or any other clause, further comprising the steps of:
separating said photovoltaic solar panel laminates and said stackable side supports;
repositioning said stackable side supports; and
self-grounding said stackable side supports.
98. A method as described in clause 79, or any other clause, further comprising the steps of:
separating said photovoltaic solar panel laminates and said stackable side supports;
repositioning said stackable side supports; and
cross-module interlocking at least two stackable side supports.
99. A method as described in clause 98, or any other clause, wherein said step of cross-module interlocking at least two stackable side supports comprises the step of bracket-and-connector interlocking at least two stackable side supports.
100. A method as described in clause 99, or any other clause, wherein said step of cross-module interlocking at least two stackable side supports comprises the step of racking at least two photovoltaic modules.
101. A method as described in clause 79, or any other clause, further comprising the steps of:
separating said photovoltaic solar panel laminates and said stackable side supports;
repositioning said stackable side supports; and
deflecting wind from said photovoltaic solar panel laminates.
102. A method as described in clause 79, or any other clause, wherein said stackable side supports comprise at least two welded rods.
103. A method as described in any of clauses 101 and 102, or any other clause, wherein said stackable side supports comprise at least two welded rods and further comprising the steps of:
attaching at least one laminate film to said welded rods; and
deflecting wind from said photovoltaic solar panel laminates.
104. A method as described in clause 79, or any other clause, wherein said step of providing at least two stackable side supports can be accomplished before said photovoltaic solar panel laminates are installed on a surface.
105. A method as described in clause 79, or any other clause, further comprising the step of packaging said stackable photovoltaic solar panel laminates and said stackable side supports in a single package.
106. A method as described in clause 105, or any other clause, further comprising the step of shipping said single package.

As can be easily understood from the foregoing, the basic concepts of the present invention may be embodied in a variety of ways. It involves both photovoltaic module supporting techniques as well as particular photovoltaic modules. In this application, the supporting techniques are disclosed as part of the results shown to be achieved by the various modules described and as steps which are inherent to utilization. They are simply the natural result of utilizing the modules as intended and described. In addition, while some modules are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "support" should be understood to encompass disclosure of the act of "supporting"—whether explicitly discussed or not—and, conversely, were there effectively disclosure of the act of "supporting", such a disclosure should be understood to encompass disclosure of a "support" and even a "means for supporting." Such changes and alternative terms are to be understood to be explicitly included in the description. Further, each such means (whether explicitly so described or not) should be understood as encompassing all elements that can perform the given function, and all descriptions of elements that perform a described function should be understood as a non-limiting example of means for performing that function.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed below or other information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s).

I. U.S. PATENT DOCUMENTS

| U.S. Pat. No. | Kind Code | Issue Date | Name of Patentee or Applicant of cited Document |
|---|---|---|---|
| 8,640,400 | B2 | 2014 Feb. 4 | Liebendorfer |
| 8,291,653 | B2 | 2012 Oct. 23 | Suarez, et al. |
| 8,128,044 | B2 | 2012 Mar. 6 | Liebendorfer |
| 7,766,292 | B2 | 2010 Aug. 3 | Liebendorfer |
| 7,748,175 | B2 | 2010 Jul. 6 | Liebendorfer |
| 7,600,349 | B2 | 2009 Oct. 13 | Liebendorfer |
| 7,434,362 | B2 | 2008 Oct. 14 | Liebendorfer |
| 7,260,918 | B2 | 2007 Aug. 28 | Liebendorfer |
| D496249 | S | 2004 Sep. 21 | Liebendorfer |
| D496248 | S1 | 2004 Sep. 21 | Liebendorfer |
| 5,197,589 | | 1993 Mar. 30 | Gordon |
| 5,067,605 | | 1991 Nov. 26 | Gordon |
| 8,109,048 | B2 | 2012 Feb. 7 | West |
| 8,376,298 | B2 | 2013 Feb. 19 | McPheeters |
| 8,585,000 | B2 | 2013 Nov. 19 | McPheeters |
| 8,375,654 | B1 | 2013 Feb. 19 | West, et al. |
| 7,592,537 | B1 | 2009 Sep. 22 | West |
| 8,164,020 | | 1992 Nov. 17 | Wagner, et al. |
| 4,371,139 | | 1983 Feb. 1 | Clark |
| 5,505,788 | | 1996 Apr. 9 | Dinwoodle |
| 5,338,369 | | 1994 Aug. 16 | Rawlings |
| 5,596,981 | | 1997 Jan. 28 | Soucey |
| 6,105,317 | | 2000 Aug. 22 | Tomiuchi, et al. |
| 5,571,338 | | 1996 Nov. 5 | Kadomome, et al. |
| 5,460,660 | | 1995 Oct. 24 | Albright, et al. |
| 5,232,518 | | 1993 Aug. 3 | Nath, et al. |
| 6,959,517 | B2 | 2005 Nov. 1 | Poddany, et al. |
| 6,269,596 | B1 | 2001 Aug. 7 | Ohtsuka, et al. |
| 6,370,828 | B1 | 2002 Apr. 16 | Genschorek |
| 7,406,880 | B2 | 2008 Aug. 5 | Cinnamon, et al. |
| 6,465,724 | B1 | 2002 Oct. 15 | Garvison, et al. |
| 7,895,808 | B1 | 2001 Mar. 01 | Wentworth, et al. |
| 7,762,027 | B1 | 2010 Jul. 27 | Wentworth, et al. |
| 8,567,134 | B1 | 2013 Oct. 29 | Grushkowitz, et al. |
| 5,164,020 | | 1992 Nov. 17 | Grushkowitz, et al |
| 7,406,800 | B2 | 2008 Aug. 5 | Cinnamon |

II. U.S. PATENT APPLICATION PUBLICATIONS

| Publication Number | Kind Code | Publication Date | Name of Patentee or Applicant of cited Document |
|---|---|---|---|
| 20140053891 | A1 | 2014 Feb. 27 | West, et al. |
| 20140026946 | A1 | 2014 Jan. 30 | West, et al. |
| 20130183084 | A1 | 2013 Jul. 18 | West, et al. |
| 20130180574 | A1 | 2013 Jul. 18 | West, et al. |
| 20130180573 | A1 | 2013 Jul. 18 | West |
| 20130180572 | A1 | 2013 Jul. 18 | West |
| 20130140416 | A1 | 2013 Jun. 6 | West, et al. |
| 20130133270 | A1 | 2013 May 30 | West |
| 20120298188 | A1 | 2012 Nov. 29 | West, et al. |
| 20120298186 | A1 | 2012 Nov. 19 | West |
| 20120279558 | A1 | 2012 Nov. 8 | West, et al. |
| 20120260972 | A1 | 2012 Oct. 18 | West, et al. |
| 20120255598 | A1 | 2012 Oct. 11 | West |
| 20120318757 | A1 | 2012 Dec. 20 | Liebendorfer |
| 20100319277 | A1 | 2010 Dec. 23 | Suarez, et al. |
| 20100293874 | A1 | 2010 Nov. 25 | Liebendorfer |
| 20100263297 | A1 | 2010 Oct. 21 | Liebendorfer |
| 20090232616 | A1 | 2009 Sep. 17 | Sekreta, et al. |
| 20090019796 | A1 | 2009 Jan. 22 | Liebendorfer |
| 20040163338 | A1 | 2004 Aug. 26 | Liebendorfer |
| 20030015636 | A1 | 2003 Jan. 23 | Liebendorfer |
| 20130036685 | A1 | 2013 Feb. 14 | Suarez, et al. |
| 20110000526 | A1 | 2011 Jan. 6 | West |
| 20120125410 | A1 | 2012 May 24 | West, et al. |
| 20110000519 | A1 | 2011 Jan. 6 | West |

-continued

| Publication Number | Kind Code | Publication Date | Name of Patentee or Applicant of cited Document |
|---|---|---|---|
| 20110000520 | A1 | 2011 Jan. 6 | West |
| 20110000544 | A1 | 2011 Jan. 6 | West |
| 20100065108 | A1 | 2010 Mar. 18 | West, et al. |
| 20120266946 | A1 | 2012 Oct. 25 | West, et al. |
| 20120234378 | A1 | 2012 Sep. 30 | West, et al. |
| 20120152326 | A1 | 2012 Jun. 21 | West, et al. |
| 20120298817 | A1 | 2012 Nov. 29 | West, et al. |
| 20120301661 | A1 | 2012 Nov. 29 | West, et al. |
| 20130220403 | A1 | 2013 Aug. 29 | Rizzo |
| 20130192150 | A1 | 2013 Aug. 1 | Dupont |
| 20100243023 | A1 | 2010 Sep. 30 | Patton, et al. |
| 20110203637 | A1 | 2011 Aug. 25 | Patton, et al. |
| 20090320906 | A1 | 2009 Dec. 31 | Botkin, et al. |

III. FOREIGN PATENT DOCUMENTS

| Foreign Document Number | Country Code | Kind Code | Publication Date | Name of Patentee or Applicant of cited Document |
|---|---|---|---|---|
| 2012116121 | WO | A1 | 2012 Aug. 30 | Hudson, et al. |
| 2012082806 | WO | A2 | 2012 Jun. 21 | Atchley, et al. |
| 2012079061 | WO | A1 | 2012 Jun. 14 | Atchley, et al. |
| 2012079060 | WO | A2 | 2012 Jun. 14 | Atchley, et al. |
| 2011025585 | WO | A3 | 2011 Sep. 1 | West |
| 2011022125 | WO | A3 | 2011 Sep. 1 | West |
| 2011019460 | WO | A3 | 2011 Aug. 11 | West |
| 2011025585 | WO | A2 | 2011 Mar. 3 | West |
| 2011022125 | WO | A2 | 2011 Feb. 24 | West |
| 2011019460 | WO | A2 | 2001 Feb. 17 | West |
| 2013009523 | WO | A1 | 2013 Jan. 17 | Schuit |
| 2010148387 | WO | A1 | 2010 Dec. 23 | Suarez, et al. |
| 2010126770 | WO | A1 | 2010 Nov. 4 | Schuit, et al. |
| 2009111796 | WO | A1 | 2009 Sep. 11 | Sekreta |
| 2009086150 | WO | A1 | 2009 Jul. 9 | Webb |
| 2004077517 | WO | A3 | 2006 Mar. 30 | Liebendorfer |
| 2004077517 | WO | C1 | 2005 Oct. 6 | Liebendorfer |
| 2004077517 | WO | A2 | 2004 Sep. 10 | Liebendorfer |
| 2003007688 | WO | A3 | 2003 Oct. 2 | Liebendorfer |
| 2003007688 | WO | A2 | 2003 Jan. 3 | Liebendorfer |
| 2678492 | EP | A1 | 2014 Jan. 1 | West, et al. |
| 2449599 | EP | A2 | 2012 May 9 | West |
| 2449598 | EP | A2 | 2012 May 9 | West |
| 2449596 | EP | A2 | 2012 May 9 | West |
| 2443297 | EP | A1 | 2012 Apr. 25 | Suarez, et al. |
| 2425169 | EP | A1 | 2012 Mar. 7 | Schuit, et al. |
| 2260211 | EP | B1 | 2012 Dec. 19 | Sekreta |
| 2260211 | EP | A1 | 2009 Sep. 11 | Sekreta |
| 2008124158 | WO | A1 | 2008 Oct. 16 | West, et al. |
| 10286953 | AU | A1 | 2012 Feb. 9 | West |
| 2817611 | CA | A1 | 2013 Dec. 6 | West, et al. |
| 103081119 | CN | A | 2013 May 1 | West |
| 12220665 | AU | A1 | 2013 Oct. 10 | West, et al. |
| KR2012098589A | KR | A | 2012 Sep. 5 | West |
| 2820935 | CA | A1 | 2012 Jun. 14 | West, et al. |
| 2360740 | EP | B1 | 2013 Oct. 9 | Hock, et al. |

IV. NON-PATENT LITERATURE DOCUMENTS

ZS Comp for composition shingle roofs, pg 1-2
OMG PowerGrip Roof Mount System; pg 1-2; Roofing Products; RM1004, Rev. 1113
OMG Roofing Products, Roofing Report; pg 1-2; GEN1009A, Rev. 1113
Sunpower T5 Solar Roof Tile Spec Sheet, pg 1-2
U.S. Provisional Pat. application Ser. No. 61/958,564; filed Jul. 31, 2013; entire Image File Wrapper available on USPTO PAIRS
U.S. Provisional Pat. application Ser. No. 61/963,038; filed Nov. 21, 2013; entire Image File Wrapper available on USPTO PAIRS
U.S. Provisional Pat. application Ser. No. 61/956,167; filed Jan. 24, 2014; entire Image File Wrapper available on USPTO PAIRS Thus, the applicant(s) should be understood to have support to claim and make a statement of invention to at least: i) each of the photovoltaic modules as herein disclosed and described, ii) the related methods disclosed and described, iii) similar, equivalent, and even implicit variations of each of these modules and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) an apparatus for performing the methods described herein comprising means for performing the steps, xii) the various combinations and permutations of each of the elements disclosed, xiii) each potentially dependent claim or concept as a dependency on each and every one of the independent claims or concepts presented, and xiv) all inventions described herein.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in Hakim v. Cannon Avent Group, PLC, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 25 (if such were to exist) if desired and still fall within the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

What is claimed for examination and patenting in this present application is:

1. A photovoltaic module comprising:
   at least one photovoltaic solar panel laminate having four sides; and
   at least one pivoting support having a length substantially as long as an edge of at least one side of said photovoltaic solar panel laminate and located along said edge of said at least one side of said photovoltaic solar panel laminate said at least one pivoting side support configured to pivot such that it is coaxial with said at least one photovoltaic solar panel laminate.

2. A photovoltaic module as described in claim 1 wherein at least two pivoting supports are interlocked with an interlock.

3. A photovoltaic module as described in claim 2 wherein said interlock comprises interlocking brackets.

4. A photovoltaic module as described in claim 2 wherein said interlock comprises a bracket and connector interlock.

5. A photovoltaic module as described in claim 1 further comprising at least one pivoting mounting bracket.

6. A photovoltaic module as described in any of claims 3, 4, or 5, wherein said bracket is self-grounded after pivoting.

7. A photovoltaic module as described in claim 1 wherein said at least one pivoting support is self-grounded after pivoting.

8. A photovoltaic module as described in claim 1 wherein said at least one pivoting support is interlockable with pivoting side supports on separate photovoltaic solar panel modules.

9. A photovoltaic module as described in claim 1 further comprising at least one wind deflector.

10. A method of supporting photovoltaic modules comprising the steps of:
    providing at least one photovoltaic solar panel laminate having four sides;
    establishing at least one pivoting support having a length substantially as long as an edge of at least one side of said photovoltaic solar panel laminate and located along said edge of said at least one side of said photovoltaic solar panel laminate;
    pivoting said pivoting support; and
    supporting said photovoltaic solar panel laminate with said pivoting support said at least one pivoting side support configured to pivot such that it is coaxial with said at least one photovoltaic solar panel laminate.

11. A photovoltaic module as described in claim 1 wherein said at least one pivoting support comprises at least one stackable side support.

12. A photovoltaic module as described in claim 1 wherein said at least one pivoting support having a length substantially as long as an edge of at least one side of said photovoltaic solar panel laminate and located substantially along said edge of said at least one side of said photovoltaic solar panel laminate is attached to said photovoltaic solar panel laminate when said photovoltaic solar panel laminate is shipped.

13. A photovoltaic module as described in claim 1 wherein said at least one pivoting support having a length substantially as long as an edge of at least one side of said photovoltaic solar panel laminate and located substantially along said edge of said at least one side of said photovoltaic solar panel laminate comprises a pivoting support located along an edge of at least two sides of said photovoltaic solar panel laminate.

14. A photovoltaic module as described in claim 1 wherein said at least one pivoting support having a length substantially as long as an edge of at least one side of said photovoltaic solar panel laminate and located substantially along said edge of said at least one side of said photovoltaic solar panel laminate comprises a pivoting support located along an edge of each of said four sides of said photovoltaic solar panel laminate.

15. A photovoltaic module as described in claim 1 wherein said at least one pivoting support is segmented along said edge of said photovoltaic solar panel laminate.

16. A method of supporting photovoltaic modules as described in claim 10 and further comprising a step of stacking a plurality of said photovoltaic solar panel laminates.

17. A photovoltaic module as described in claim 10 and further comprising a step of shipping said photovoltaic solar panel laminate with said at least one pivoting support attached to said photovoltaic solar panel laminate.

18. A photovoltaic module as described in claim 10 wherein said step of establishing at least one pivoting support having a length substantially as long as an edge of at least one side of said photovoltaic solar panel laminate and located substantially along said edge of said at least one side of said photovoltaic solar panel laminate comprises a step of establishing a pivoting support located along an edge of at least two sides of said photovoltaic solar panel laminate.

19. A photovoltaic module as described in claim 10 wherein said step of establishing at least one pivoting support having a length substantially as long as an edge of at least one side of said photovoltaic solar panel laminate and located substantially along said edge of said at least one side of said photovoltaic solar panel laminate comprises a step of establishing a pivoting support located along an edge of each of said four sides of said photovoltaic solar panel laminate.

20. A photovoltaic module as described in claim 10 wherein said at least one pivoting support is segmented along said edge of said photovoltaic solar panel laminate.

21. A photovoltaic module as described in claim 10 and further comprising a step of interlocking at least two pivoting supports.

22. A photovoltaic module as described in claim 10 and further comprising a step of self-grounding said at least one pivoting support after said pivoting step.

* * * * *